US009307658B2

(12) United States Patent
Song et al.

(10) Patent No.: US 9,307,658 B2
(45) Date of Patent: Apr. 5, 2016

(54) DISPLAY APPARATUS

(71) Applicant: LG ELECTRONICS INC., Seoul (KR)

(72) Inventors: Jongwon Song, Seoul (KR); Kihyun Kim, Seoul (KR); Jaehyun Sung, Seoul (KR); Hyunuk Yu, Seoul (KR); Kitae Kang, Seoul (KR); Inkeun Ryu, Seoul (KR); Donghyok Shin, Seoul (KR); Kyoyoon Gu, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/686,395

(22) Filed: Apr. 14, 2015

(65) Prior Publication Data

US 2015/0296641 A1 Oct. 15, 2015

Related U.S. Application Data

(60) Provisional application No. 61/980,007, filed on Apr. 15, 2014.

(30) Foreign Application Priority Data

May 23, 2014 (KR) .......................... 10-2014-0062115
May 27, 2014 (KR) .......................... 10-2014-0064008

(51) Int. Cl.
*H05K 5/00* (2006.01)
*H05K 5/02* (2006.01)

(52) U.S. Cl.
CPC ............ *H05K 5/0217* (2013.01); *H05K 5/0017* (2013.01)

(58) Field of Classification Search
CPC .................................................... G09G 3/3225
USPC ........................................ 361/679.19–679.29
See application file for complete search history.

(56) References Cited

U.S. PATENT DOCUMENTS

| 2013/0037228 A1 | 2/2013 | Verschoor et al. |
| 2013/0114193 A1 | 5/2013 | Joo et al. |
| 2013/0207946 A1* | 8/2013 | Kim ..................... G09G 3/3225 345/204 |

FOREIGN PATENT DOCUMENTS

| KR | 10-2013-0070423 A | 6/2013 |
| KR | 10-2013-0138614 A | 12/2013 |
| KR | 10-2014-0043968 A | 4/2014 |

OTHER PUBLICATIONS

International Search Report issued in Application No. PCT/KR2015/002704 dated Jun. 29, 2015.

* cited by examiner

*Primary Examiner* — Jerry Wu
(74) *Attorney, Agent, or Firm* — Ked & Associates, LLP

(57) ABSTRACT

Provided is a display apparatus. The display apparatus includes a display panel for displaying an image, a back cover mounted on a rear surface of the display panel, and a curvature adjustment unit mounted on the rear surface of the back cover to adjustment a curvature of the back cover according to user's manual manipulation.

15 Claims, 50 Drawing Sheets

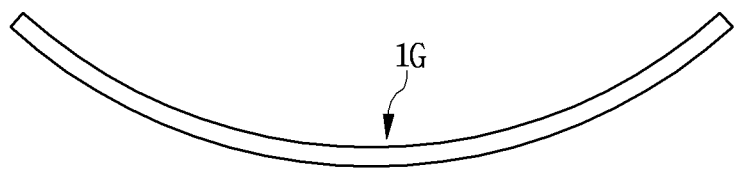
FIG. 52
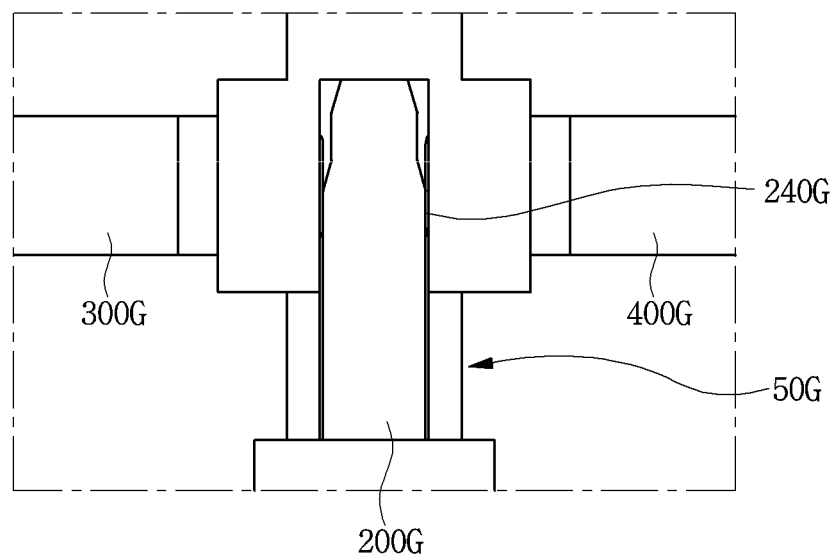
FIG. 53
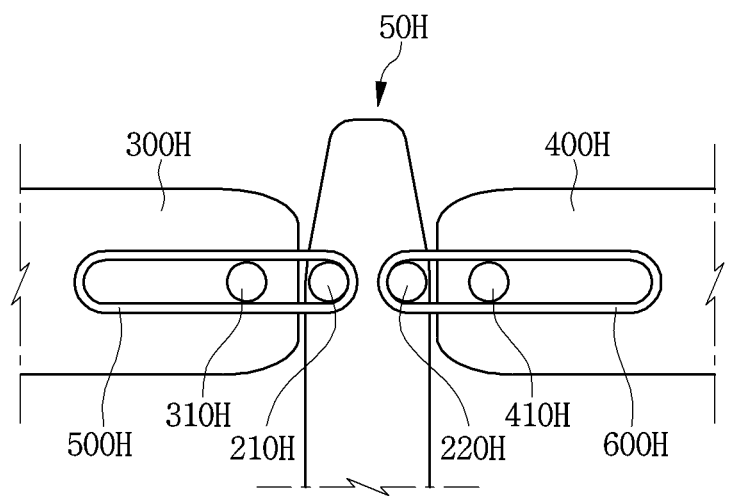

DISPLAY APPARATUS

CROSS-REFERENCE TO RELATED APPLICATIONS

The present application claims the benefits of priority to U.S. Provisional Application No. 61/980,007 (filed on Apr. 15, 2014), Korean Patent Application No. 10-2014-0062115 (filed on May 23, 2014) and Korean Patent Application No. 10-2014-0064008 (filed on May 27, 2014), which are herein incorporated by reference in their entirety.

BACKGROUND

The present disclosure relates to a display apparatus, and more particularly, to a display apparatus that is capable of adjusting a curvature of a display panel.

In recent years, a curved display apparatus having a curved screen is coming into the spotlight in display apparatus fields. The curved display apparatus may be a display apparatus including a display panel having a predetermined curvature. The curved display apparatus may provide almost the same distance to a user at central and side portions of a screen. Thus, the curved display apparatus may provide more improved immersion and presence to the user when compared to a liquid crystal display apparatus.

The curved display apparatus is disclosed in Korean Patent Publication No. 10-2014-0043968. Also, a display apparatus in which a display panel is variable in curvature so that the display apparatus is converted between a curved display and a flat panel display is coming recently. The display apparatus includes an automatic device such as a motor for varying a curvature to automatically adjust a curvature of the display panel.

However, since the display apparatus including the automatic device involves a mechanism having a complicated structure for realizing the automatic curvature adjustment, production costs of products may increase. In case of a user that does not frequently use the screen, the purchasing cost may be burden.

Thus, searching for a method for adjusting a curvature of a display panel while solving the above-described limitation and reflecting needs of a user that does not frequently use a screen to secure price competitiveness and realize more simple structure is required.

SUMMARY

Embodiments provide a display apparatus that is capable of adjusting a curvature of a display panel.

In one embodiment, a display apparatus includes: a display panel for displaying an image; a back cover mounted on a rear surface of the display panel; and a curvature adjustment unit mounted on the rear surface of the back cover to adjustment a curvature of the back cover according to user's manual manipulation.

The curvature adjustment unit may include: a button member slid in a vertical direction of the back cover according to user's downward pressing; at least one cam part rotating in a horizontal direction of the back cover according to the sliding of the button member; and a pair of wings slid closer to or away from each other in the horizontal direction of the back cover according to the rotation of the at least one cam part.

When the pair of wings are closer to each other, the curvature of the back cover may decrease, and when the pair of wings are away from each other, the curvature of the back cover may increase.

Each of the wings may have one end slidably mounted on the at least one cam part and the other end fixed to the rear surface of the back cover.

The curvature adjustment unit may include an adjustment unit casing mounted on the rear surface of the back cover to accommodate the button member and the cam part, wherein the adjustment unit casing may include: at least one button member insertion part having an insertion hole into which the button member is inserted; and at least one cam part accommodation chamber connected to the insertion hole to accommodate the at least one cam part, the at least one cam part providing a space in which the at least one cam part horizontally rotates.

The button member may include: a push button for user's manipulation, which is exposed to an upper side of the adjustment unit casing; and a button body connected to the push button, the button body being slidably inserted into the button member insertion hole in the vertical direction, wherein, when the button body is slid, at least a pair of guide protrusions for guiding the horizontal rotation of the at least one cam part may protrude from the button body.

A pair of rotation prevention ribs for preventing the button body from rotating when the button body is slid may be disposed on the button body, and a pair of rotation prevention guide grooves into which the pair of rotation prevention ribs are slidably inserted in the vertical direction may be defined in an inner wall of the insertion hole.

The at least one cam part may include: a cam body having an inner hollow into which the button body is inserted, the cam body rotating in the vertical direction when the button body is slid; and a pair of cam pulleys having one sides connected to each of the wings and the other sides disposed to face each other with the inner hollow therebetween, wherein a guide groove part into which each of the at least pair of guide protrusions is slidably inserted may be defined in an inner wall of the inner hollow of the cam body.

The pair of cam pulleys may pull each of the wings into the cam part accommodation chamber or push each of the wings out of the cam part accommodation chamber when the cam body rotates.

The curvature adjustment unit may include an elastic part accommodated in the inner hollow of the cam body and including an elastic member, wherein the elastic member may push the button body upward when the button body is slid along the guide groove part.

The guide groove part may include: a plurality of downward slide guide grooves spaced a predetermined distance from each other, the plurality of downward slide guide being inclinedly defined in a lower portion of the inner wall of the inner hollow; and a plurality of upward slide guide grooves connecting the downward slide guide grooves to each other, the plurality of upward slide grooves being spaced a predetermined distance from each other and defined in the inner wall of the inner hollow.

The cam body may include: a cylindrical part having the inner hollow; and upper and lower plates exposing the inner hollow, the upper and lower plates are disposed above and below the cylindrical part, wherein guide paths corresponding to each other in a circumferential direction of the upper and lower plates to guide the horizontal rotation of the cam body may be defined in bottom and top surfaces of the upper and lower plates, respectively.

A plurality of stopper grooves may be defined in the pair of guide paths at positions that radially correspond to upper ends of the plurality of downward slide guide grooves.

Each of the wings may include: a horizontal part connected to each of the cam pulleys, the horizontal part being spaced a predetermined distance from the rear surface of the back cover; and a vertical part vertically extending from the horizontal part, the vertical part being fixed to the rear surface of the back cover.

The cam part may include a first cam part and a second cam part, the cam part accommodation chamber may include a first cam part accommodation chamber accommodating the first cam part and a second cam part accommodation chamber accommodating the second cam part, and the button member insertion part may include an upper button member insertion part disposed above the first cam part accommodation chamber and a lower button member insertion part disposed between the first cam part accommodation chamber and the second cam part accommodation chamber.

The horizontal part may include: an upper horizontal bar connected to the first cam part; and a lower horizontal bar connected to the second cam part, the lower horizontal bar being vertically spaced a predetermined distance from the first horizontal bar.

The curvature adjustment unit may include: a curvature adjustment lever mounted on the rear surface of the back cover so that the curvature adjustment lever is rotatable according to the user's manipulation; at least one rotation crank link-connected to the curvature adjustment lever, the at least one rotation crank being mounted on the rear surface of the back cover so that the at least one rotation crank is rotatable in a direction opposite to the rotation direction of the curvature adjustment lever when the curvature adjustment lever rotates; and at least a pair of wings each of which has one end link-connected to the at least one rotation crank and the other end fixed to the rear surface of the back cover, the at least pair of wings being slid closer to or away from each other when the at least one rotation crank rotates.

A rotation guide slot may be defined in the curvature adjustment lever in a longitudinal direction of the curvature adjustment lever, and a crank link pin slid along the rotation guide slot and inserted into the rotation guide slot may be disposed on the at least one rotation crank.

The curvature adjustment lever may be mounted on the rear surface of the back cover through a lever pivot pin and be rotatable about the lever pivot pin, and the at least one rotation crank may be mounted on the rear surface of the back cover through a crank pivot pin and be rotatable about the crank pivot pin.

The curvature adjustment unit may include at least a pair of link members respectively link-connected to the at least pair of wings and the curvature adjustment unit through link pins.

The details of one or more embodiments are set forth in the accompanying drawings and the description below. Other features will be apparent from the description and drawings, and from the claims.

BRIEF DESCRIPTION OF THE DRAWINGS

FIGS. 48 to 52 are views for explaining a display apparatus according to further another embodiment.

FIGS. 53 and 54 are views for explaining a curvature adjustment unit according to further another embodiment.

DETAILED DESCRIPTION OF THE EMBODIMENTS

In the following detailed description of the preferred embodiments, reference is made to the accompanying drawings that form a part hereof, and in which is shown by way of illustration specific preferred embodiments in which the invention may be practiced. These embodiments are described in sufficient detail to enable those skilled in the art to practice the invention, and it is understood that other embodiments may be utilized and that logical structural, mechanical, electrical, and chemical changes may be made without departing from the spirit or scope of the invention. To avoid detail not necessary to enable those skilled in the art to practice the invention, the description may omit certain information known to those skilled in the art. The following detailed description is, therefore, not to be taken in a limiting sense, and the scope of the present invention is defined only by the appended claims.

Figure 1:
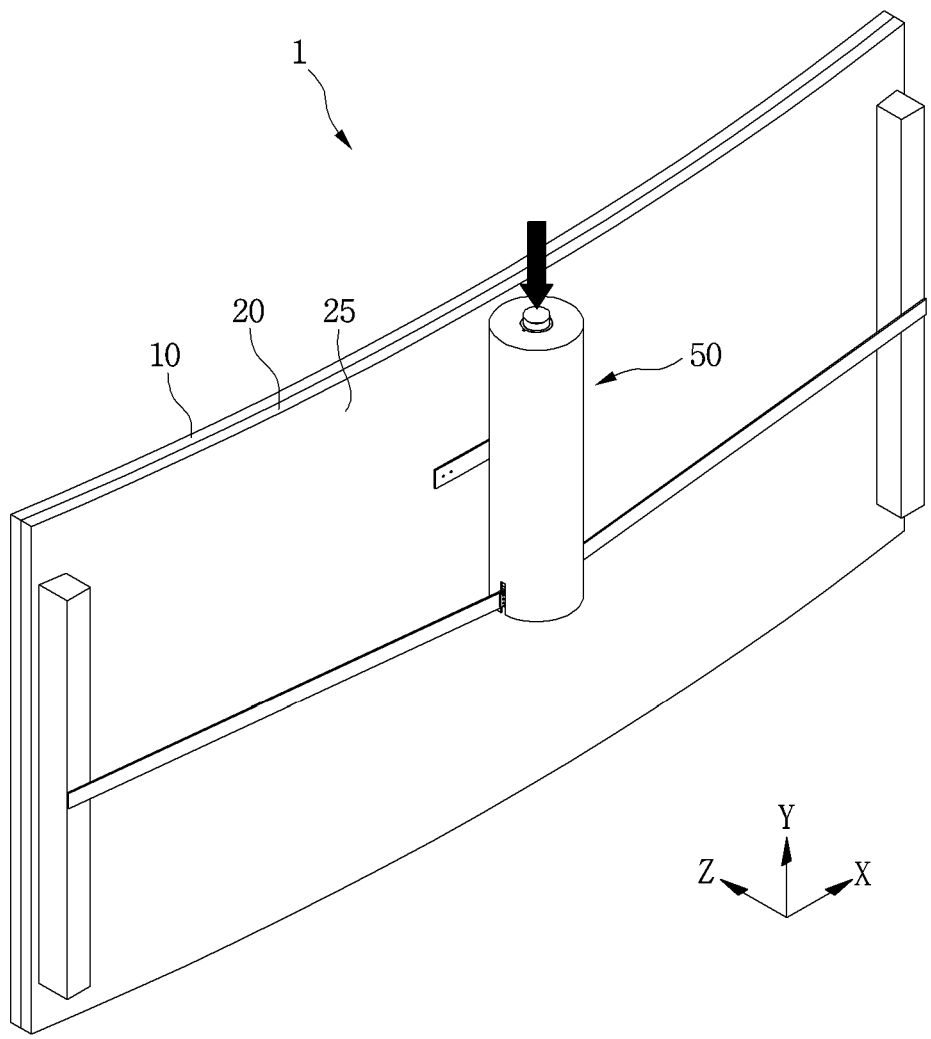
FIG. 1 is a rear perspective view of a display apparatus according to an embodiment.

FIG. 1 is a rear perspective view of a display apparatus according to an embodiment.

Referring to FIG. 1, a display apparatus 1 may be a curved display apparatus, i.e., a display apparatus that is capable of varying to a flat panel display. The display apparatus 1 includes a display panel 10, a back cover 20, and a curvature adjustment unit 50.

The display panel 10 may display an image and include an organic light emitting diode (OLED) panel or liquid crystal display (LCD) panel which are capable of varying to a curved display or flat panel display. Hereinafter, the OLED panel may be described as the display panel 10 according to the current embodiment.

The back cover 20 may support the display panel 10 and vary to a curved or flat plate such as the display panel 10. The back cover 20 is mounted on a rear surface of the display panel 10. The back cover 20 may include various components such as a power board (not shown) for supplying a power to the display apparatus 1 and a control board (not shown) for controlling the display apparatus 1. The components such as the power board and the control board may be provided in a separate casing and mounted to a rear side or bottom surface of the back cover 20.

The curvature adjustment unit 50 may adjust a curvature of the back cover 20 to adjust a curvature of the display panel 10 and be mounted on a rear surface 25 of the back cover 20. The curvature adjustment unit 50 may adjust the curvature by using a manual user manipulation. In the current embodiment, the manual user manipulation may be performed by allow the user to press the curvature adjustment unit 50 downward.

The curvature adjustment unit 50 may be mounted on a front surface of the display apparatus 1 so that the curvature adjustment unit 50 injures the beauty of the display apparatus 1. Furthermore, the curvature adjustment unit 50 may be mounted at a height at which the user's downward pressing operation is realized on the front surface of the display apparatus 1 so as to secure user's convenience in use.

If the user intends to adjust the curvature of the display panel 10 to the curved display or flat panel display, the curvature adjustment unit 50 may be pressed in a downward direction (a −Y-axis direction) of the display apparatus 1 to adjust a curvature of the back cover 20, thereby adjusting the curvature of the display panel 10.

Hereinafter, the curvature adjustment unit 50 according to the current embodiment will be described in more detail.

Figure 2:
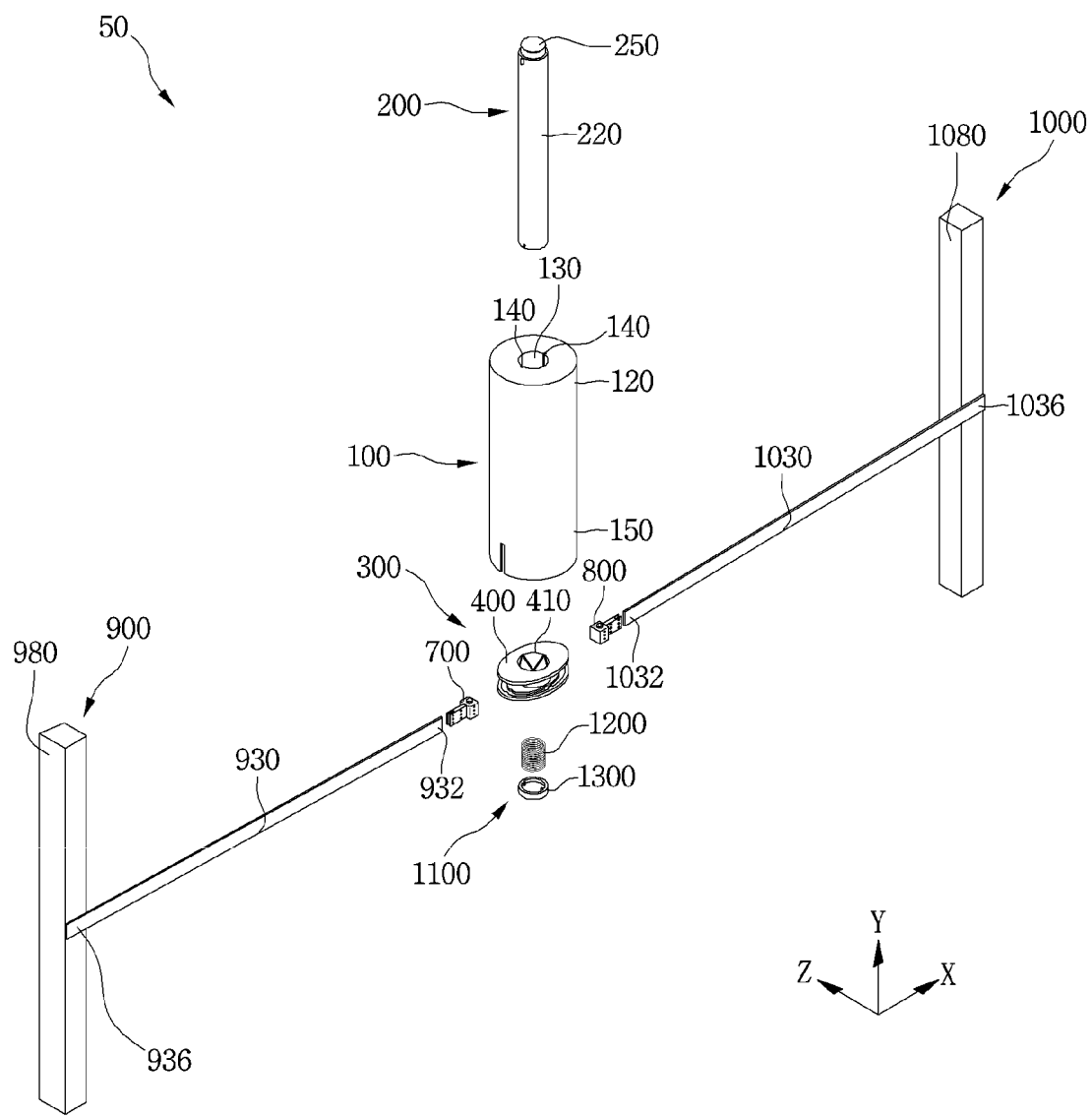
FIG. 2 is an exploded perspective view illustrating a curvature adjustment unit of the display apparatus of FIG. 1.
Figure 3:
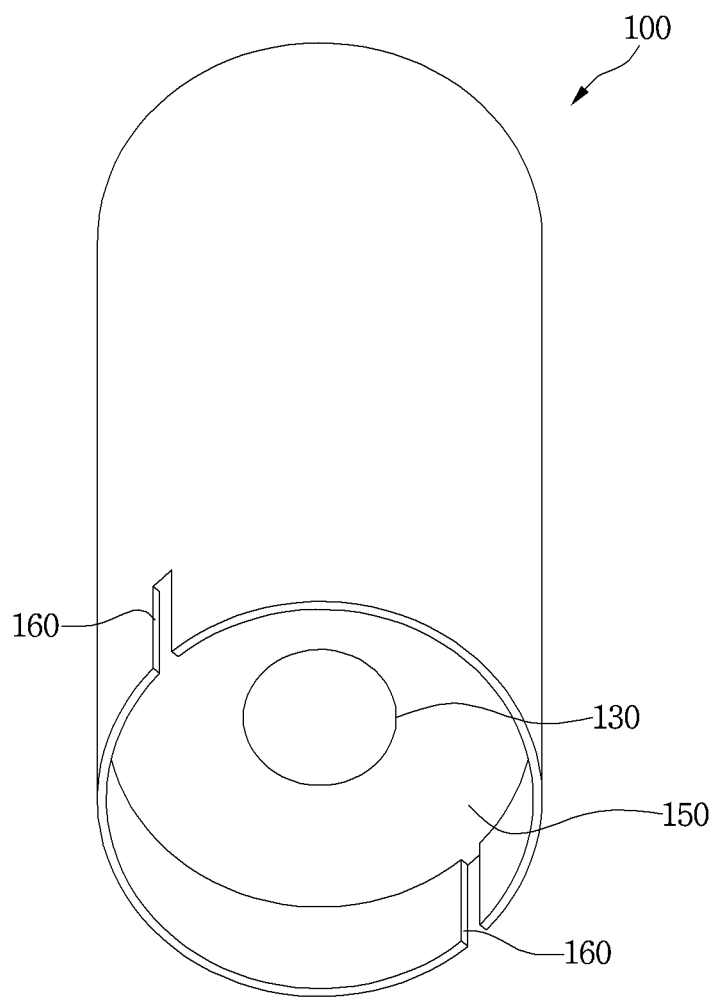
FIG. 3 is a bottom perspective illustrating an adjustment unit casing of the curvature adjustment unit of FIG. 2.
Figure 4:
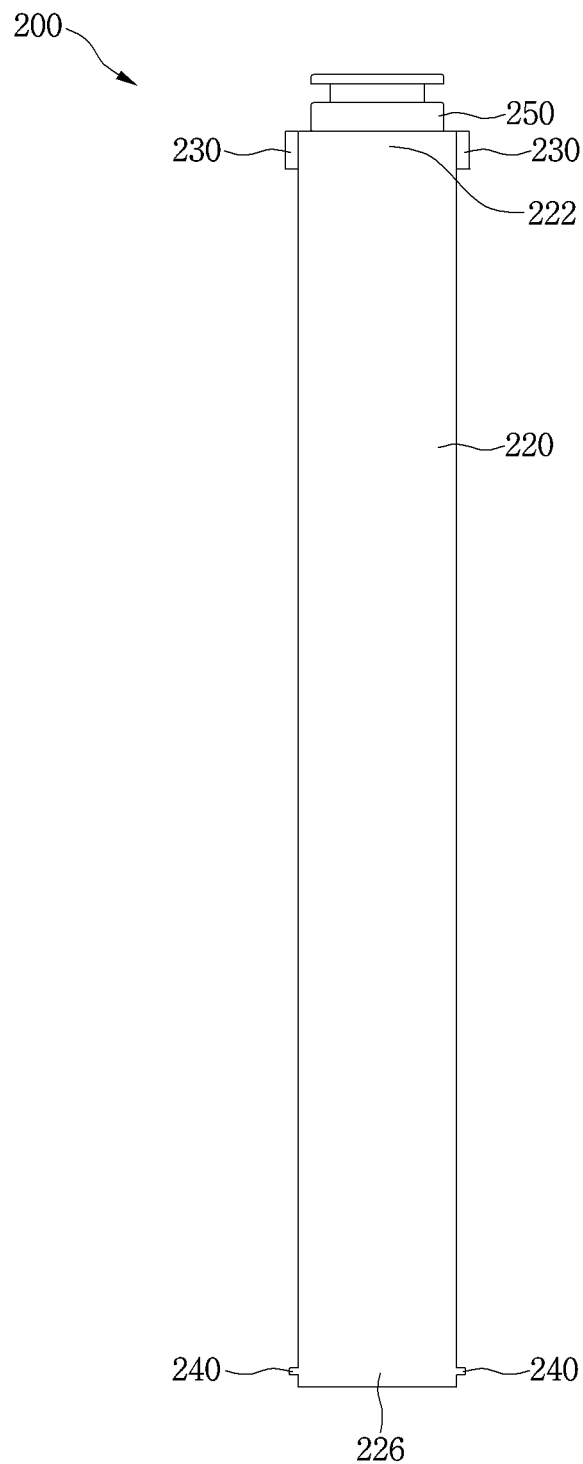
FIG. 4 is a side view illustrating a bottom member of the curvature adjustment unit of FIG. 2.
Figure 5:
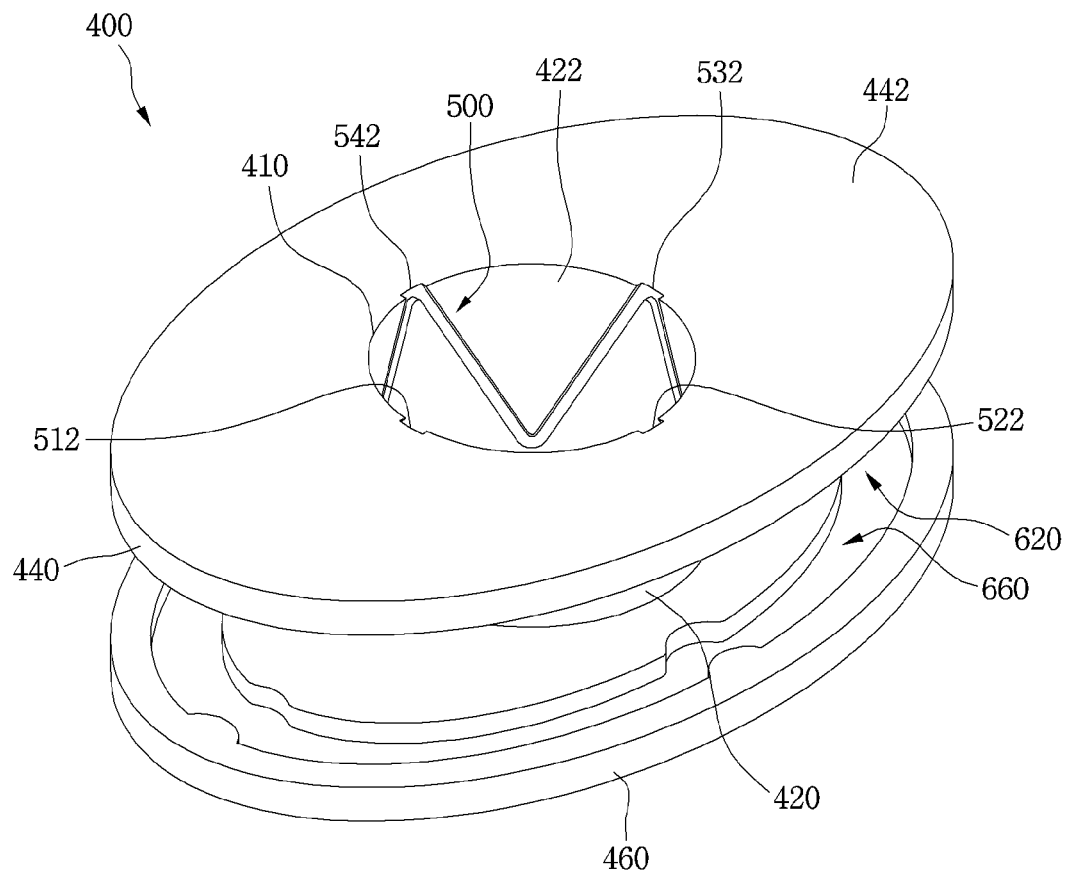
FIG. 5 is a perspective view illustrating a cam body of the curvature adjustment unit of FIG. 2.
Figure 6:
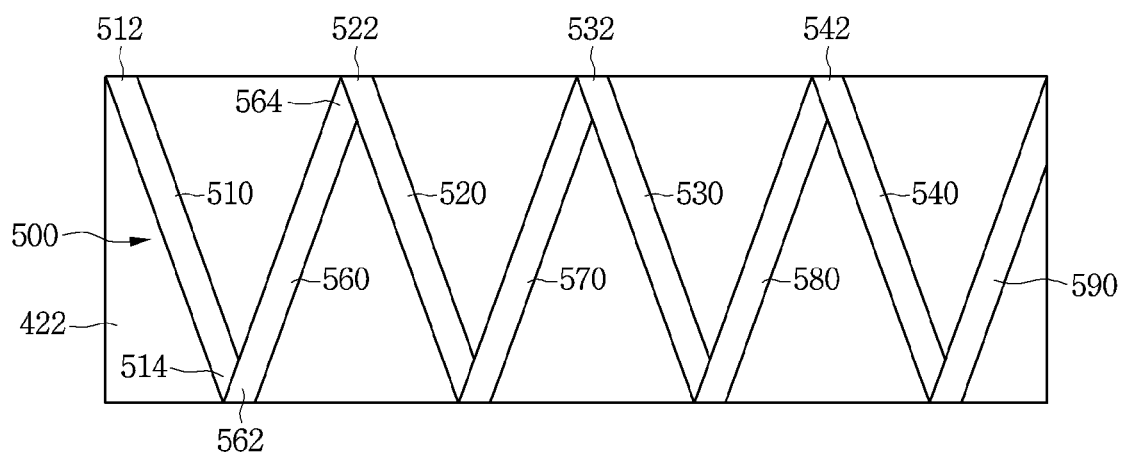
FIG. 6 is a plan view for explaining a guide groove part of the cam body of FIG. 5.
Figure 7:
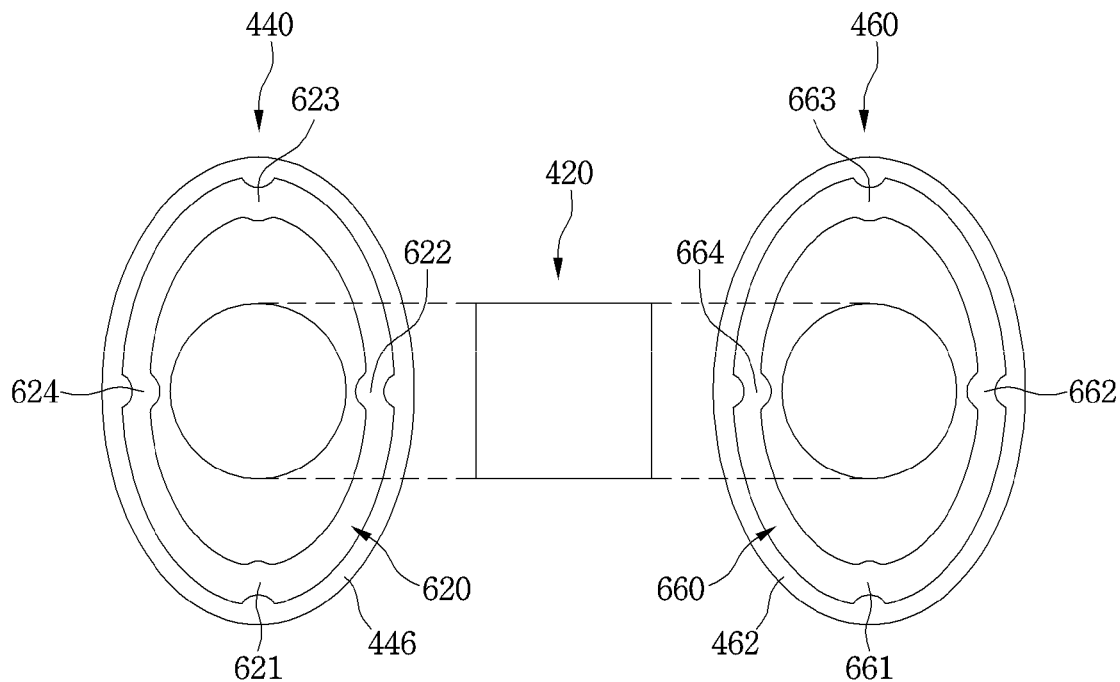
FIG. 7 is a view for explaining a guide path of the cam body of FIG. 5.
Figure 8:
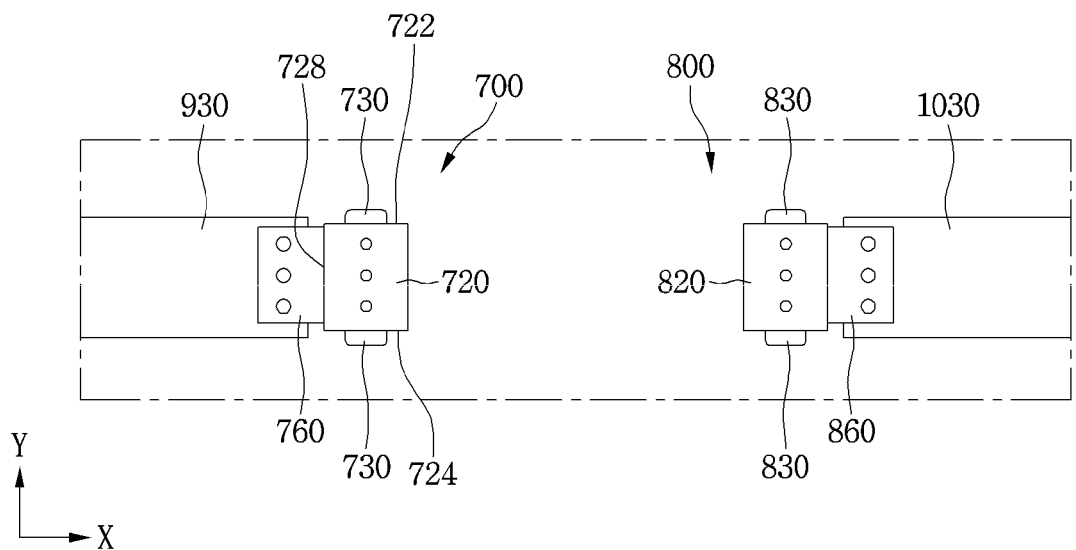
FIG. 8 is a side view illustrating a pair of cam pulleys of a cam part of the curvature adjustment unit of FIG. 2.

FIG. 2 is an exploded perspective view illustrating a curvature adjustment unit of the display apparatus of Fig, FIG. 3 is a bottom perspective illustrating an adjustment unit casing of the curvature adjustment unit of FIG. 2, FIG. 4 is a side view illustrating a bottom member of the curvature adjustment unit of FIG. 2, FIG. 5 is a perspective view illustrating a cam body of the curvature adjustment unit of FIG. 2, FIG. 6 is a plan view for explaining a guide groove part of the cam body of FIG. 5, FIG. 7 is a view for explaining a guide path of the cam body of FIG. 5, and FIG. 8 is a side view illustrating a pair of cam pulleys of a cam part of the curvature adjustment unit of FIG. 2.

Referring to FIGS. 2 to 8, the curvature adjustment unit 50 includes an adjustment unit casing 100, a button member 200, a cam part 300, a pair of wings 900 and 1000, and an elastic part 1100.

The adjustment unit casing 100 has a cylindrical shape to accommodate the button member 200 and the cam part 300. The adjustment unit casing 100 may be mounted on the back cover (see reference numeral 20 of FIG. 1) by using a coupling member or bracket to fix the curvature adjustment unit 50 to the rear surface 25 of the back cover 20.

The adjustment unit casing 100 includes a button member insertion part 120 and a cam part accommodation chamber 150.

The button member insertion part 120 has a cylindrical shape and includes an insertion hole 130 and a pair of rotation prevention guide grooves 140. The button member insertion part 120 is fixed to the rear surface (see reference numeral 25 of FIG. 1) of the back cover (see reference numeral 20 of FIG. 1) by using a coupling member or bracket.

The insertion hole 130 is defined in a longitudinal direction (a Y-axis direction) of the button member insertion part 120 and defined in a center of the button member insertion part 120. The button member 200 is slidably inserted into the insertion hole 130 in a vertical direction (the Y-axis direction).

The pair of rotation prevention guide grooves 140 may be defined in an inner wall above the insertion hole 130 to a predetermined depth downward from an upper end of the insertion hole 130 to face each other. A pair of rotation prevention ribs 230 that will be described later may be slidably inserted into the pair of rotation prevention guide grooves 140 in a vertical direction (the Y-axis direction).

The cam part accommodation chamber 150 is disposed under the adjustment unit casing 100 to accommodate the cam part 300. Hereinafter, the cam part accommodation chamber 150 will be described with reference to FIG. 3.

The cam part accommodation chamber 150 is disposed under the adjustment unit casing 100 to form an accommodation space for accommodating the cam part 300 at a lower portion of the insertion hole 130. The accommodation space may have a size enough to allow the cam part 300 to horizontally rotate.

A pair of slits 160 disposed to face each other may be defined in side surfaces of the cam part accommodation chamber 150, respectively. When the pair of wings 900 and 1000 are slid through the pair of slits 160, the pair of wings 900 and 1000 may be inserted into or withdrawn from the cam part accommodation chamber 150.

The button member 200 may be slid in the vertical direction (the Y-axis direction) of the back cover (see reference numeral 20 of FIG. 1) by the user's downward pressing. Thus, the button member 200 may be mounted to be slid in the vertical direction (the Y-axis direction) within the insertion hole 130 of the button member casing 100 and the cam part 300. Hereinafter, the button member 200 will be described with reference to FIG. 4.

The button member 200 includes a button body 220 and a push button 250.

The button body 220 has a cylindrical shape and includes the pair of rotation prevention ribs 230 and a pair of guide protrusions 240.

The pair of rotation prevention ribs 230 is disposed on an upper portion 222 of the button body 220. Each of the rotation prevention ribs 230 is slidably inserted into each of the rotation prevention guide grooves 140 in the vertical direction (the Y-axis direction) to prevent the button body 220 from rotating in a horizontal direction (an XZ-axis direction) when the button body 220 is slid in the vertical direction (the Y-axis direction).

The pair of guide protrusions 240 are disposed on a lower portion 226 of the button body 220. Each of the pair of guide protrusions 240 is inserted into a guide groove part 500 that will be described later. When the button body 220 is slid in the vertical direction (the Y-axis direction), the guide protrusion 240 may be slid along the guide groove part 500 to allow the cam part 300 to rotate in the horizontal direction (an XZ-axis direction).

The push button 250 is mounted on the upper portion 222 of the button body 220 and exposed to an upper side of the adjustment unit casing 100. The user may push the bush button 250 to adjust the curvature of the display apparatus (see reference numeral 1 of FIG. 1).

The cam part 300 rotates in the horizontal direction (an XZ-axis direction) of the back cover (see reference numeral 20 of FIG. 1) as the button member 200 is slid in the vertical direction (the Y-axis direction). The cam part 300 includes a cam body 400 and a pair of cam pulleys 700 and 800.

The cam body 400 is accommodated in the cam part accommodation chamber 150 to rotate in the horizontal direction (an XZ-axis direction). A hollow 410 in which the button member 200 is inserted is defined in the cam body 400. Hereinafter, the cam body 400 will be described with reference to FIG. 5.

The cam body 400 includes a cylindrical part 420, an upper plate 440, and a lower plate 460.

The cylindrical part 420 connects the upper plate 440 to the lower plate 460 and has the above-described hollow 410. The guide groove part 500 is defined in an inner wall 422 of the cylindrical part 420, i.e., an inner wall 422 of the inner hollow 410.

The pair of guide protrusions 240 are slidably inserted into the guide groove part 500. The cam body 400 may rotate in the horizontal direction (an XZ-axis direction) through the pair of guide protrusions 240 slid along the guide groove part 500.

Hereinafter, the guide groove part 500 will be described with reference to FIG. 6. FIG. 6 is a schematic view illustrating the inner wall 422 of the cylindrical part 420 so as to explain the guide groove part 500.

The guide groove part 500 includes a plurality of downward slide guide grooves 510, 520, 530, and 540 and a plurality of upward slide guide grooves 560, 570, 580, and 590.

The plurality of downward slide guide grooves 510, 520, 530, and 540 are defined to be spaced a predetermined distance from each other along a circumferential direction of the cylindrical part 420, i.e., a circumferential direction of the inner hollow 410. The plurality of downward slide guide grooves 510, 520, 530, and 540 are inclined toward a lower portion of the inner wall 422 of the inner hollow 410 to allow the cam body 400 to rotate. The plurality of downward slide guide grooves 510, 520, 530, and 540 are constituted by first to fourth downward slide guide grooves 510, 520, 530, and 540.

The first to fourth downward slid guide grooves 510, 520, 530, and 540 guide sliding of the pair of guide protrusions 240 in a downward direction (the −Y-axis direction) when the button member 200 is slid in the downward direction (the −Y-axis direction) by the user's pressing.

Upper ends 512, 522, 532, and 542 of the first to fourth downward slide guide grooves 510, 520, 530, and 540 are disposed to be spaced about 90 degree from each other in a horizontal direction with respect to a central axis of the inner hollow 410.

The pair of guide protrusions 240 are disposed on the upper ends 512, 522, 532, and 542 of the first to fourth downward slide guide grooves 510, 520, 530, and 540 when the pair of guide protrusions 240 are not slid. Particularly, the pair of guide protrusions 240 are respectively disposed on the upper end 512 of the first downward slide guide groove 510 and the upper end 532 of the third downward slide guide groove 530 when the pair of cam pulleys 700 and 800 are disposed on a long axis of the cap body 400. When the pair of cam pulleys 700 and 800 are disposed on a short axis of the cam body 400, the pair of guide protrusions 240 are respectively disposed on the upper end 522 of the second downward slide guide groove 520 and the upper end 542 of the fourth downward slide guide groove 540.

The plurality of upward slide guide grooves 560, 570, 580, and 590 connect the downward slide guide grooves 510, 520, 530, and 540 to each other and are defined to be spaced a predetermined distance from each other. Furthermore, the plurality of upward slide guide grooves 560, 570, 580, and 590 are inclined toward an upper portion of the inner wall 422 of the inner hollow 410 to allow the cam body 400 to rotate. The plurality of upward slide guide grooves 560, 570, 580, and 590 are constituted by first to fourth downward slide guide grooves 560, 570, 580, and 590, respectively.

The first to fourth upward slid guide grooves 560, 570, 580, and 590 guide sliding of the pair of guide protrusions 240 in an upward direction (the Y-axis direction) when the button member 200 is slid in the upward direction (a +Y-axis direction) by an elastic member that will be described later.

A lower end 562 of the first upward slide guide groove 560 may be disposed lower than a lower end 514 of the first downward slide guide grove 510 to generate a height difference therebetween. An upper end 564 of the first upward slide guide groove 560 may be disposed higher than an upper end 522 of the second downward slide guide groove 520 to generate a height difference therebetween. Furthermore, the rest slide guide grooves may be disposed to generate a height difference therebetween through the above-described manner. This is done for preventing the pair of guide protrusions 240 from being reversely slid when the pair of guide protrusions 240 rotate.

Hereinafter, the sliding of the pair of guide protrusions 240 in the guide groove part 500 will be described in more detail.

As described above, when the pair of cam pulleys 700 and 800 are disposed on the long axis of the cap body 400, the pair of guide protrusions 240 may be respectively disposed on the upper end 512 of the first downward slide guide groove 510 and the upper end 532 of the third downward slide guide groove 530.

When the user presses the button member 200 in the downward direction (the −Y-axis direction), the pair of guide protrusions 240 may be slid toward the lower portions of the first and third downward slide guide grooves 510 and 530 and then be disposed on the lower ends 564 and 574 of the first and third upward slide guide grooves 560 and 570. Thereafter, when the elastic member 1200 pushes the button member 200 in the upward direction (the +Y-axis direction), the pair of guide protrusions 240 may be slid toward the upper portions of the first and third upward slide guide grooves 560 and 570 and then be disposed on the upper ends 522 and 542 of the second and fourth slide guide grooves 520 and 540, respectively. As the guide protrusion 240 is slid along the guide groove 500, the cam body 400 rotates by about 90 degrees in one direction with respect to the horizontal direction (an XZ-axis direction), and the pair of cam pulleys 700 and 800 are disposed on the short axis (see FIGS. 9 to 11).

Then, when the user presses the button member 200 in the downward direction (the −Y-axis direction), the pair of guide protrusions 240 may be slid from the second and fourth downward slide guide grooves 520 and 540 toward the lower ends 574 and 594 of the second and fourth upward slide guide grooves 570 and 590, respectively. Thereafter, when the elastic member 1200 pushes the button member 200 in the upward direction (the +Y-axis direction), the pair of guide protrusions 240 may be slid upward and then be disposed on the upper ends 532 and 512 of the third and first downward slide guide grooves 530 and 510, respectively. Thus, the cam body 400 rotates again by about 90 degrees in one direction with respect to the horizontal direction (an XZ-axis direction), and the pair of cam pulleys 700 and 800 are disposed on the long axis (see FIGS. 9 to 11).

The sliding of the pair of guide protrusions 240 in the guide groove part 500 may be performed along a cycle formed by the user's downward pressing.

Explaining the cam body 400, the upper plate 440 and the lower plate 460 may be respectively disposed above and below the cylindrical part 420 to expose the inner hollow 410. The upper plate 440 and the lower plate 460 may have oval shapes that are symmetrical to each other. Each of the upper plate 440 and the lower plate 460 may have a long axis length that is less than an inner diameter of the cam part so that the upper plate 440 and the lower plate 460 are accommodated into the cam part accommodation chamber 150.

A pair of guide paths 620 and 660 for guiding the horizontal rotation of the cam body 400 may be disposed on the upper and lower plates 440 and 460, respectively. Hereinafter, the pair of guide paths 620 and 600 will be described with reference to FIG. 7.

The pair of guide paths 620 and 660 are constituted by an upper guide path 620 and a lower guide path 660.

The upper guide path 620 is disposed on a bottom surface 446 of the upper plate 440 along a circumferential direction of the upper plate 440. The lower guide path 660 is disposed on a top surface 462 of the lower plate 460 along a circumferential direction of the lower plate 460. The lower guide path 660 and the upper guide path 620 may have shapes corresponding to each other.

A plurality of stopper grooves 621, 622, 623, 624, 661, 662, 663, and 664 are defined in the upper and lower guide paths 620 and 660.

The plurality of stopper grooves 621, 622, 623, 624, 661, 662, 663, and 664 may be used for fixing the pair of cam pulleys 700 and 800 when the cam body 400 rotates. The plurality of stopper grooves 621, 622, 623, 624, 661, 662, 663, and 664 may be defined in positions that radially correspond to the upper ends 512, 522, 532, and 542 of the plurality of downward slide guide grooves 510, 520, 530, and 540.

The plurality of stopper grooves 621, 622, 623, 624, 661, 662, 663, and 664 are constituted by a plurality of upper stopper grooves 621, 622, 623, and 624 and a plurality of lower stopper grooves 661, 662, 663, and 664.

The plurality of upper stopper grooves 621, 622, 623, and 624 may be defined in the upper guide path 620 and constituted by first to fourth upper stopper grooves 621, 622, 623, and 624.

The first and third upper stopper grooves 621 and 623 are defined in a long axis of the upper plate 440 to face each other, and the second and fourth upper stopper grooves 622 and 624 are defined in a short axis of the upper plate 440 to face each other.

The plurality of lower stopper grooves 661, 662, 663, and 664 may be defined in the lower guide path 660 and constituted by first to fourth lower stopper grooves 661, 662, 663, and 664.

The first and third lower stopper grooves 661 and 663 are defined in a long axis of the lower plate 460 to face each other, and the second and fourth lower stopper grooves 662 and 664 are defined in a short axis of the lower plate 440 to face each other.

The first upper stopper groove 621 and the first lower stopper groove 661 are defined in positions that radially correspond to the upper end 512 of the first downward slide guide groove 510. The second upper stopper groove 622 and the second lower stopper groove 662 are defined in positions that radially correspond to the upper end 522 of the second downward slide guide groove 520. The third upper stopper groove 623 and the third lower stopper groove 663 are defined in positions that radially correspond to the upper end 532 of the third downward slide guide groove 530. The fourth upper stopper groove 624 and the fourth lower stopper groove 664 are defined in positions that radially correspond to the upper end 542 of the fourth downward slide guide groove 510. Thus, the first to fourth upper stopper grooves 621, 622, 623, and 624 and the first to fourth lower stopper grooves 661, 662, 663, and 664 are disposed to spaced about 90 degree from each other in the horizontal direction with respect to the inner hollow 410.

The first to fourth upper stopper grooves 621, 622, 623, and 624 and the first to fourth lower stopper grooves 661, 662, 663, and 664 are defined to positions to correspond to each other on the Y-axis and are provided in a pair to fix the pair of cam pulleys 700 and 800.

Explaining the cam part 300 again, the pair of cam pulleys 700 and 800 are mounted on the cam body 400 to face each other. The pair of cam pulleys 700 and 800 may pull the wings 900 and 1000 into the cam part accommodation chamber 150 or push the wings 900 and 1000 out of the cam part accommodation chamber 150 when the cam body 400 rotates. Hereinafter, the pair of cam pulleys 700 and 800 will be described with reference to FIG. 8.

The pair of cam pulleys 700 and 800 are constituted by a first cam pulley 700 and a second cam pulley 800.

The first cam pulley 700 is mounted on one side of the cam body 400. Particularly, the first cam pulley 700 is mounted in a space between the upper plate (see reference numeral 440 of FIG. 5) and the lower plate (see reference numeral 460 of FIG. 5) of the cam body 400. The first cam pulley 700 includes a pulley body part 720 and a wing connection part 760.

The pulley body part 720 is mounted on the cam body 400 and includes a pair of shaft protrusions 730.

The pair of shaft protrusions 730 are disposed on positions corresponding to each other on top and bottom surfaces 722 and 724 of the pulley body part 720 in the vertical direction (the Y-axis direction). The shaft protrusion 730 disposed on the top surface 722 of the pulley body part 720 is mounted on the upper guide path 620, and the shaft protrusion 730 disposed on the bottom surface 724 of the pulley body part 720 is mounted on the lower guide path 660.

When the cam body 400 horizontally rotates, the pair of shaft protrusions 730 may be hooked on the first to fourth upper stopper grooves 621, 622, 623, and 624 and the first to fourth lower stopper grooves 661, 662, 663, and 664 to fix the first cam pulley 700 at the hooked positions.

The wing connection part 760 is mounted on a rear surface 728 of the pulley body part 720 and connected to a horizontal part 930 of a first wing 900 that will be described later. The wing connection part 760 together with the horizontal part 930 of the first wing 900 may be disposed in the slits 160 of the cam accommodation chamber 150 or within the cam accommodation chamber 150 when the pulley body part 720 horizontally rotates.

The second cam pulley 800 is mounted in a space between the upper plate (see reference numeral 440 of FIG. 5) and the lower plate (see reference numeral 460 of FIG. 5) of the cam body 400 on the other side of the cam body 400. Thus, the second cam pulley 800 and the first cam pulley 700 are disposed to face each other with the cylindrical part 420 therebetween. The second cam pulley 800 includes a pulley body part 820 and a wing connection part 860.

Since the pulley body part 820 and the wing connection part 860 are similar to the pulley 720 and wing connection part 760 of the first cam pulley 700, their difference points will be mainly described.

The pulley body part 820 includes a pair of shaft protrusions 830, like the pulley body part 720 of the first cam pulley 700. When the cam body 400 horizontally rotates, the pair of shaft protrusions 830 may be hooked on the first to fourth upper stopper grooves 621, 622, 623, and 624 and the first to fourth lower stopper grooves 661, 662, 663, and 664 to fix the second cam pulley 800 at the hooked positions.

The wing connection part 860 is connected to a horizontal part 1030 of the second wing 1000, which will be described later. The wing connection part 860 together with the horizontal part 1030 of the second wing 1000 may be disposed in the slits 160 of the cam accommodation chamber 150 or within the cam accommodation chamber 150 when the pulley body part 820 horizontally rotates.

The pair of wings 900 and 1000 may be slidably mounted on the cam part 300 in a direction that is closer to or away from each other on the back cover (see reference numeral 20 of FIG. 1) as the cam part 300 horizontally rotates. The pair of wings 900 and 1000 are disposed to face each other with the adjustment unit casing 100 therebetween and constituted by a first wing 900 and a second wing 1000.

The first wing 900 is disposed in a left direction (a −X-axis direction) of the adjustment unit casing 100 and includes a horizontal part 930 and a vertical part 980.

The horizontal part 930 has a long bar shape. The horizontal part 930 is slidably mounted on the cam part 300 in a state where the horizontal part 930 is spaced a predetermined distance from the rear surface (see reference numeral 25 of FIG. 1) of the back cover 20. For this, one end 932 of the horizontal part 930 is connected to the first cam pulley 700, and the other end 936 of the horizontal part 930 is fixed to the vertical part 980.

The vertical part 980 is fixed to the rear surface 25 of the back cover 20. Also, the vertical part 980 may be designed in consideration of a sliding distance of the horizontal part 930 or a height of the adjustment unit casing so that the cam part 300 smoothly horizontally rotates. Furthermore, the vertical part 980 may be integrated with the horizontal part 930 according to its design.

Thus, the first wing 900 may be push the rear surface 25 of the back cover 20 in a front direction (a +Z-axis direction) or pull the rear source 25 in a rear direction (a −Z-axis direction) as the horizontal part 930 is slid.

The second wing 1000 is disposed in a right direction (a +X-axis direction) of the adjustment unit casing 100 and includes a horizontal part 1030 and a vertical part 1080, like the first wing 1000. One end 1030 of the horizontal part 1030 is connected to the second cam pulley 800, and the other end 1036 of the horizontal part 1030 is fixed to the vertical part 1080. Since the horizontal part 1030 and the vertical part 1080 are substantially similar to the horizontal part 930 and the vertical part 980 of the first wing 900, their difference points will be mainly described.

The elastic part 1100 provides a driving force for sliding the button member 200 in the upward direction (the +Y-axis direction). The elastic part 1100 includes an elastic member 1200 and the elastic member base 1300.

The elastic member 1200 is disposed within the inner hollow 410 of the cam body 400 to provide a driving force for pushing the button member 200 upward in the upward direction (the +Y-axis direction). When the user presses the button member 200 downward, the elastic member 1200 is compressed between the button member 200 and the elastic member base 1300. When the user releases the downward pressing of the button member 200, the elastic member 1200 provides an elastic force for pushing the button member 200 upward in the upward direction (the +Y-axis direction). The elastic member 12000 may be provided as a coil spring or other members having elasticity.

An elastic member base 1300 accommodates the elastic member 1200 and is fixed to the bottom portion of the cam body 400. The elastic member base 1300 is mounted to cover the inner hollow 410 on the bottom portion of the cam body 400.

Hereinafter, an operation of the display apparatus 1 including the curvature adjustment unit 500 will be described.

Figure 9:
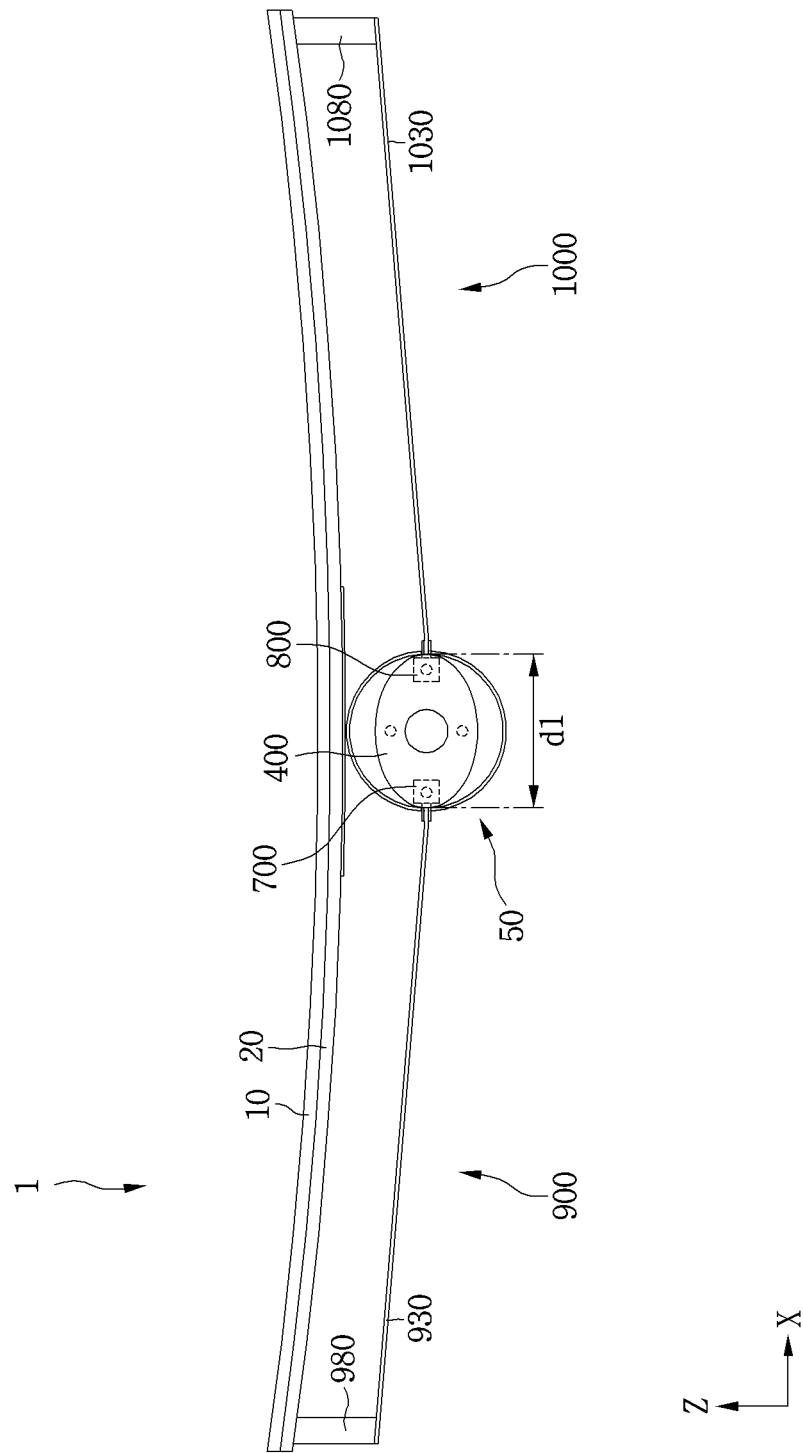
FIGS. 9 to 11 are views for explaining an operation of the display apparatus of FIG. 1.
Figure 10:
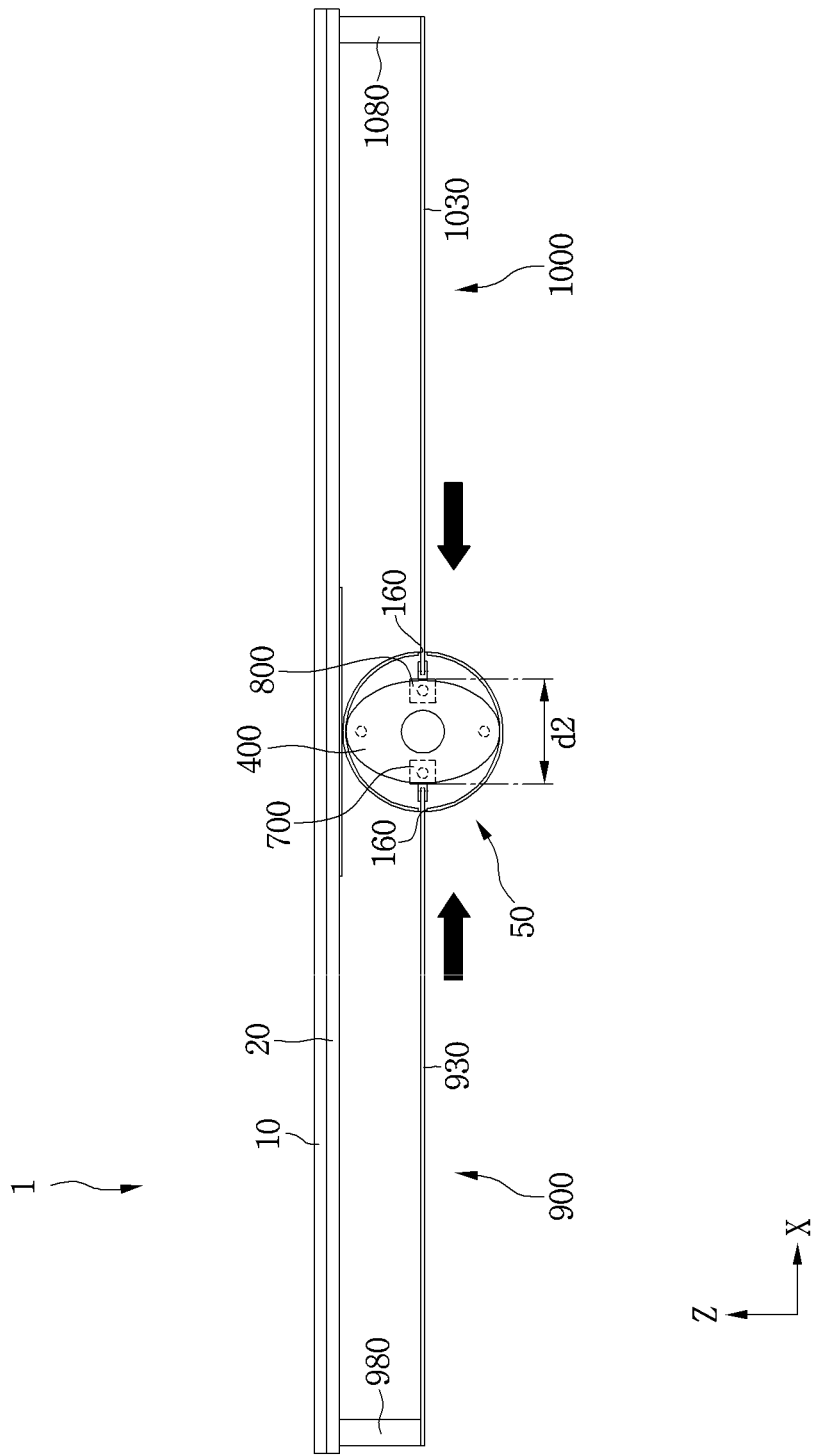
Figure 11:
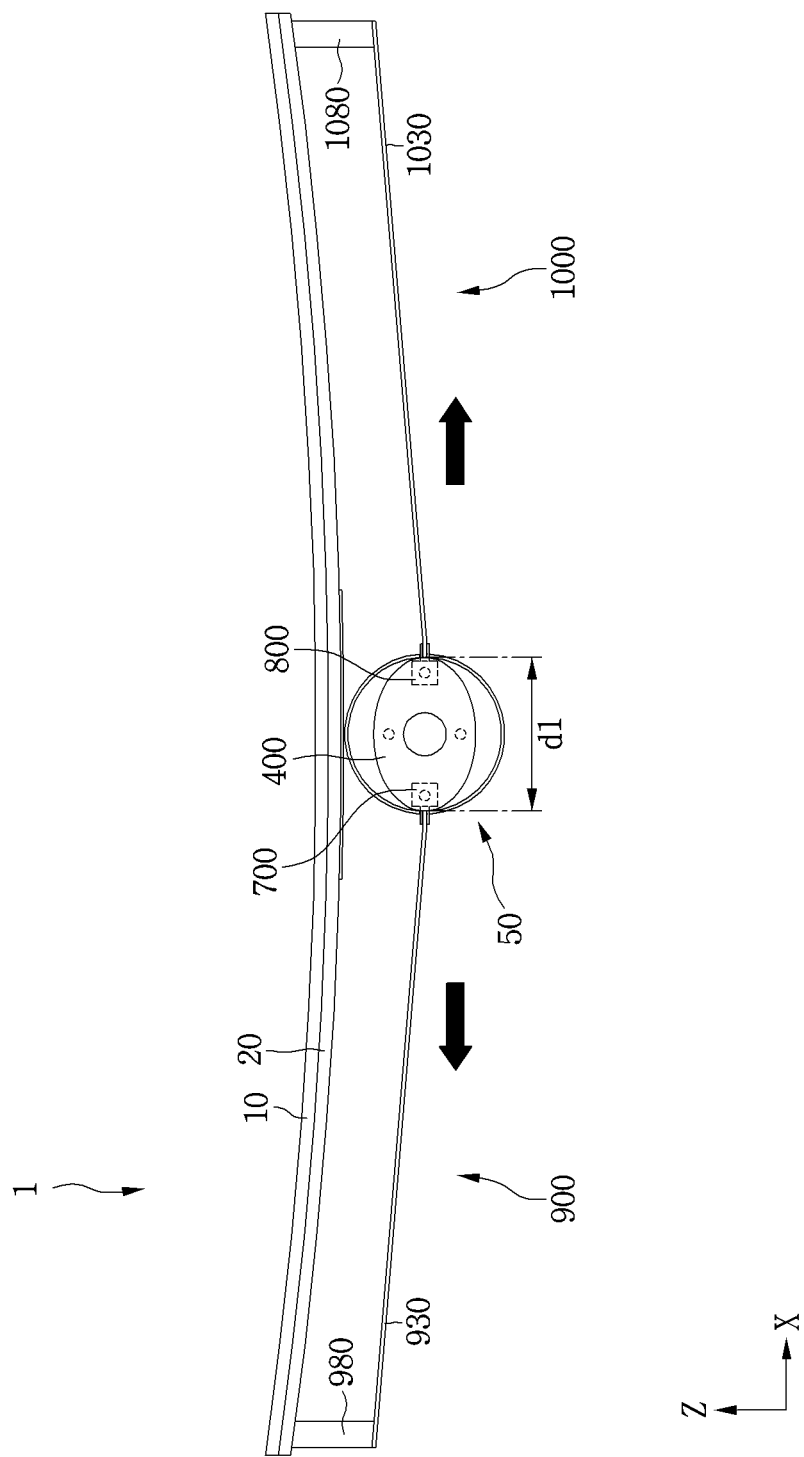

FIGS. 9 to 11 are views for explaining an operation of the display apparatus of FIG. 1.

For convenience of description, portions of the components described in the foregoing drawings will be omitted or simplified in FIGS. 9 to 11.

In FIGS. 9 to 11, it is seen that a distance d1 between the pair of wings 900 and 1000 when the curved display is realized is greater than that d2 between the pair of wings 900 and 1000 when the flat panel display is realized. That is, in the current embodiment, the back cover 20 may have a curvature that decreases when the pair of wings 900 and 1000 are closer to each other and increases when the pair of wings 900 and 1000 are away from each other. The curvature adjustment unit 50 may adjust the distance between the pair of wings 900 and 1000 by the user's manual operation to adjust a curvature of the display panel 10.

Referring to FIG. 9, when the curved display is provided, in the cam body 400 of the curvature display unit 50, the pair of cam pulleys 700 and 899 are disposed on the long axis of the cam body 400.

When it is intended to convert the curved display into the flat panel display, the user's downward pressing is performed. Thus, the button member (see reference numeral 200 of FIG. 2) may move downward to allow the cam body 400 to horizontally rotate in one direction. Since the mechanism between the button member 200 and the cam body 400 is previously described, their duplicated description will be omitted.

Referring to FIG. 10, as the cam body 400 horizontally rotates, the pair of cam pulleys 700 and 800 are disposed on the short axis of the cam body 400. Thus, each of the horizontal parts 930 and 1030 of the pair of wings 900 and 1000 connected to the pair of cam pulleys 700 and 800 may be slid into the adjustment unit casing 100 through the slit 160 of the adjustment unit casing 100 to pull the pair of wings 900 and 1000 in a direction of the adjustment unit casing 100, thereby converting the back cover 20 into the flat state. Thus, the display panel 10 may be converted into the flat panel display.

Referring to FIG. 11, in case where it is intended to convert the flat panel display into the curved display again, when the user's downward pressing is performed as illustrated in FIG. 1, the cam body 400 horizontally rotates again in one direction, and the pair of cam pulleys 700 and 800 are disposed again on the long axis. Thus, each of the horizontal parts 930 and 1030 of the pair of wings 900 and 1000 connected to the pair of cam pulleys 700 and 800 may be slid out of the adjustment unit casing 100 in a direction of the vertical parts 980 and 1080, and then the back cover 20 is converted into the curved state. Thus, the display panel 10 may be converted into the curved display.

As described above, since the display apparatus 1 according to the current embodiment operates by the manual manner such as the user's downward pressing instead of an automatic manner, the display apparatus 1 may have more simple structure in comparison to a display apparatus that operates by the automatic manner. Thus, the display apparatus 1 according to the current embodiment may realize a mechanism for adjusting the curvature at more less costs in comparison to that using the automatic manner.

Thus, the display apparatus 1 according to the current embodiment may adjust the curvature of the display panel 10 using the more simple structure while securing the price competitiveness.

Figure 12:
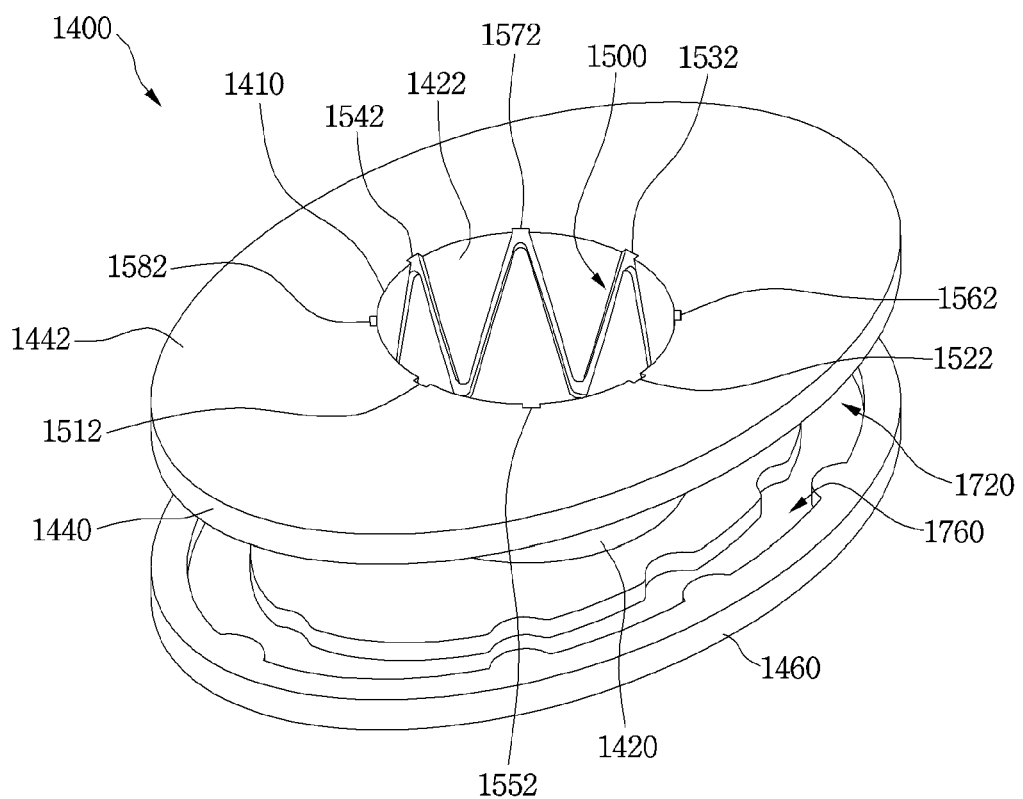
FIG. 12 is a perspective view of a cam body according to another embodiment.
Figure 13:
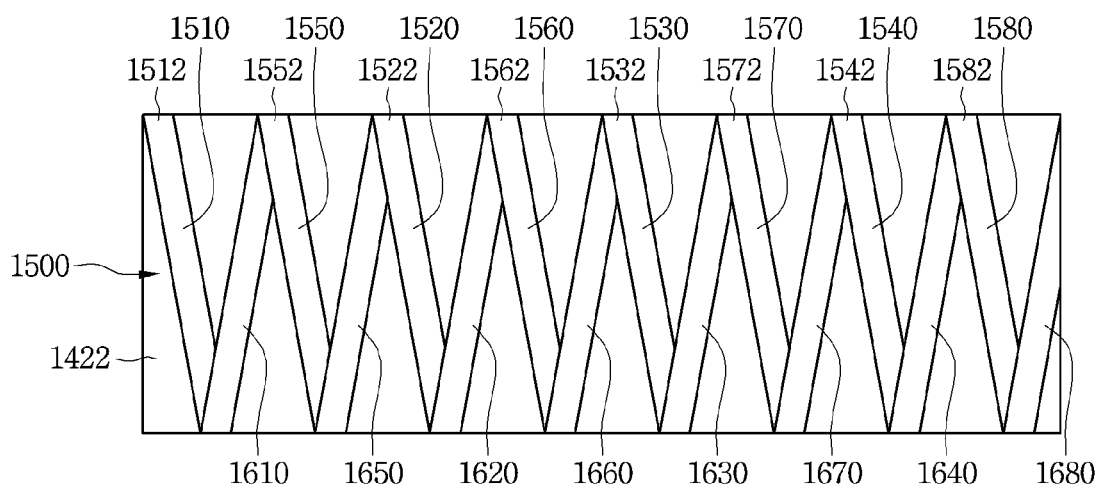
FIG. 13 is a plan view for explaining a guide groove part of the cam body of FIG. 12.
Figure 14:
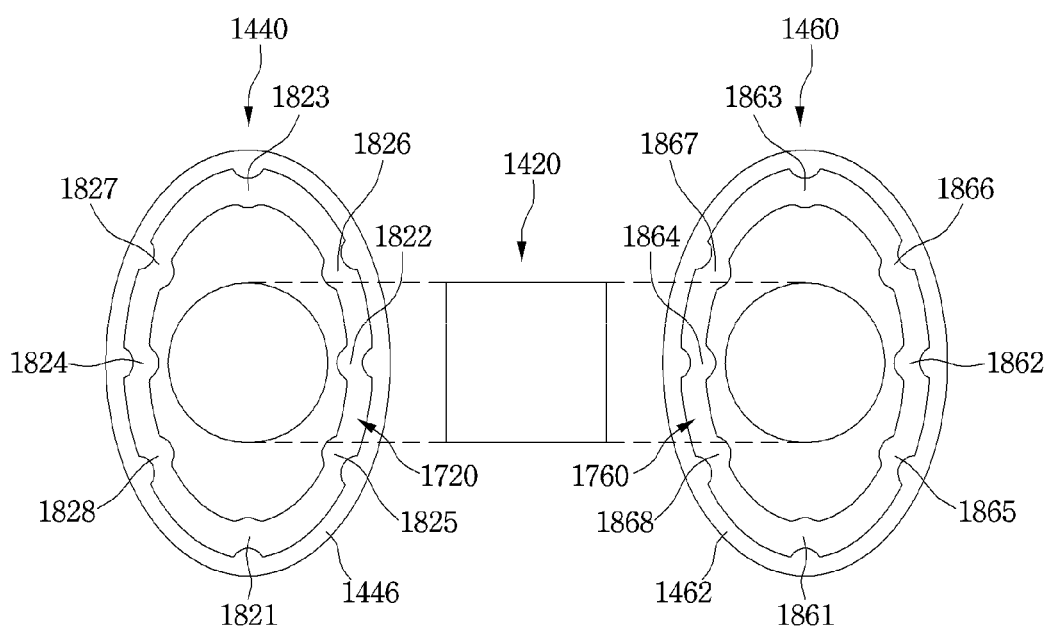
FIG. 14 is a view for explaining a guide path of the cam body of FIG. 12.

FIG. 12 is a perspective view of a cam body according to another embodiment, FIG. 13 is a plan view for explaining a guide groove part of the cam body of FIG. 12, and FIG. 14 is a view for explaining a guide path of the cam body of FIG. 12.

A cam body 1400 according to the current embodiment is similar to the cam body 400 according to the foregoing embodiment. Thus, duplicated descriptions with respect to the similar components will be omitted, and different points therebetween will be mainly described below.

Referring to FIG. 12, the cam body 1400 includes a cylindrical part 1420, an upper plate 1440, and a lower plate 1460.

A guide groove 1500 is defined in an inner wall 1422 of a cylindrical part 1420, i.e., an inner wall 1422 of an inner hollow 1410.

The guide groove 1500 will be described with reference to FIG. 13. FIG. 13 is a schematic view illustrating the inner wall 1422 of the cylindrical part 1420 so as to explain the guide groove 1500 as previously illustrated in FIG. 6.

The guide groove part 1500 includes a plurality of downward slide guide grooves 1510, 1520, 1530, 1540, 1550, 1560, 1570, and 1580 and a plurality of upward slide guide grooves 1610, 1620, 1630, 1640, 1650, 1660, 1670, and 1680.

The plurality of downward slide guide grooves 1510, 1520, 1530, 1540, 1550, 1560, 1570, and 1580 are constituted by first to eighth downward slide guide grooves 1610, 1620, 1630, 1640, 1650, 1660, 1670, and 1680, respectively. Unlike the foregoing embodiment, the fifth to eighth downward slide guide grooves 1550, 1560, 1570, and 1580 are additionally disposed between the first to fourth downward slide guide grooves 1510, 1520, 1530, and 1540.

A pair of guide protrusions 240 (see reference numeral 240 of FIG. 2) are disposed on the upper ends 1552, 1562, 1572, and 1582 of the fifth to eighth downward slide guide grooves 1550, 1560, and 1570, 1580 when the pair of guide protrusions 240 are not slid. Particularly, when the pair of cam pulleys 700 and 800 are disposed on a long shaft of the cap body 1400, the pair of guide protrusions 240 are respectively disposed on an upper end 1552 of the fifth downward slide guide groove 1550 and an upper end 1572 of the seventh downward slide guide groove 1570 or an upper end 1562 of the sixth downward slide guide groove 1560 and an upper end 1582 of the eighth downward slide guide groove 1580.

The plurality of upward slide guide grooves 1610, 1620, 1630, 1640, 1650, 1660, 1670, and 1680 are constituted by first to eighth upward slide guide grooves 1610, 1620, 1630, 1640, 1650, 1660, 1670, and 1680, respectively. Similarly, unlike the foregoing embodiment, the fifth to eighth upward slide guide grooves 1650, 1660, 1670, and 1680 are additionally disposed between the first to fourth upward slide guide grooves 1610, 1620, 1630, and 1540.

Explaining the sliding of the pair of guide protrusions 240 in the guide groove 1500 according to the current embodiment, unlike the foregoing embodiment, the sliding of the pair of guide protrusions 240 are also performed in the fifth to eighth downward slide guide grooves 1550, 1560, 1570, and 1580 and the fifth to eighth upward slide guide grooves 1650, 1660, 1670, 1680.

Explaining the cam body 1400 again, a pair of guide paths 1720 and 1760 for guiding horizontal rotation of the cam body 1400 may be disposed on the upper and lower plates 1440 and 1460, respectively. Hereinafter, the pair of guide paths 1720 and 1760 will be described with reference to FIG. 14.

The pair of guide paths 1720 and 1760 are constituted by an upper guide path 1720 and a lower guide path 1760.

The upper guide path 1720 is disposed on a bottom surface 1446 of the upper plate 1440 along a circumferential direction of the upper plate 1440. The lower guide path 1760 is disposed on a top surface 1460 of the lower plate 1460 along a circumferential direction of the lower plate 1462. The lower guide path 1760 and the upper guide path 1720 may have shapes corresponding to each other.

A plurality of stopper grooves 1821, 1822, 1823, 1824, 1825, 1826, 1827, 1828, 1861, 1862, 1863, 1864, 1865, 1866, 1867, and 1868 are constituted by a plurality of upper stopper grooves 1821, 1822, 1823, 1824, 1825, 1826, 1827, and 1828 and a plurality of lower stopper grooves 1861, 1862, 1863, 1864, 1865, 1866, 1867, and 1868.

The plurality of upper stopper grooves 1821, 1822, 1823, 1824, 1825, 1826, 1827, and 1828 are constituted by first to eighth upper stopper grooves 1821, 1822, 1823, 1824, 1825, 1826, 1827, and 1828, respectively. Unlike the foregoing embodiment, the fifth to eighth upper stopper grooves 1825, 1826, 1827, and 1828 are additionally disposed between the first to fourth upper stopper grooves 1821, 1822, 1823, and 1824.

The fifth and seventh upper stopper grooves 1825 and 1827 are defined between a long axis and a short axis of the upper plate 1440 to face each other, and the sixth and eighth upper stopper grooves 1826 and 1828 are defined between the long axis and the short axis of the upper plate 1440 to face each other.

The plurality of lower stopper grooves 1861, 1862, 1863, 1864, 1865, 1866, 1867, and 1868 are constituted by first to eighth upper stopper grooves 1861, 1862, 1863, 1864, 1865, 1866, 1867, and 1868, respectively. Similarly, unlike the foregoing embodiment, the fifth to eighth lower stopper grooves 1865, 1866, 1867, and 1868 are additionally disposed between the first to fourth lower stopper grooves 1861, 1862, 1863, and 1864.

The fifth and seventh lower stopper grooves 1865 and 1867 are defined between a long axis and a short axis of the lower plate 1460 to face each other, and the sixth and eighth lower stopper grooves 1866 and 1868 are defined between the long axis and the short axis of the upper plate 1460 to face each other.

The fifth upper stopper groove 1825 and the fifth lower stopper groove 1865 are defined in positions that radially correspond to an upper end 1552 of the fifth downward slide guide groove 1550. The sixth upper stopper groove 1826 and the sixth lower stopper groove 1866 are defined in positions that radially correspond to an upper end 1562 of the sixth downward slide guide groove 1560. The seventh upper stopper groove 1827 and the seventh lower stopper groove 1867 are defined in positions that radially correspond to an upper end 1572 of the seventh downward slide guide groove 1570. The eighth upper stopper groove 1828 and the eighth lower stopper groove 1868 are defined in positions that radially correspond to an upper end 1582 of the eighth downward slide guide groove 1580.

The first to eighth upper stopper grooves 1821, 1822, 1823, 1824, 1825, 1826, 1827, and 1828 and the first to eighth lower stopper grooves 1861, 1862, 1863, 1864, 1865, 1866, 1867, and 1868 are defined to positions to correspond to each other in a vertical direction (a Y-axis direction) and are provided in a pair to fix the pair of cam pulleys 700 and 800.

In the structure of the cam body 140, as the cam body 1400 horizontally rotates in the current embodiment, the pair of cam pulleys 700 and 800 may be disposed on the long axis and the short axis as well as between the long axis and the short axis.

Figure 15:
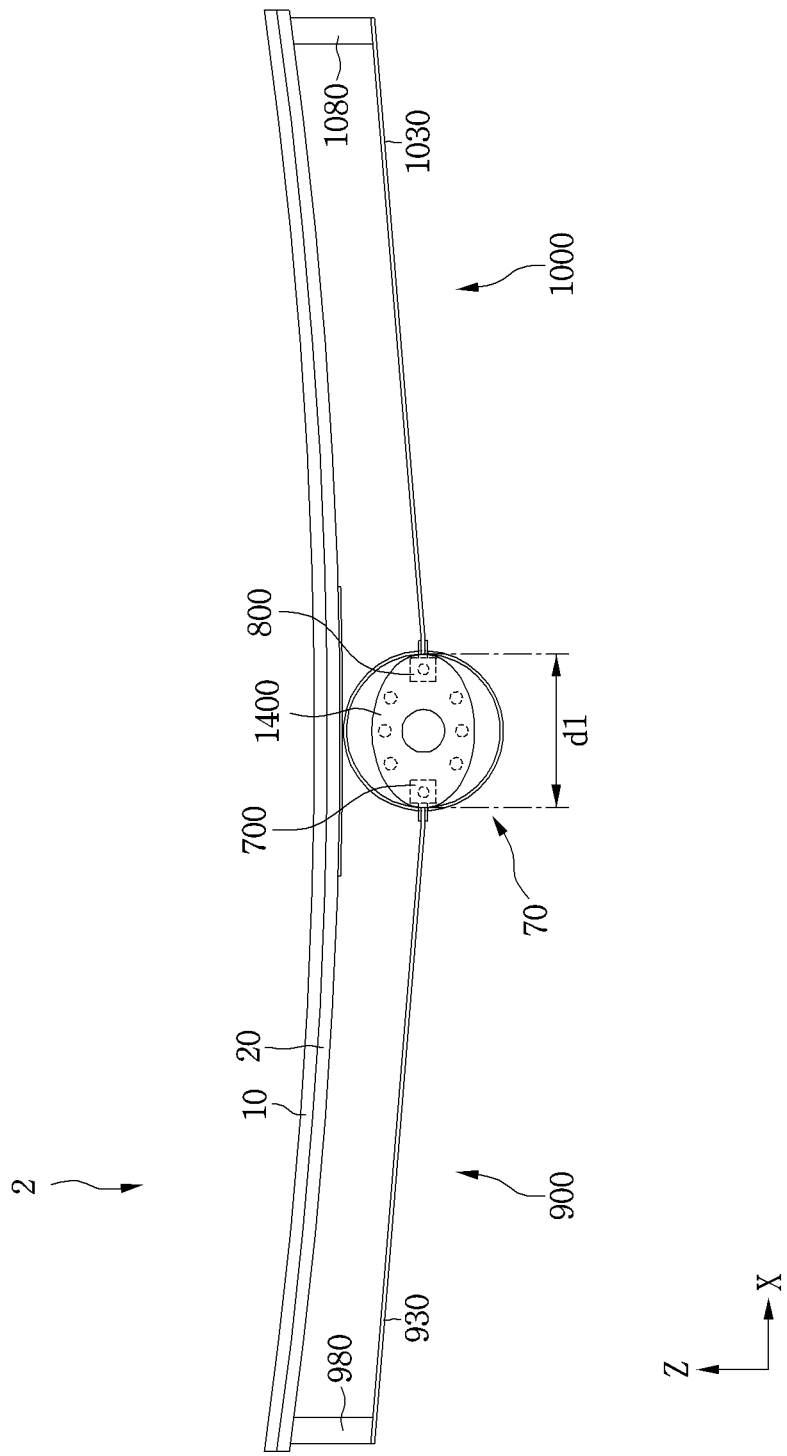
FIGS. 15 to 17 are views for explaining an operation of the display apparatus including the cam body of FIG. 12.
Figure 16:
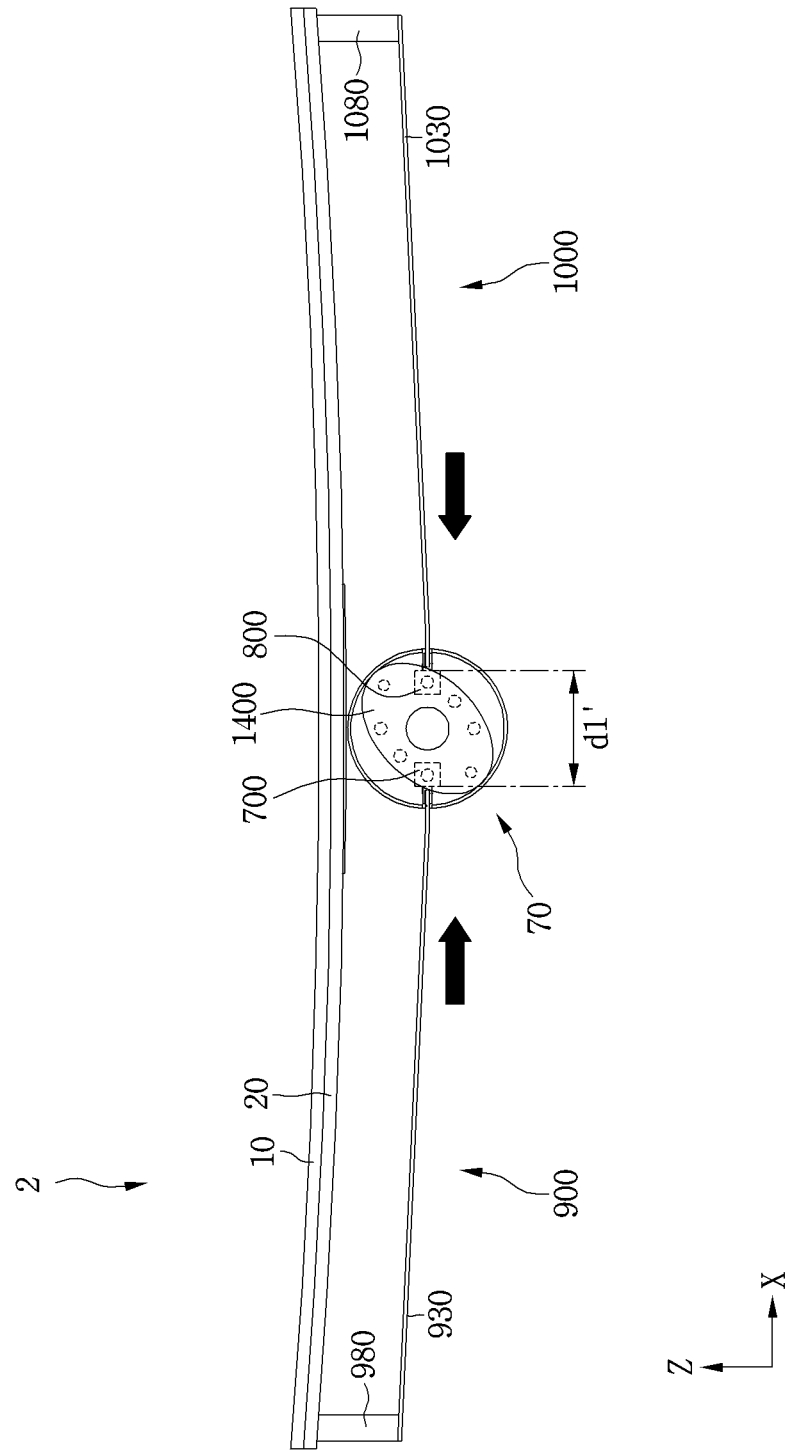
Figure 17:
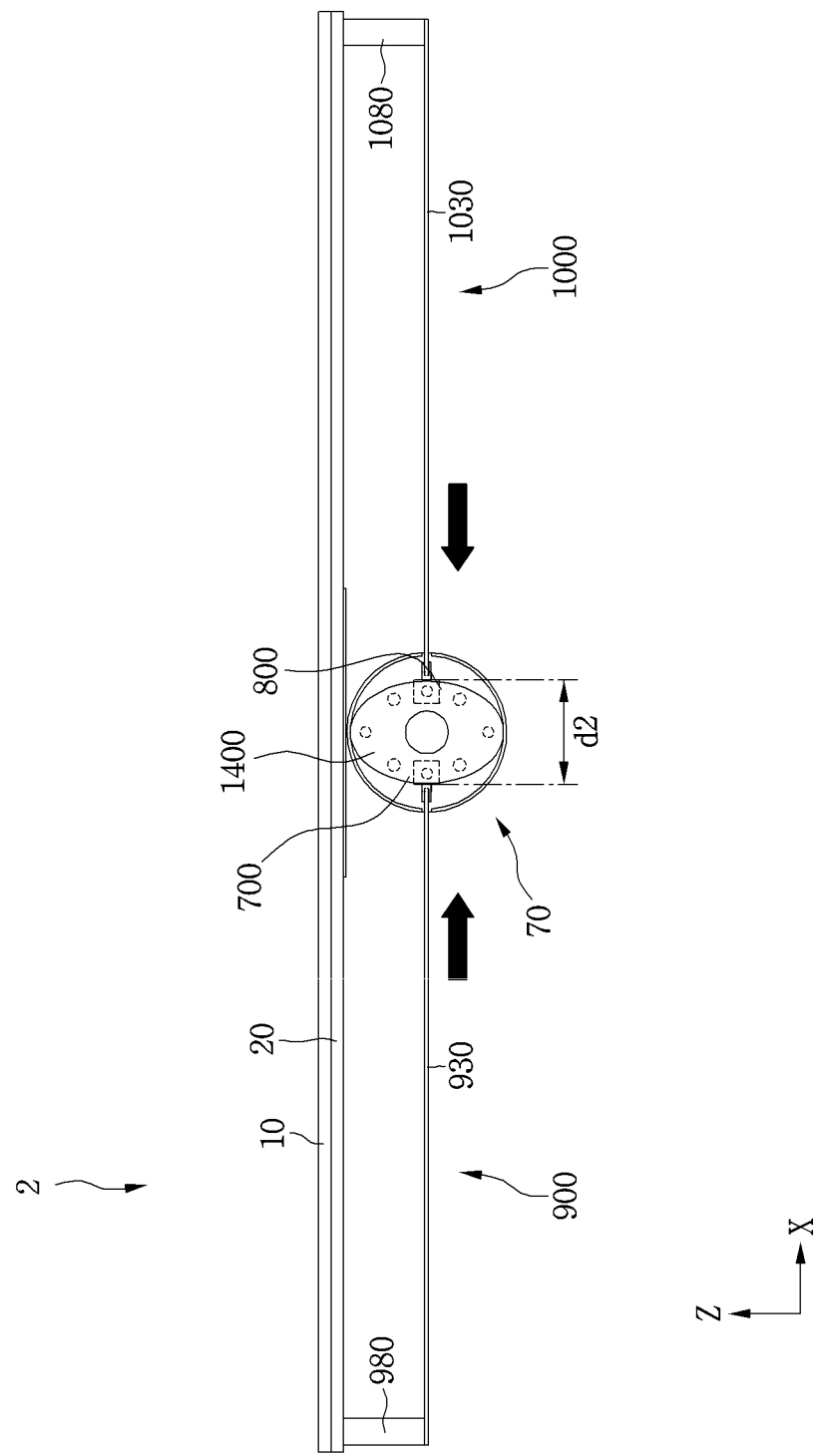

FIGS. 15 to 17 are views for explaining an operation of the display apparatus including the cam body of FIG. 12.

For convenience of description, portions of the components described in the foregoing drawings will be omitted or simplified in FIGS. 9 to 11.

Referring to FIG. 15, like FIG. 9, when the curved display is provided, in the cam body 1400 of the curvature display unit 70, the pair of cam pulleys 700 and 899 are disposed on the long axis of the cam body 1400. Referring to FIG. 17, like FIG. 10, when the flat panel display is provided, in the cam body 1400 of the curvature display unit 70, the pair of cam pulleys 700 and 899 are disposed on the short axis of the cam body 1400. That is, the display apparatus 2 according to the current embodiment may provide a curved display or flat panel display by user's manipulation, like the foregoing embodiment. Furthermore, the display apparatus 2 may further realize an additional curved display, unlike the foregoing embodiment.

As illustrated in FIG. 15, when user's downward pressing is performed in the state where the curved display is provided, a button member (see reference numeral 200 of FIG. 2) may move downward to allow the cam body 1400 to horizontally rotate in one direction.

Referring to FIG. 16, in the cam body 1400 according to the current embodiment, as the cam body 1400 horizontally rotates through the above-described structure, the pair of cam pulleys 700 and 800 are disposed the long axis and the short axis of the cam body 1400. Thus, the pair of wings 900 and 1000 are pulled in the direction of the adjustment unit casing 100 while the horizontal parts 930 and 1030 of the pair of wings 900 and 1000 are slid into the adjustment unit casing 100.

Here, the horizontal parts 930 and 1030 of the pair of wings 900 and 1000 may be further pushed into the adjustment unit casing 100 due to the pair of cam pulleys 700 and 800 disposed between the long axis and the short axis of the cam body 1400 in comparison to the foregoing embodiment. Also, the pair of wings 900 and 1000 may also be further pulled in comparison to the foregoing embodiment. Thus, a distance d1' between the pair of wings 900 and 1000 is less than a distance d1 between the pair of wings 900 and 1000 in FIG. 5 and greater than a distance d2 between the pair of wings 900 and 1000 in FIG. 17.

As the pair of wings 900 and 1000 are slid, the back cover 20 may not be completely converted into the flat state, but have a relatively smooth curvature when compared to that in FIG. 15. That is, the display apparatus 2 may realize the curved display having curvatures different from each other.

When the user's downward pressing is performed again in the display apparatus 2 having the above-described curvatures, as illustrated in FIG. 17, the cam body 1400 may horizontally rotate again in one direction, and thus, the pair of cam pulleys 700 and 800 may be disposed on the short axis of the cam body 1400. Thus, the pair of wings 900 and 1000 are pulled in the direction of the adjustment unit casing 100 while the horizontal parts 930 and 1030 of the pair of wings 900 and 1000 are further slid into the adjustment unit casing 100 to convert the back cover 20 into the flat state. That is, the display apparatus 2 may provide the flat panel display.

When the user's downward pressing is performed again, the cam body 1400 may horizontally rotate again in one direction, and thus, the pair of cam pulleys 700 and 800 may be disposed between the long axis and the short axis of the cam body 1400. The display apparatus 2 may provide the curved display having the smooth curvature as illustrated in FIG. 16. Here, if the user's downward pressing is further performed, the display apparatus 2 may provide the curved display having the same curvature as that of FIG. 15.

Thus, the curvature adjustment unit 70 may adjust the curvature of the back cover 20 to provide the curved display and flat panel display which have curvatures different from each other as the cam body 1400 horizontally rotates in one direction by the user's downward pressing. However, this is merely an example. For example, the display apparatus 2 may provide a curved display having at least three curvatures according to a design thereof.

Since the curvature of the display apparatus 2 according to the current embodiment is adjusted in stages, the curved display having various curvatures may be realized according to the user's manipulation.

Figure 18:
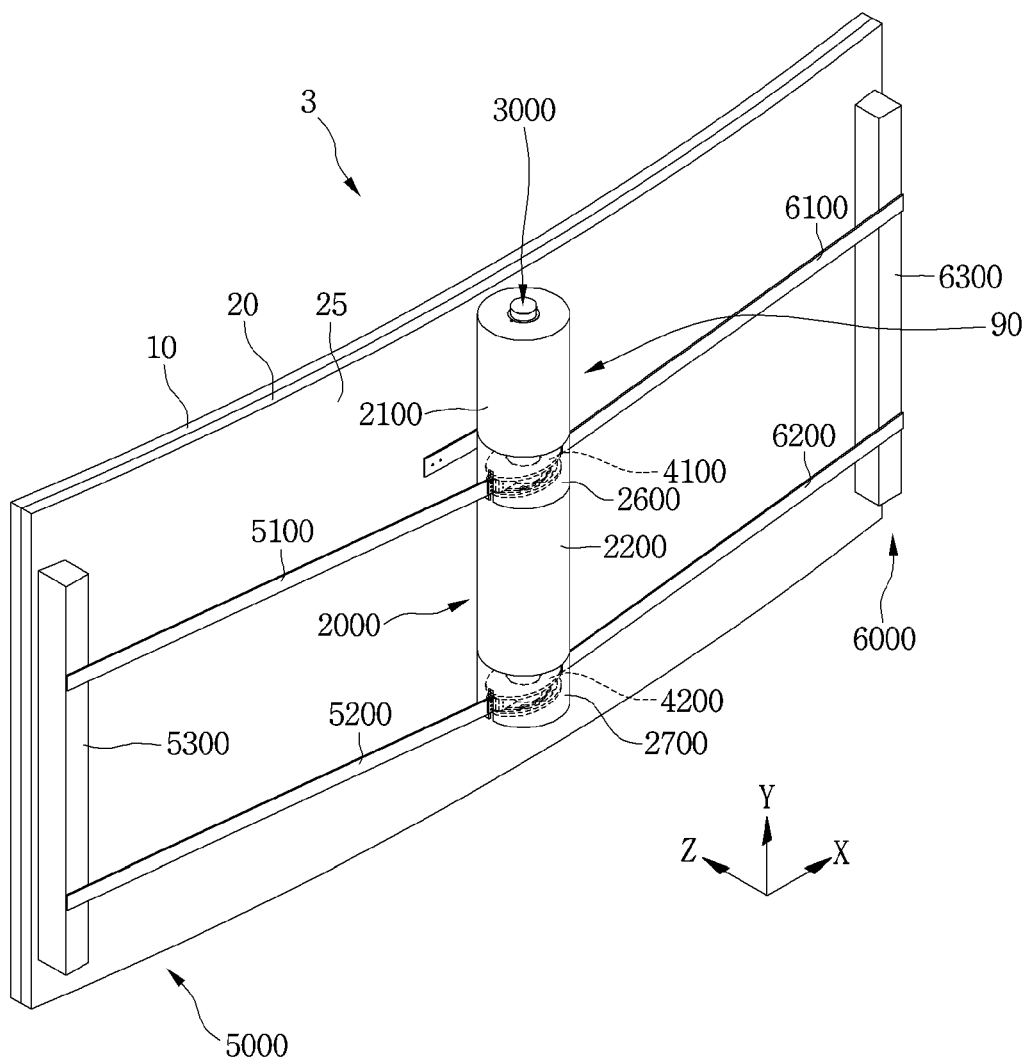
FIG. 18 is a rear perspective view of the display apparatus according to another embodiment.

FIG. 18 is a rear perspective view of the display apparatus according to another embodiment.

A display apparatus 3 according to the current embodiment is similar to the display apparatus according to the foregoing embodiment. Thus, duplicated descriptions with respect to the same0 or similar components will be omitted, and different points therebetween will be mainly described below.

Referring to FIG. 18, the display apparatus 3 includes a display panel 10, a back cover 20, and a curvature adjustment unit 90.

Since the display panel 10 and the back cover 20 are the same as those according to the foregoing embodiment, their duplicated descriptions will be omitted.

A curvature adjustment unit 90 includes an adjustment unit casing 2000, a button member 3000, a pair of cam parts 4100 and 4200, and a pair of wings 5000 and 6000.

The adjustment unit casing 2000 includes a pair of button member insertion parts 2100 and 2200 and a pair of cam part accommodation chambers 2600 and 2700.

The pair of button member insertion parts 2100 and 2200 are constituted by an upper button member insertion part 2100 and a lower button member insertion part 2200.

A button member 3000 passes through the upper button member insertion part 2100. The upper button member insertion part 2100 exposes the button member 3000 upward to allow a user to manipulate the button member 3000. The lower button member insertion part 2200 slidably accommodates the button member 3000 in a vertical direction (a Y-axis direction) to connect the pair of cam part accommodation chambers 2600 and 2700.

The pair of cam part accommodation chambers 2600 and 2700 are constituted by a first cam part accommodation chamber 2600 and a second cam part accommodation chamber 2700.

The first cam part accommodation chamber 2600 accommodates a first cam 4100 that will be described later to connect the upper button member insertion part 2100 to the lower button member insertion part 2200.

The second cam part accommodation chamber 2700 accommodates a second cam 4200 that will be described later and is disposed on a bottom portion of the lower button member insertion part 2200. An elastic part for accommodating an elastic member like the foregoing embodiment is mounted on a bottom portion of the second cam part accommodation chamber 2700.

The upper button member insertion part 2100, the lower button member insertion part 2200, the first cam part accommodation chamber 2600, and the second cam part accommodation chamber 2700 which constitute the adjustment unit casing 2000 may be separately manufactured or integrated with each other according to their design.

The button member 3000 may have a length enough to allow the pair of cam parts 4100 and 4200 to rotate.

The pair of cam parts 4100 and 4200 are constituted by a first cam part 4100 and a second cam part 4200.

The first cam part 4100 is accommodated in the first cam part accommodation chamber 2600 to rotate in a horizontal direction (an XZ-axis direction) while the button member 3000 is slid.

The second cam part 4200 is accommodated in the second cam part accommodation chamber 2600 to rotate in the horizontal direction (the XZ-axis direction) while the button member 3000 is slid, like the first cam part 4100.

The pair of wings 5000 and 6000 include a first wing 5000 and a second wing 6000.

The first wing 5000 includes a pair of horizontal bars 5100 and 5200 and a vertical part 5300.

The pair of horizontal bars 5100 and 5200 are constituted by an upper horizontal bar 5100 and a lower horizontal bar 5200.

The upper horizontal bar 5100 is connected to the first cam part 4100, and the lower horizontal bar 5200 is connected to the second cam part 4200. The upper horizontal bar 5100 and the lower horizontal bar 5200 are disposed to be spaced a predetermined distance from each other in a vertical direction (a Y axis direction).

The vertical part 5300 is connected to the upper horizontal bar 5100 and the lower horizontal bar 5200 and fixed to a rear surface 25 of a back cover 20.

The second wing 6000 includes a pair of horizontal bars 6100 and 6200 and a vertical part 6300. The pair of horizontal bars 6100 and 6200 are constituted by an upper horizontal bar 6100 and a lower horizontal bar 6200, like the first wing 5000.

Since the upper horizontal bar 6100, the lower horizontal bar 6200, and the vertical part 6300 of the second wing 6000 are substantially similar to the upper horizontal bar 5100, the lower horizontal bar 5200, and the vertical part 5300 of the first wing 5000, their duplicated descriptions will be omitted below.

In the display apparatus 3 according to the current embodiment, as the button member 300 is slid in the vertical direction (the Y-axis direction), the first and second cam parts 4100 and 4200 rotate in the horizontal direction (the XZ-axis direction). Thereafter, the upper horizontal bars 5100 and 6100 and the lower horizontal bars 5200 and 6200 of the first and second wings 5000 and 6000 may be slid to pull or push the back cover 20, thereby adjusting a curvature of the back cover 20.

Figure 19:
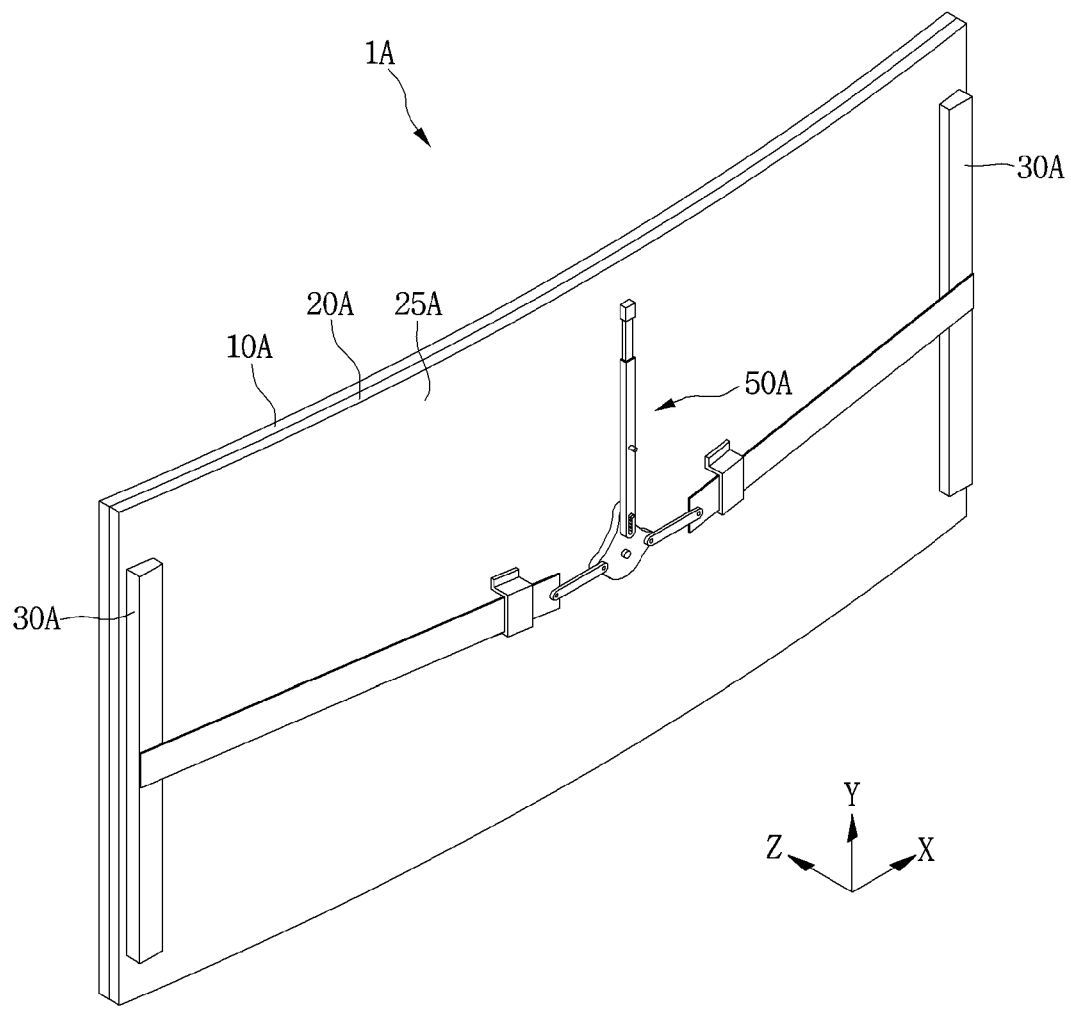
FIG. 19 is a rear perspective view of a display apparatus according to further another embodiment.

FIG. 19 is a rear perspective view of a display apparatus according to further another embodiment.

Referring to FIG. 19, a display apparatus 1A may be a curved display apparatus, i.e., a display apparatus that is capable of varying to a flat panel display. The display apparatus 1A includes a display panel 10A, a back cover 20A, and a curvature adjustment unit 50A.

The display panel 10A may display an image and include an organic light emitting diode (OLED) panel or liquid crystal display (LCD) panel which are capable of varying to a curved display or flat panel display. Hereinafter, the OLED panel may be described as the display panel 10A according to the current embodiment.

The back cover 20A may support the display panel 10A and vary to a curved or flat plate such as the display panel 10A. The back cover 20A is mounted on a rear surface of the display panel 10A. The back cover 20A may include various components such as a power board (not shown) for supplying a power to the display apparatus 1A and a control board (not shown) for controlling the display apparatus 1A. The components such as the power board and the control board may be provided in a separate casing and mounted to a rear side or bottom surface of the back cover 20A.

The curvature adjustment unit 50A may adjust a curvature of the back cover 20A to adjust a curvature of the display panel 10A. The curvature adjustment unit 50A may adjust the curvature by using a manual manner such as user's manipulation, i.e., by allowing a user to rotate a lever through a link structure.

The curvature adjustment unit 50A is mounted on a rear surface 25A of the back cover 20A and coupled to a bracket 30A mounted on each of both ends of the rear surface 25A of the back cover 20A. Here, the curvature adjustment unit 50A may be integrated with the bracket 30A.

The curvature adjustment unit 50A may be mounted on a front surface of the display apparatus 1A so that the curvature adjustment unit 50A injures the beauty of the display apparatus 1A. Furthermore, the curvature adjustment unit 50A may be mounted at a height at which the rotation of the curvature adjustment unit 50A is realized on the front surface of the display apparatus 1A so as to secure user's convenience in use.

If the user intends to adjust the curvature of the display panel 10A to the curved display or flat panel display, the curvature adjustment unit 50A may rotate to adjust the curvature of the back cover 20A, thereby adjusting the curvature of the display panel 10A.

Hereinafter, the curvature adjustment unit 50A according to the current embodiment will be described in more detail.

Figure 20:
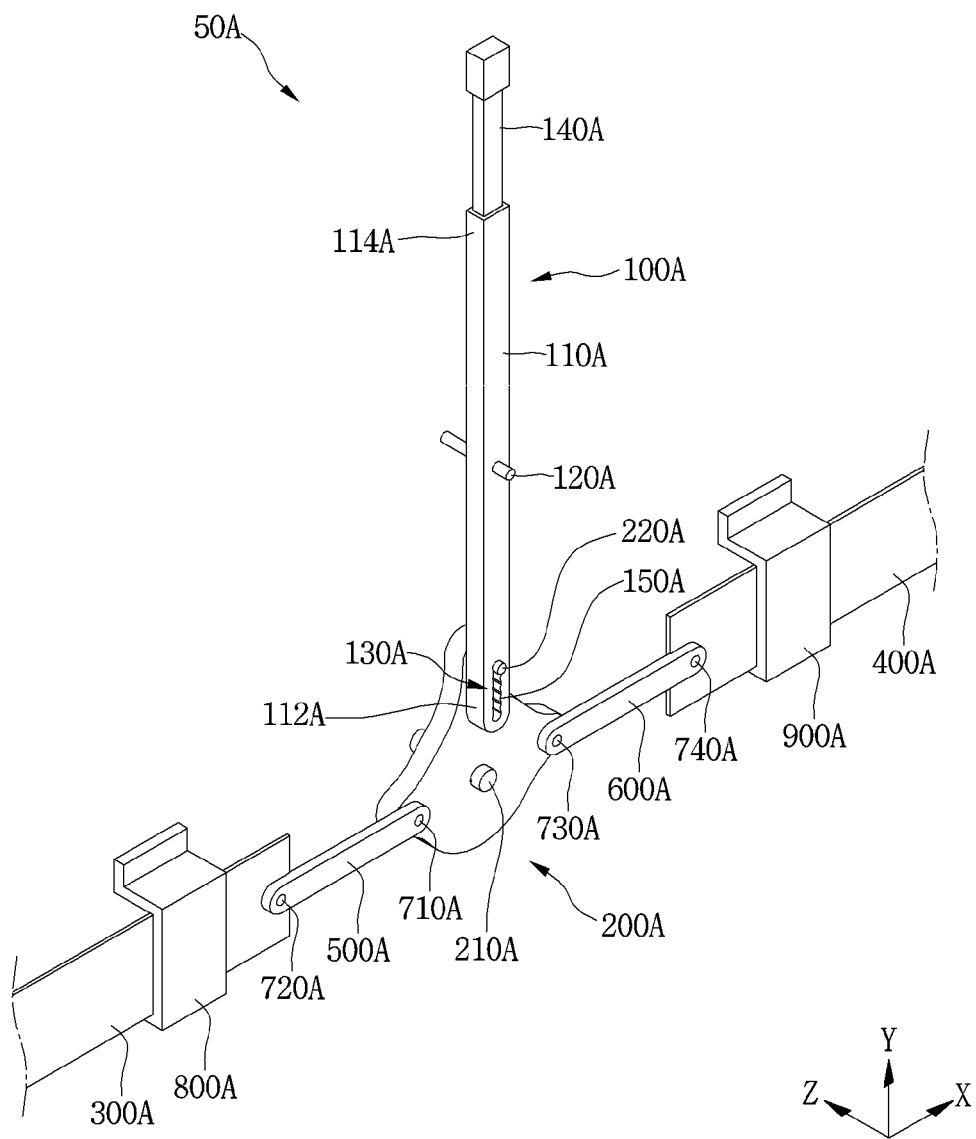
FIG. 20 is a perspective view illustrating a curvature adjustment unit of the display apparatus of FIG. 19.

FIG. 20 is a perspective view illustrating a curvature adjustment unit of the display apparatus of FIG. 19.

Referring to FIG. 20, the curvature adjustment unit 50A includes a curvature adjustment lever 100A, a rotation crank 200A, a pair of wings 300A and 400A, a pair of link members 500A and 600A, and a pair of wing guides 800A and 900A.

The curvature adjustment lever 100A is mounted on the rear surface 25A of the back cover 20A to rotate on a plane that is parallel to the rear surface (see reference numeral 25A of FIG. 19) of the back cover (see reference 20A of FIG. 19) by the user's manipulation. The curvature adjustment lever 100A includes a lever body 110A, a lever pivot pin 120A, a rotation guide slot 130A, and a sliding lever 140A.

The lever body 110A has a long bar shape and is disposed in a vertical direction (a Y-axis direction) of the rear surface (see reference numeral 25A of FIG. 19) of the back cover (see reference numeral 20A of FIG. 19). One end 112A of the lever body 110A is seated on the rotation crank 200A. Thus, the lever body 110A is disposed to be spaced a predetermined distance from the rear surface (see reference numeral 25A of FIG. 19) of the back cover (see reference numeral 20A of FIG. 19).

The lever pivot pin 120A passes through the lever body 110A and then is fixedly mounted on the rear surface (see reference numeral 25A of FIG. 19) of the back cover (see reference numeral 20A of FIG. 19). The lever pivot pin 120A functions as a rotation shaft of the curvature adjustment lever 100A when the curvature adjustment lever 100A rotates. That is, the curvature adjustment lever 100A may rotate about the lever pivot pin 120A.

The rotation guide slot 130A is disposed on one end 112A of the lever body 110A along a longitudinal direction of the lever body 110A. A crank line pin 220A of the rotation crank 200A, which will be described later is slidably inserted into the rotation guide slot 130A.

A stopper 150A for restricting the sliding of the crank link pin 220A when the crank link pin 220A rotates is disposed on an inner wall of the rotation guide slot 130A. The stopper 150A may have the form of waves that face each other in the longitudinal direction of the rotation guide slot 130A. The stopper 150A may have a structure constituted by a convex portion and a concave portion which are alternately disposed. Here, each of the convex portion and the concave portion may extend in the longitudinal direction of the rotation guide slot 130A. That is, the stopper 150A may have a structure in which one concave portion is disposed between two convex portions, and one convex portion is disposed between two concave portions. The number of convex portion and concave portion may adequately change according to its design. Furthermore, the stopper 150A may have other shapes that are capable of restricting the sliding of the crank link pin 220A when the crank link pin 220A rotates in addition to the wave shape.

The sliding lever 140A is mounted to be slidable in the longitudinal direction of the lever body 110A on the other end 114A of the lever body 110A. The sliding lever 140A may be inserted into the lever body 110A or withdrawn from the lever body 100A through the sliding thereof.

The rotation crank 200A is link-connected to the curvature adjustment lever 100A. The rotation crank 200A is mounted on the rear surface (see reference numeral 25A of FIG. 19) of the back cover (see reference numeral 20A of FIG. 19) so that the rotation crank 200A is rotatable in a direction opposite to the rotation direction of the curvature adjustment lever 100A when the curvature adjustment lever 100A rotates. The rotation crank 200A includes a crank pivot pin 210A and a crank link pin 220A.

The crank pivot pin 210A passes through the rotation crank 200A and then is fixed to the rear surface (see reference numeral 25A of FIG. 19) of the back cover (see reference numeral 20A of FIG. 19). The crank pivot pin 210A functions as a rotation shaft of the rotation crank 200A when the rotation crank 200A rotates. That is, the rotation crank 200A may rotate about the crank pivot pin 210A.

The crank link pin 220A protrudes from the rotation crank 200A and then is inserted into the rotation guide slot 130A. The crank link pin 220A is slid along the rotation guide slot 130A as the rotation crank 200A rotates.

Thus, the pair of wings 300A and 400A are disposed to be spaced a predetermined distance from the rear surface (see reference numeral 25A of FIG. 19) of the back cover (see reference numeral 20A of FIG. 19). The pair of wings 300A and 400A are disposed to each other and connected to the rotation crank 200A.

The pair of wings 300A and 400A may be formed of a flexible material. Also, the pair of wings 300A and 400A may be closer to or away from each other as the rotation crank 200A rotates. The pair of wings 300A and 400A include a first wing 300A and a second wing 400A.

The first wing 300A is disposed in a left direction (a −X-axis direction) of the rotation crank 200A. One end (see reference numeral 310A of FIG. 22) of the first wing 300A is link-coupled to the rotation crank 200A, and the other end (see reference numeral 320A of FIG. 22) of the first wing 300A is fixed to a bracket (see reference numeral 30A of FIG. 22) disposed in the left direction (the −X-axis direction) of the back cover (see reference numeral 20A of FIG. 22).

The second wing 400A is disposed in a right direction (a +X-axis direction) of the rotation crank 200A. One end (see reference numeral 410A of FIG. 22) of the second wing 400A is link-coupled to the rotation crank 200A, and the other end (see reference numeral 420A of FIG. 22) of the second wing 400A is fixed to a bracket (see reference numeral 30A of FIG. 22) disposed in the right direction (the +X-axis direction) of the back cover (see reference numeral 20A of FIG. 22).

The pair of link members 500A and 600A connect the rotation crank 200A to the pair of wings 300A and 400A, respectively. The pair of link members 500A and 600A include a first link member 500A and a second link member 600A.

The first link member 500A link-couples the rotation crank 200A to the first wing 300A. Particularly, the first link member 500A is link-coupled to the rotation crank 200A through a link pin 710A and link-coupled to the first wing 300A through a link pin 720A.

The second link member 600A link-couples the rotation crank 200A to the second wing 400A. Particularly, the second link member 600A is link-coupled to the rotation crank 200A through a link pin 730A and link-coupled to the second wing 400A through a link pin 740A.

The pair of wing guides 800A and 900A guide the sliding of the pair of wings 300A and 400A and is mounted on the rear surface (see reference numeral 25A of FIG. 19) of the back cover (see reference numeral 20A of FIG. 19). The pair of wing guides 800A and 900A include a first wing guide 800A and a second wing guide 900A.

The first wing guide 800A surrounds a portion of the whole of the first wing 300A. In the current embodiment, the first wing guide 800A may surround a portion of the first wing 300A.

The first wing guide 800A prevents the first wing 300A from moving in the vertical direction (the Y-axis direction) of the first wing 300A to guide smooth sliding of the first wing 300A when the first wing 300A is slid. Furthermore, the first wing guide 800A effectively transmits a force for changing the curvature, which is generated when the first wing 300A is slid and provided from the back cover (see reference numeral 20A of FIG. 19), to the back cover (see reference numeral 20A of FIG. 19).

The second wing guide 900A surrounds a portion of the whole of the second wing 400A. In the current embodiment, the second wing guide 800A surrounds a portion of the whole of the second wing 400A, like the first wing guide 800A.

The second wing guide 900A prevents the second wing 400A from moving in the vertical direction (the Y-axis direction) of the second wing 400A to guide smooth sliding of the second wing 400A when the second wing 400A is slid. Furthermore, the second wing guide 900A effectively transmits a force for changing the curvature, which is generated when the second wing 400A is slid and provided from the back cover (see reference numeral 20A of FIG. 19), to the back cover (see reference numeral 20A of FIG. 19), like the first wing guide 800A.

Hereinafter, a curvature adjustment operation of the display apparatus 1A including the curvature adjustment unit 50A will be described.

FIGS. 21 to 24 are views for explaining a curvature adjustment operation of the display apparatus of FIG. 19.

Figure 21:
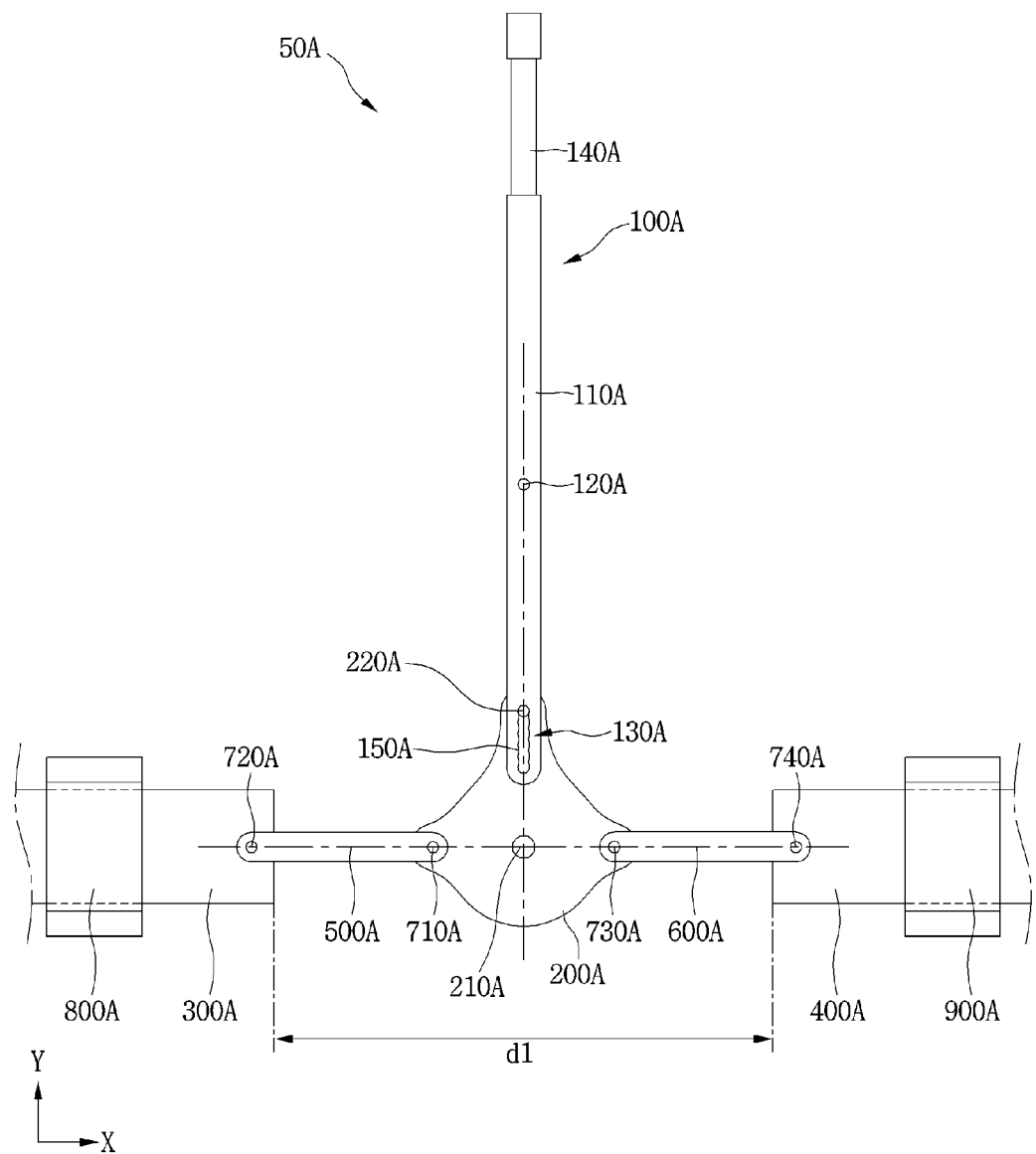
FIGS. 21 to 24 are views for explaining a curvature adjustment operation of the display apparatus of FIG. 19.
Figure 22:
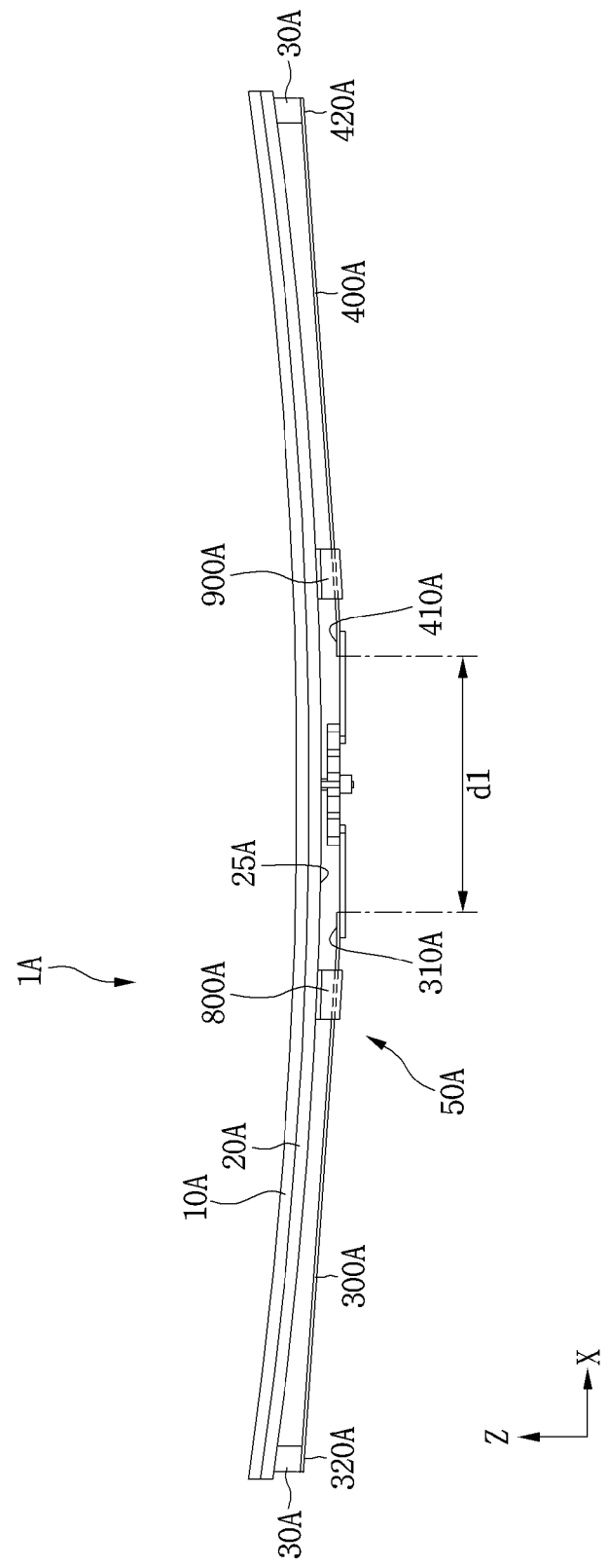

Referring to FIGS. 21 and 22, when the curved display of the display apparatus 1A is realized, the curvature adjustment lever 100A of the curvature adjustment unit 50A is disposed in the Y-axis direction. That is, the curvature adjustment lever 100A is disposed in the vertical direction (the Y-axis direction) of the back cover 20A. Thus, the lever pivot pin 120A of the curvature adjustment lever 100A, the crank pivot pin 210A of the rotation crank 200A, and the crank link pin 220A of the rotation crank 200A are disposed in a line on the Y-axis. Here, the crank link pin 220A is disposed on an upper end of the rotation guide slot 130A.

The first and second wings 300A and 400A are disposed to be spaced a predetermined distance d1 from each other due to the arrangement of the first and second link members 500A and 600A that are disposed in a line on the X-axis. Thus, the crank pivot pin 210A of the rotation crank 200A and the four link pins 710A, 720A, 730A, and 740A are disposed in a line on the X-axis.

When the user intends to convert the curved display into the flat panel display, the user rotates the curvature adjustment lever 100A to change a curvature of the display panel 10A.

The user may pull the sliding lever 140A of the curvature adjustment lever 100A to withdraw the sliding lever 140A out of the lever body 110A by a predetermined length. This is done for elongating a substantial length of the curvature adjustment lever 100A to reduce a force that is burden to the user so as to perform the rotation by using the principle of the lever.

Figure 23:
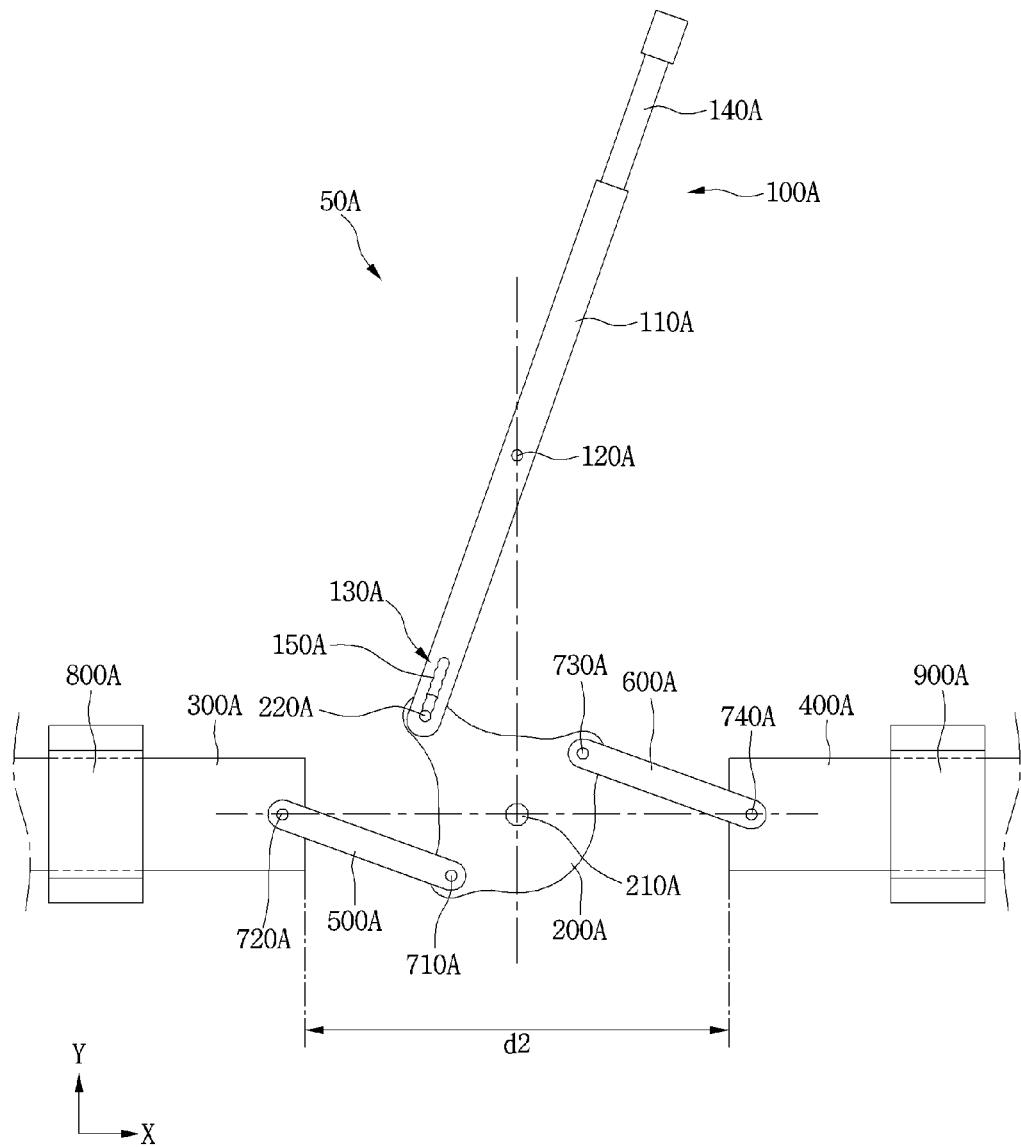
Figure 24:
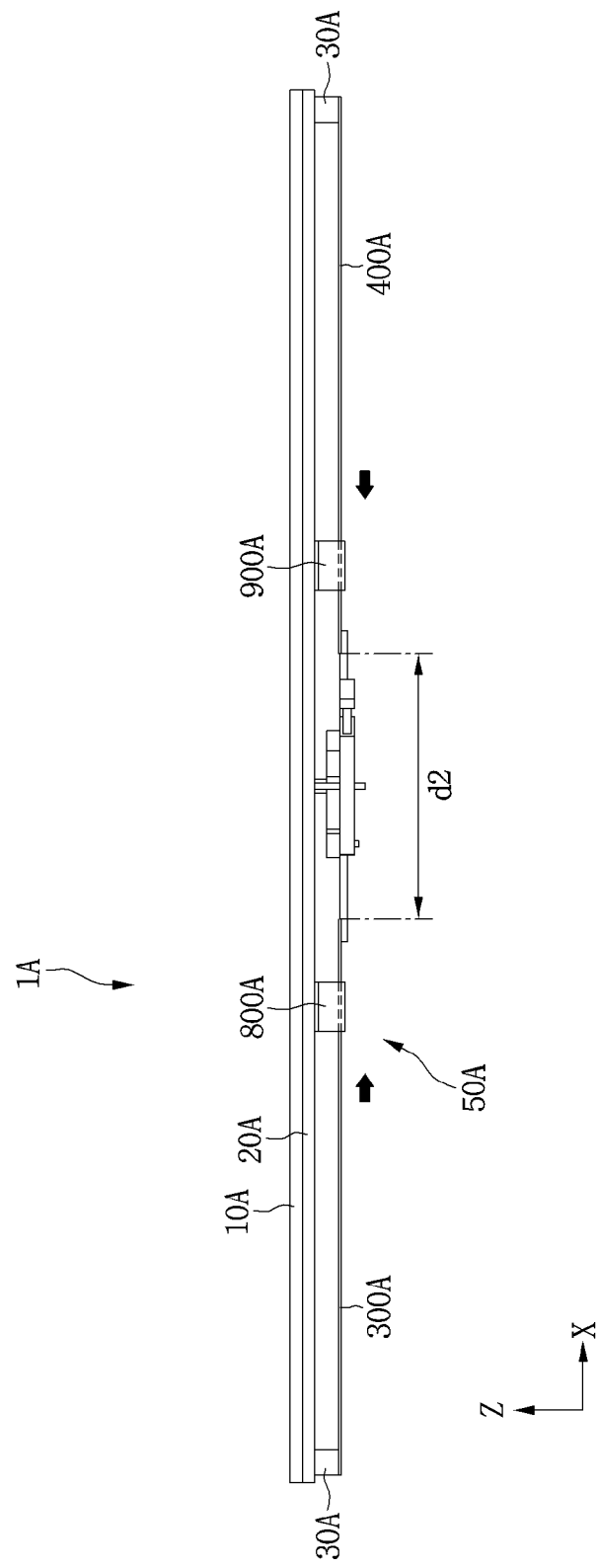

Referring to FIGS. 23 and 24, the user rotates the curvature adjustment lever 100A in one direction. In the current embodiment, a case in which the curvature adjustment lever 100A rotates in a clockwise direction will be described as an example.

The curvature adjustment lever 100A rotates in the clockwise direction by using the lever pivot pin 120A as a rotation shaft by the user's manipulation. As the curvature adjustment lever 100A rotates, the rotation crank 200A rotates in a direction opposite to the rotation direction of the curvature adjustment lever 100A, i.e., a counterclockwise direction, by using the crank pivot pin 210A as a rotation shaft.

Thus, the crank link pin 220A of the rotation crank 200A is slid from an upper end of the rotation guide slot 130A to a lower end of the rotation guide slot 130A. Here, the sliding of the crank link pin 220A may be restricted by the stopper 150A. Particularly, when the crank link pin 220A is slid in the rotation guide slot 130A, the sliding of the crank link pin 220A may be stopped at a position at which the crank link pin 220A is hooked with the stopper 150A.

Thereafter, the user rotates the curvature adjustment lever 100A again in one direction, i.e., in the clockwise direction according to the current embodiment and then rotate the rotation crank 200A again in the counterclockwise direction. As the rotation crank 200A rotates, the crank link pin 220A of the rotation crank 200A is slid again to the lower end of the rotation guide slot 130A.

As descried above, when the crank link pin 220A rotates from the upper end of the rotation guide slot 130A to the lower end of the rotation guide slot 130A, the restriction in sliding may frequently occur according to the design of the stopper 150A.

As the rotation crank 200A rotates, the first link member 500A rotates in the clockwise direction by using the link pin 720A coupled to the first wing 300A as a rotation shaft, i.e., about the link pin 720A coupled to the first wing 300A. Thus, the first wing 300A is slid toward the rotation crank 200A.

As the rotation crank 200A rotates, the second link member 600A rotates in the clockwise direction by using the link pin 740A coupled to the second wing 400A as a rotation shaft, i.e., about the link pin 740A coupled to the second wing 400A. Thus, the second wing 400A is slid toward the rotation crank 200A.

As a result, as the rotation crank 200A rotates, the first and second wings 300A and 400A are pulled in the direction of the rotation crank 200A. Thus, the back cover 20A may change into the flat state to convert the display panel 10A into the flat panel display.

On the other hand, when it is intended to convert the flat panel display to the curved display, the user may rotate the curvature adjustment lever 100A in a direction opposite to the clockwise direction, i.e., in the counterclockwise direction.

As the first and second wings 300A and 400A are slid, a distance d2 spaced between the first and second wings 300A and 400A may be less than the spaced distance d1 in FIGS. 21 and 22. That is to say, the first and second wings 300A and 400A may be more closer to each other in comparison to that in FIGS. 21 and 22. As a result, the curvature of the back cover 20A may decrease when the first and second wings 300A and 400A are closer to each other and increase when the first and second wings 300A and 400A are away from each other.

Furthermore, the rotation crank 200A may be fixed to at least one position between the arranged positions in FIGS. 21 and 23 through the crank link pin 220A hooked to the stopper 150A as described above. The state in which the rotation crank 200A is fixed to one position between the arranged positions in FIGS. 21 and 23 may represent that the back cover 20A has curvatures different from each other within the curvature ranges in FIGS. 21 and 23. That is, the rotation crank 200A may be fixed to each of the positions at which the rotation crank 200A is hooked with the stopper 150A between the arranged positions in FIGS. 21 and 23. Thus, the curved display having the curvatures different from each other may be realized.

That is, when the curved display is realized in the current embodiment, various curved displays having curvatures different from each other may be realized. The number of fixed positions or positions to be disposed of the rotation crank 200A may vary according to the design of the stopper 150A.

As described above, since the display apparatus 1A according to the current embodiment operates by the manual manner such as the user's rotation manipulation instead of an automatic manner, the display apparatus 1 may have more simple structure in comparison to a display apparatus that operates by the automatic manner. Thus, the display apparatus 1A according to the current embodiment may realize a mechanism for adjusting the curvature at more less costs in comparison to that using the automatic manner.

Thus, the display apparatus 1A according to the current embodiment may adjust the curvature of the display panel 10A using the more simple structure while securing the price competitiveness.

Figure 25:
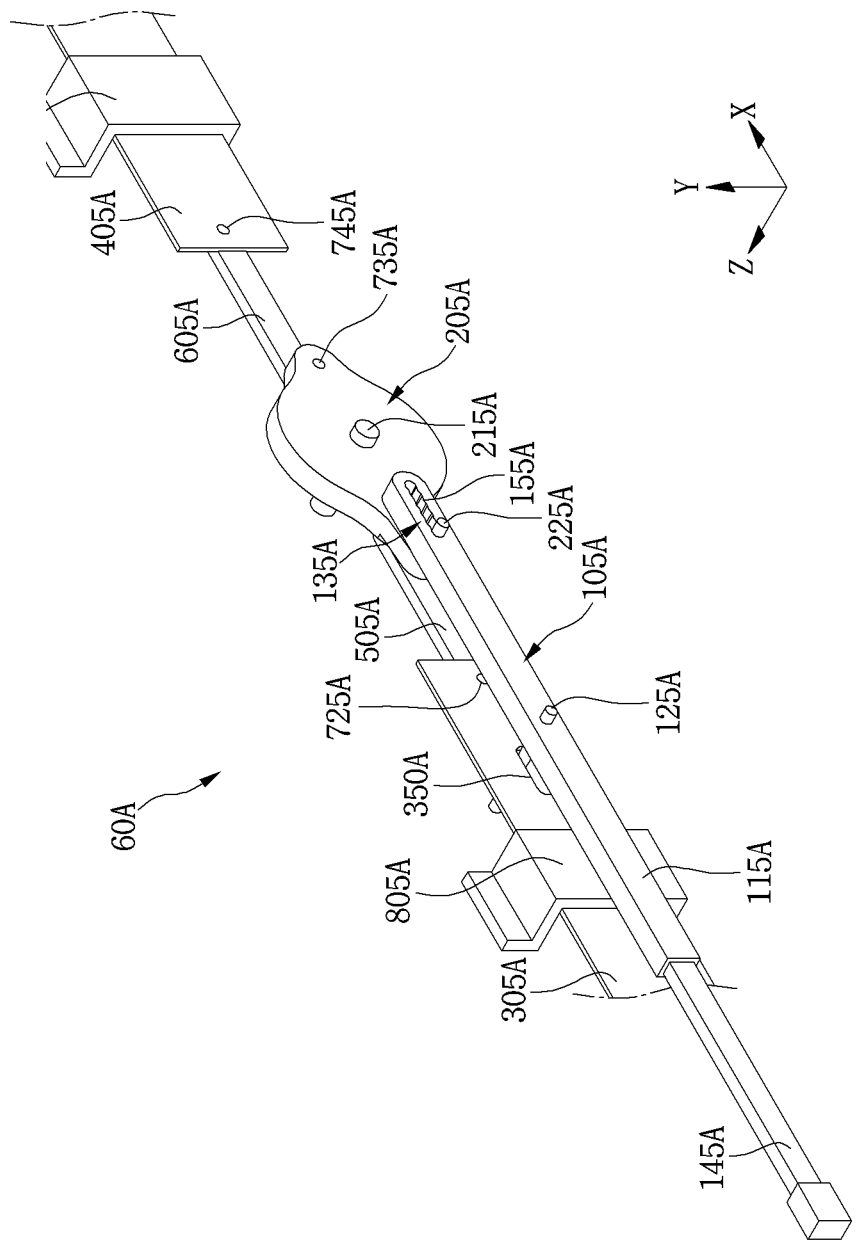
FIG. 25 is a perspective view of a curvature adjustment unit according to another embodiment.
Figure 26:
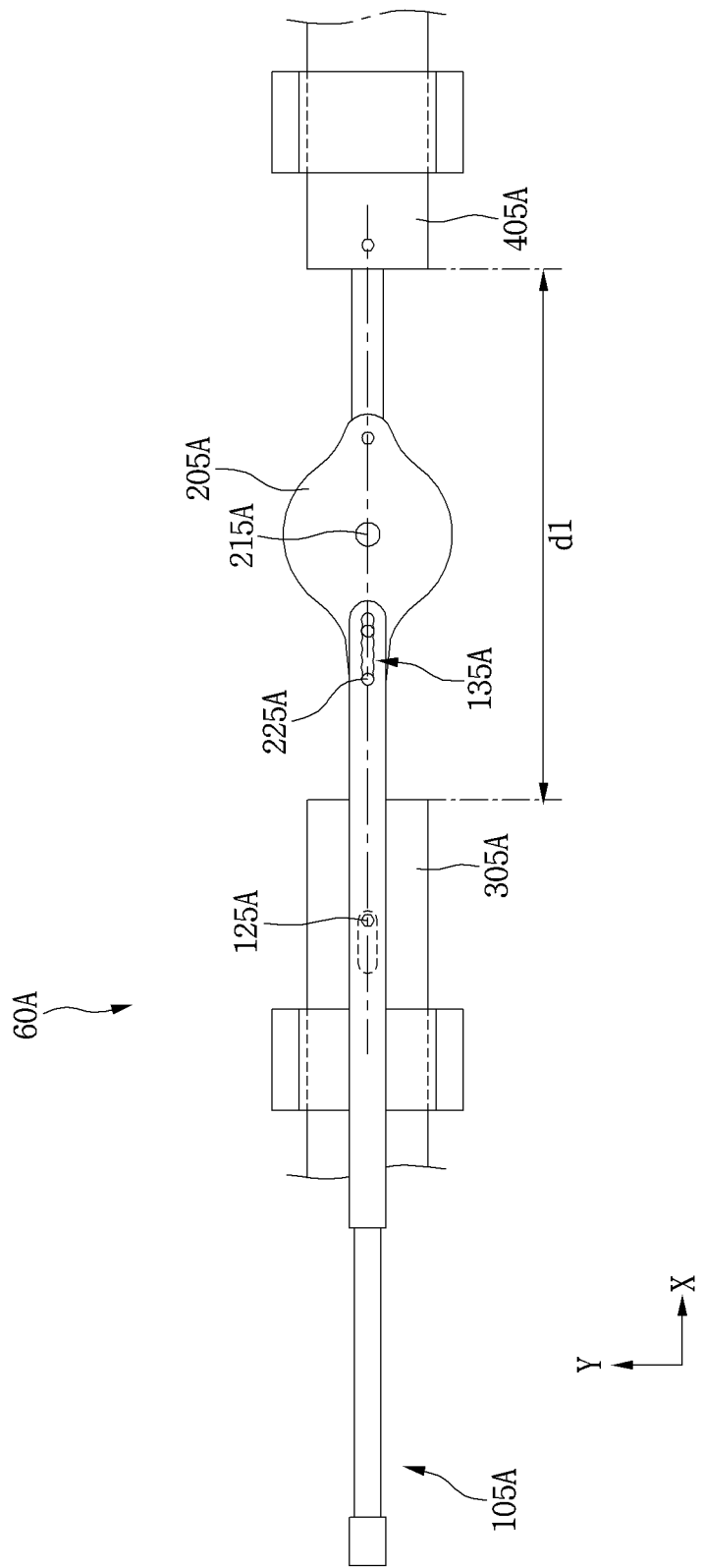
FIGS. 26 and 27 are views for explaining an operation of the curvature adjustment unit of FIG. 25.
Figure 27:
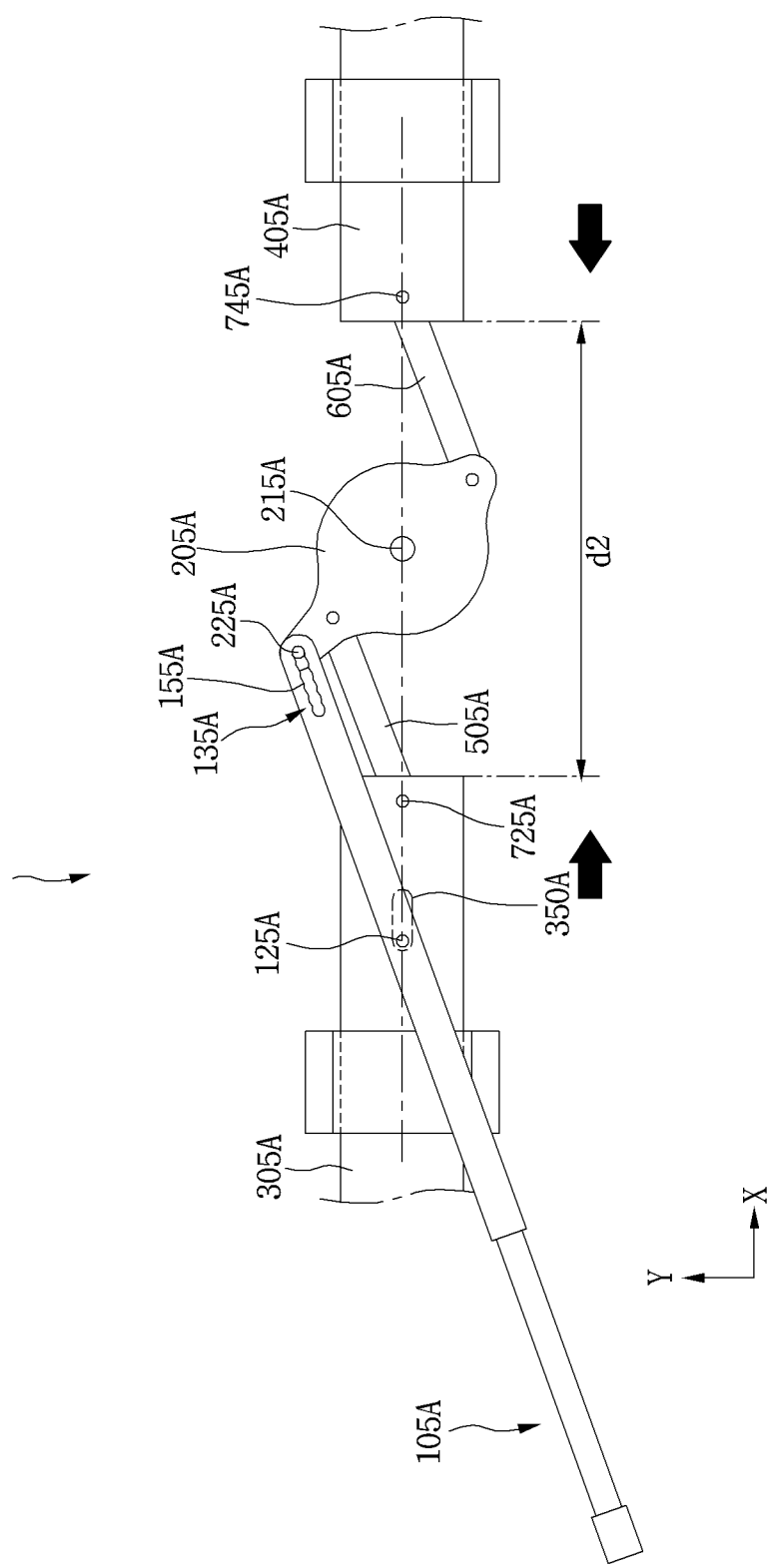

FIG. 25 is a perspective view of a curvature adjustment unit according to another embodiment, and FIGS. 26 and 27 are views for explaining an operation of the curvature adjustment unit of FIG. 25.

Since a curvature adjustment unit 60A according to the current embodiment is substantially similar to the curvature adjustment unit 50A according to the forgoing embodiment, the duplicated description with respect to the same constitution will be omitted, and thus different points therebetween will be mainly described.

Referring to FIG. 25, the curvature adjustment unit 60A includes a curvature adjustment lever 105A, a rotation crank 205A, a first wing 305A, a second wing 405A, a first link member 505A, a second link member 605A, a first wing guide 805A, and a second wing guide 905A.

The curvature adjustment lever 105A includes a lever body 115A, a lever pivot pin 125A, a rotation guide slot 135A, and a sliding lever 145A.

The lever body 115A is disposed parallel to the first wing 305A above the first wing 305A. That is, the lever body 115A is disposed in a horizontal direction (an X-axis direction) of a rear surface (see reference numeral 25A of FIG. 19) of a back cover (see reference numeral 20A of FIG. 19), unlike the foregoing embodiment.

Since the lever pivot pin 125A, the rotation guide slot 135A, and the sliding lever 145A are similar to those according to the foregoing embodiment, their detailed described will be omitted below.

The rotation crank 205A includes a crank pivot pin 210A and a crank link pin 220A.

Since the crank pivot pin 210A is similar to that according to the foregoing embodiment, its detailed description will be omitted below.

A crank line pin 220A is inserted into the rotation guide slot 130A and protrudes from a left end of the rotation crank 205A. That is, the crank link pin 220A protrudes from the same line s the crank pivot pin 210A in the horizontal direction (the X-axis direction) of the rotation crank 205A.

A first wing slide guide slot 350A through which the lever pivot pin 125A passes is defined in the first wing 305A. The first wing slide guide slot 350A guides sliding of the first wing 305A when the first wing 305A is slid.

Since the second wing 405A, the first link member 505A, the second link member 605A, the link pins 725A, 735A, and 745A, the first wing guide 805A, and the second wing guide 905A are similar to those according to the foregoing embodiment, their detailed descriptions will be omitted below.

Hereinafter, an operation of the curvature adjustment unit 60A according to the current embodiment will be described.

Referring to FIG. 26, when the curved display is realized, the curvature adjustment lever 105A of the curvature adjustment unit 60A is disposed in the X-axis direction. That is, the curvature adjustment lever 105A is disposed parallel to the first wing 305A. Thus, the lever pivot pin 125A, the crank pivot pin 215A of the rotation crank 205A, and the crank link pin 225A of the rotation crank 205A are disposed in a line on the X-axis. Here, the crank link pin 225A is disposed on a left upper end of the rotation guide slot 135A. Furthermore, the first and second wings 305A and 405A are disposed to be spaced a predetermined distance d1 from each other on the X-axis.

When the user intends to convert the curved display into the flat panel display, the user rotates the curvature adjustment lever 105A to convert the curved display into the flat panel display.

Referring to FIG. 27, the user rotates the curvature adjustment lever 105A in one direction. Hereinafter, in the current embodiment, a case in which the curvature adjustment lever 105A rotates in a counterclockwise direction will be described as an example.

The curvature adjustment lever 105A rotates in the counterclockwise direction by using the lever pivot pin 125A as a rotation shaft by the user's manipulation. The rotation crank 205A rotates in the clockwise direction by using the crank pivot pin 215A as a rotation shaft as the curvature adjustment lever 105A rotates.

Thus, the crank link pin 225A of the rotation crank 205A is slid from a left end of the rotation guide slot 135A to a right end of the rotation guide slot 130A. Here, the stopper 155A of the rotation guide slot 135A may operate as the same manner as the foregoing embodiment.

As the rotation crank 205A rotates, the first link member 505A rotates in the counterclockwise direction by using the link pin 725A coupled to the first wing 305A as a rotation shaft. Thus, the first wing 305A is slid toward the rotation crank 205A. Here, the first wing slide guide slot 350A guides smooth sliding of the first wing 305A.

As the rotation crank 205A rotates, the second link member 605A rotates in the counterclockwise direction by using the link pin 745A coupled to the second wing 405A as a rotation shaft. Thus, the second wing 400A is slid toward the rotation crank 200A.

That is, as described in the foregoing embodiment, the first and second wings 305A and 405A are pulled in the direction of the rotation crank 205A as the rotation crank 205A rotates. Thus, the back cover (see reference numeral 20A of FIG. 19) may be converted into the flat state. On the other hand, when it is intended to convert the flat panel display to the curved display, the user may rotate the curvature adjustment lever 105A in a direction opposite to the clockwise direction, i.e., in the clockwise direction.

As described above, the curvature adjustment unit 60A may be designed so that the curvature adjustment unit 60A is disposed in the X-axis direction, but in the Y-axis direction. The curvature adjustment lever 105A that is manipulated by the user may be disposed in other directions, unlike the above-described direction, if the curvature adjustment lever has a link structure in which the first and second wings 305A and 405A are slidable.

Figure 28:
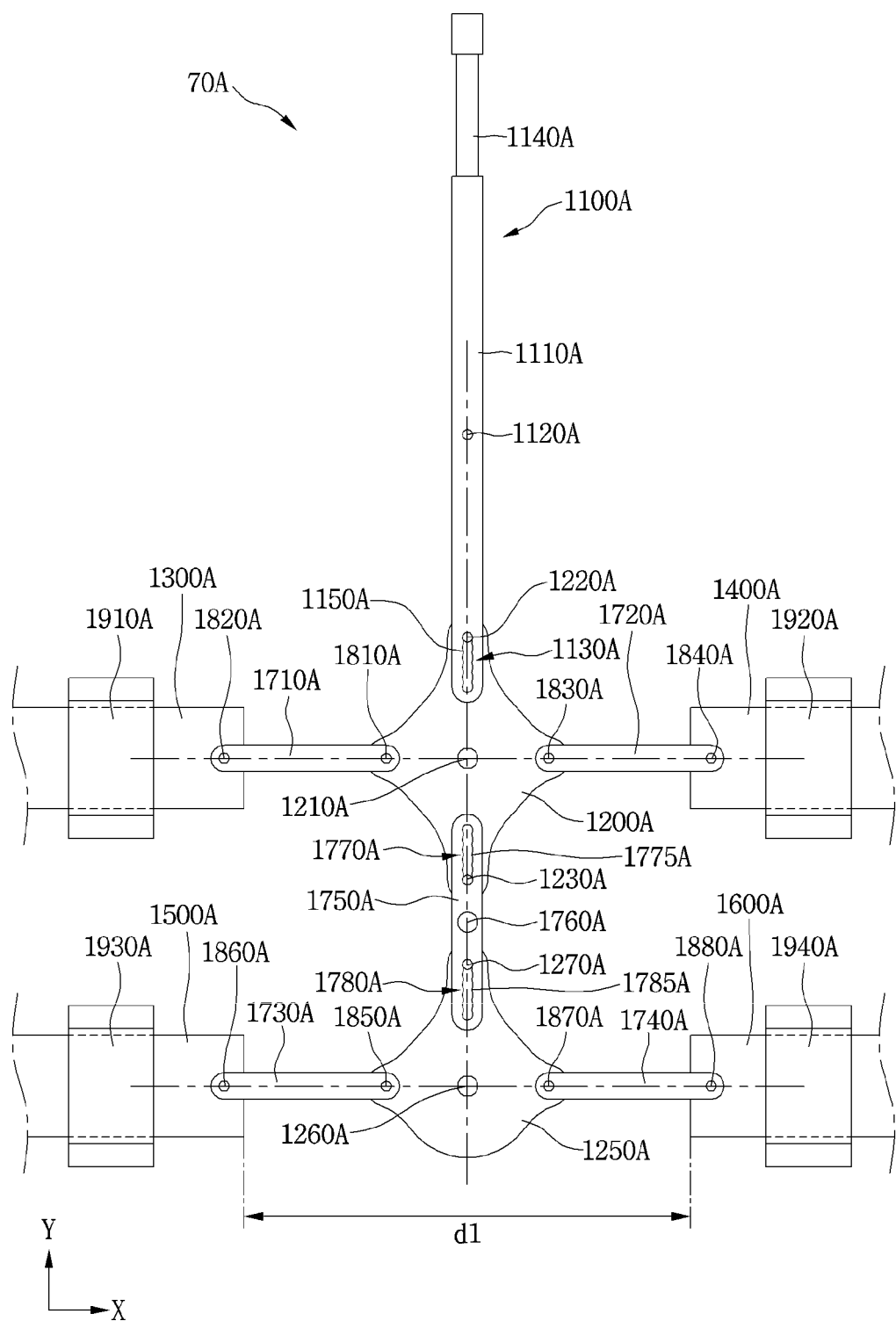
FIG. 28 is a front view of a curvature adjustment unit according to further another embodiment.
Figure 29:
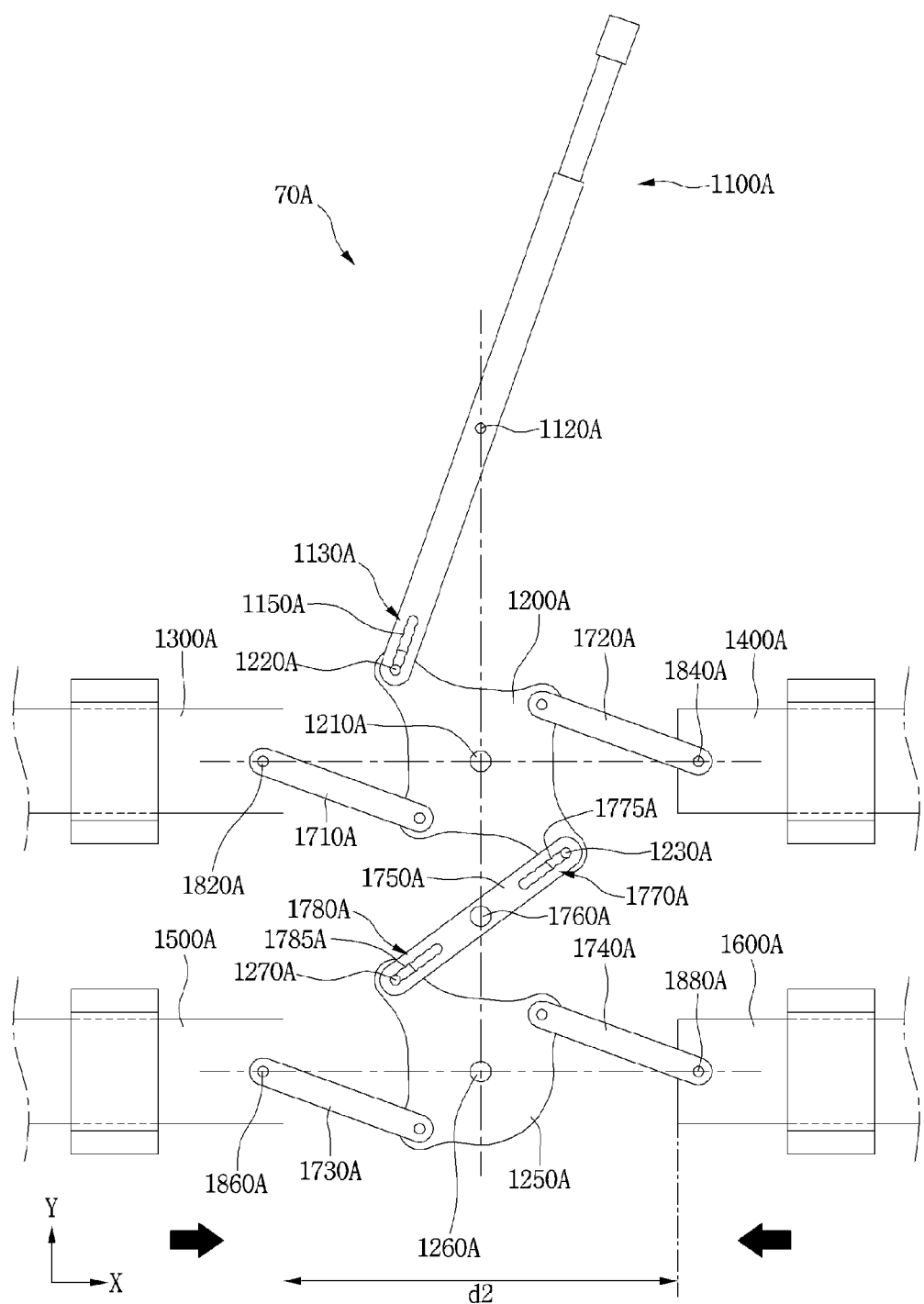
FIG. 29 is a view for explaining an operation of the curvature adjustment unit of FIG. 28.

FIG. 28 is a front view of a curvature adjustment unit according to further another embodiment, and FIG. 29 is a view for explaining an operation of the curvature adjustment unit of FIG. 28.

Since a curvature adjustment unit 70A according to the current embodiment is substantially similar to the curvature adjustment unit 50A according to the forgoing embodiment, the duplicated description with respect to the same constitution will be omitted, and thus different points therebetween will be mainly described.

Referring to FIG. 28, the curvature adjustment unit 70A includes a curvature adjustment lever 1100A, a plurality of rotation cranks 1200A and 1250A, a pair of wings 1300A, 1400A, 1500A, and 1600A, a pair of link members 1710A, 1720A, 1730A, 1740A, and 1750A, and a pair of wing guides 1910A, 1920A, 1930A, and 1940A.

The curvature adjustment lever 1100A includes a lever body 1110A, a lever pivot pin 1120A, a rotation guide slot 1130A, a sliding lever 1140A, and a stopper 1150A.

Since the lever body 1110A, the lever pivot pin 1120A, the rotation guide slot 1130A, the sliding lever 1140A, and the stopper 1150A are similar to those according to the foregoing embodiment, their detailed described will be omitted below.

The plurality of rotation cranks 1200A and 1250A include a first rotation crank 1200A and a second rotation crank 1250A.

The first rotation crank 1200A is link-connected to the curvature adjustment lever 1100A and the second rotation crank 1250A. The first rotation crank 1200A is mounted on a rear surface (see reference numeral 25A of FIG. 19) of a back cover (see reference numeral 20A of FIG. 19) so that the first rotation crank 1200A is rotatable in a direction opposite to the rotation direction of the curvature adjustment lever 1100A when the curvature adjustment lever 1100A rotates. The first rotation crank 1200A includes a crank pivot pin 1210A and a plurality of crank link pins 1220A and 1230A.

Since the crank pivot pin 1210A is similar to that according to the foregoing embodiment, its detailed description will be omitted below.

The plurality of crank link pins 1220A and 1230A include a first crank link pin 1220A and a second crank link pin 1230A.

The first crank link pin 1220A protrudes from the first rotation crank 1200A and then is inserted into the rotation guide slot 1130A. The first crank link pin 1220A is slid along the rotation guide slot 1130A as the first rotation crank 1200A rotates.

The second crank link pin 1230A protrudes from the first rotation crank 1200A to face the first crank link pin 1220A with respect to the crank pivot pin 1210A. The second crank link pin 1230A is slidably link-coupled to a fifth link member 1750A that will be described later.

The second rotation crank 1250A is link-connected to the first rotation crank 1200A through the fifth link member 1750A. When the first rotation crank 1200A rotates, the second rotation crank 1250A is mounted on the rear surface (see reference numeral 25A of FIG. 19) of the back cover (see reference numeral 20A of FIG. 19). The second rotation crank 1250A includes a crank pivot pin 1260A and a crank link pin 1270A.

The crank pivot pin 1260A passes through the second rotation crank 1250A and then is fixed to the rear surface 25A of the back cover 20A. The crank pivot pin 1260A functions as a rotation shaft of the second rotation crank 1250A when the second rotation crank 1250A rotates. That is, the second rotation crank 1250A may rotate about the crank pivot pin 1260A.

The crank link pin 1270A protrudes from the second rotation crank 1250A and is slidably link-coupled to the fifth link member 1750A. Thus, the second rotation crank 1250A may be link-connected to the first rotation crank 1200A.

The plurality of wings 1300A, 1400A, 1500A, and 1600A include a first wing 1300A, a second wing 1400A, a third wing 1500A, and a fourth wing 1600A.

The first wing 1300A is disposed in a left direction (a −X-axis direction) of the first rotation crank 1200A. One end of the first wing 1300A is link-coupled to the first rotation crank 1200A, and the other end of the first wing 1300A is fixed to a bracket (see reference numeral 30A of FIG. 19) disposed in the left direction (the −X-axis direction) of the back cover (see reference numeral 20A of FIG. 19).

The second wing 1400A is disposed in a right direction (a +X-axis direction) of the first rotation crank 1200A. One end of the second wing 1400A is link-coupled to the first rotation crank 1200A, and the other end of the first wing 1400A is fixed to the bracket (see reference numeral 30A of FIG. 19) disposed in the right direction (the +X-axis direction) of the back cover (see reference numeral 20A of FIG. 19).

The third wing 1500A is disposed in a left direction (the −X-axis direction) of the second rotation crank 1250A and spaced a predetermined distance from the first wing 1300A in the vertical direction (the Y-axis direction). One end of the third wing 1500A is link-coupled to the second rotation crank 1250A, and the other end of the third wing 1500A is fixed to the bracket (see reference numeral 30A of FIG. 19) disposed in the left direction (the −X-axis direction) of the back cover (see reference numeral 20A of FIG. 19).

The fourth wing 1600A is disposed in a right direction (the +X-axis direction) of the second rotation crank 1250A and spaced a predetermined distance from the second wing 1400A in the vertical direction (the Y-axis direction). One end of the fourth wing 1600A is link-coupled to the second rotation crank 1250A, and the other end of the fourth wing 1600A is fixed to the bracket (see reference numeral 30A of FIG. 19) disposed in the left direction (the −X-axis direction) of the back cover (see reference numeral 20A of FIG. 19).

The plurality of link members 1710A, 1720A, 1730A, and 1740A include a first link member 1710A, a second link member 1720A, a third link member 1730A, and a fourth link member 1750A.

The first link member 1710A link-couples the first rotation crank 1200A to the first wing 1300A. Particularly, the first link member 1710A is link-coupled to the first rotation crank 1200A through a link pin 1810A and link-coupled to the first wing 1300A through a link pin 1820A.

The second link member 1720A link-couples the first rotation crank 1200A to the second wing 1400A. Particularly, the second link member 1720A is link-coupled to the first rotation crank 1200A through a link pin 1830A and link-coupled to the second wing 1400A through a link pin 1840A.

The third link member 1730A link-couples the second rotation crank 1250A to the third wing 1500A. Particularly, the third link member 1730A is link-coupled to the second rotation crank 1250A through a link pin 1850A and link-coupled to the third wing 1500A through a link pin 1860A.

The fourth link member 1740A link-couples the second rotation crank 1250A to the fourth wing 1600A. Particularly, the fourth link member 1740A is link-coupled to the second rotation crank 1250A through a link pin 1870A and link-coupled to the fourth wing 1600A through a link pin 1880A.

The fifth link member 1750A link-couples the first rotation crank 1200A to the second rotation crank 1250A. The fifth link member 1750A includes a pivot pin 1760A and a plurality of rotation guide slots 1770A and 1780A.

The pivot pin 1760A passes through the fifth link member 1750A and then is fixed to the rear surface (see reference numeral 25A of FIG. 19) of the back cover (see reference numeral 20A of FIG. 19). The pivot pin 1760A functions as a rotation shaft of the fifth link member 1750A when the fifth link member 1750A rotates. That is, the fifth link member 1750A may rotate about the pivot pin 1760A.

The plurality of rotation guide slots 1770A and 1780A include a first rotation guide slot 1770A and a second guide slot 1780A.

The first rotation guide slot 1770A is disposed on one end of the fifth link member 1750A along a longitudinal direction of the fifth link member 1750A. The second crank pin 1230A of the first rotation crank 1200A is inserted into the first rotation guide slot 1770A.

A stopper 1775A for restricting the sliding of the second crank link pin 1230A when the second crank link pin 1230A rotates is disposed on an inner wall of the first rotation guide slot 1770A. Since the stopper 1775A is similar to the stopper 1150A disposed on the rotation guide slot 1130A of the curvature adjustment lever 1100A, its detailed description will be omitted.

The second rotation guide slot 1780A is disposed on the other end of the fifth link member 1750A along the longitudinal direction of the fifth link member 1750A. The second crank pin 1270A of the second rotation crank 1250A is inserted into the second rotation guide slot 1780A.

A stopper 1785A for restricting the sliding of the crank link pin 1270A when the crank link pin 1270A rotates is disposed on an inner wall of the second rotation guide slot 1780A.

Since the stopper 1775A is similar to the stopper 1775A disposed on the first rotation guide slot 1770A, its detailed description will be omitted.

The plurality of wing guides 1910A, 1920A, 1930A, and 1940A include a first wing guide 1910A, a second wing guide 1920A, a third wing guide 1930A, and a fourth wing guide 1940A.

The first wing guide 1910A surrounds a portion of the whole of the first wing 1300A. In the current embodiment, the first wing guide 1910A surrounds a portion of the whole of the first wing 1300A.

The second wing guide 1920A surrounds a portion of the whole of the second wing 1400A. In the current embodiment, the second wing guide 1920A surrounds a portion of the whole of the second wing 1400A.

The third wing guide 1930A surrounds a portion of the whole of the third wing 1500A. In the current embodiment, the third wing guide 1930A surrounds a portion of the whole of the third wing 1500A.

The fourth wing guide 1940A surrounds a portion of the whole of the fourth wing 1600A. In the current embodiment, the fourth wing guide 1940A surrounds a portion of the whole of the fourth wing 1600A.

Hereinafter, an operation of the curvature adjustment unit 70A according to the current embodiment will be described.

Referring to FIG. 29, when the curvature is adjusted to convert the curved display into the flat panel display, the user rotates the curvature adjustment lever 1100A in one direction. In the current embodiment, a case in which the curvature adjustment lever 1100A rotates in a clockwise direction will be described as an example.

The curvature adjustment lever 1100A rotates in the clockwise direction by using the lever pivot pin 1120A as a rotation shaft by the user's manipulation. As the curvature adjustment lever 1100A rotates, the first rotation crank 1200A rotates in a direction opposite to the rotation direction of the curvature adjustment lever 1100A, i.e., a counterclockwise direction, by using the crank pivot pin 1210A as a rotation shaft.

Thus, the first crank link pin 1220A of the first rotation crank 1200A is slid from an upper end of the rotation guide slot 1130A to a lower end of the rotation guide slot 1130A. Here, the stopper 1150A of the rotation guide slot 1130A may operate as the same manner as the foregoing embodiment.

As the first rotation crank 1200A rotates, the first link member 1710A rotates in the clockwise direction by using the link pin 1820A coupled to the first wing 1300A as a rotation shaft. Thus, the first wing 1300A is slid toward the first rotation crank 1200A.

As the first rotation crank 1200A rotates, the second link member 1720A rotates in the clockwise direction by using the link pin 1840A coupled to the second wing 1400A as a rotation shaft. Thus, the second wing 1400A is slid toward the first rotation crank 1200A.

As the first rotation crank 1200A rotates, the fifth link member 1750A rotates in the clockwise direction by using the pivot pin 1760A as a rotation shaft. Here, the second crank pin 1230A of the first rotation crank 1200A is slid from a lower end of the first rotation guide slot 1770A to an upper end of the first rotation guide slot 1770A. When the second crank pin 1230 is slid, the stopper 1775A of the first rotation guide slot 1770A may perform the same function as the stopper 1150A according to the foregoing embodiment.

As the fifth link member 1750A rotates, the second rotation crank 1250A rotates in a direction opposite to the rotation direction of the fifth link member 1750A by using the crank pivot pin 1260 as a rotation shaft, i.e., in a counterclockwise direction. Here, the crank pin 1270A of the second rotation crank 1250A is slid from an upper end of the second rotation guide slot 1780A of the fifth link member 1750A to a lower end of the second rotation guide slot 1780A. When the crank pin 1270 is slid, the stopper 1775A of the second rotation guide slot 1780A may perform the same function as the above-described stopper 1775A.

As the second rotation crank 1250A rotates, the third link member 1730A rotates in the clockwise direction by using the link pin 1860A coupled to the third wing 1500A as a rotation shaft. Thus, the third wing 1500A is slid toward the second rotation crank 1250A.

As the second rotation crank 1250A rotates, the fourth link member 1740A rotates in the clockwise direction by using the link pin 1880A coupled to the fourth wing 1600A as a rotation shaft. Thus, the fourth wing 1600A is slid toward the second rotation crank 1250A.

Thus, a distance d2 between the first wing 1300A and the second wing 1400A is less than that d1 between the first wing 1300A and the second wing 1400A in FIG. 28. The distance d2 between the third wing 1500A and the fourth wing 1600A may also be less than that d1 between the third wing 1500A and the fourth wing 1600A in FIG. 28.

As a result, as the first and second rotation cranks 1200A and 1250A rotate, the first to fourth wings 1300A, 1400A, 1500A, and 1600A may pulled in the direction of the first and second rotation cranks 1200A and 1250A.

On the other hand, when it is intended to convert the flat panel display to the curved display, the user may rotate the curvature adjustment lever 70A in a direction opposite to the clockwise direction, i.e., in the counterclockwise direction.

In the current embodiment, since the back cover (see reference numeral 20A of FIG. 19) is pulled or pushed through the sliding of the third and fourth wings 1500A and 1600A each of which is spaced a predetermined distance from each of the first and second wings 1300A and 1400A in the vertical direction (the Y-axis direction) together with the sliding of the first and second wings 1300A and 1400A, it may prevent a variation in curvature at the upper and lower portions of the back cover (see reference numeral 20A of FIG. 19) from being different from each other when the curvature of the back cover (see reference numeral 20A of FIG. 19) is adjusted.

Figure 30:
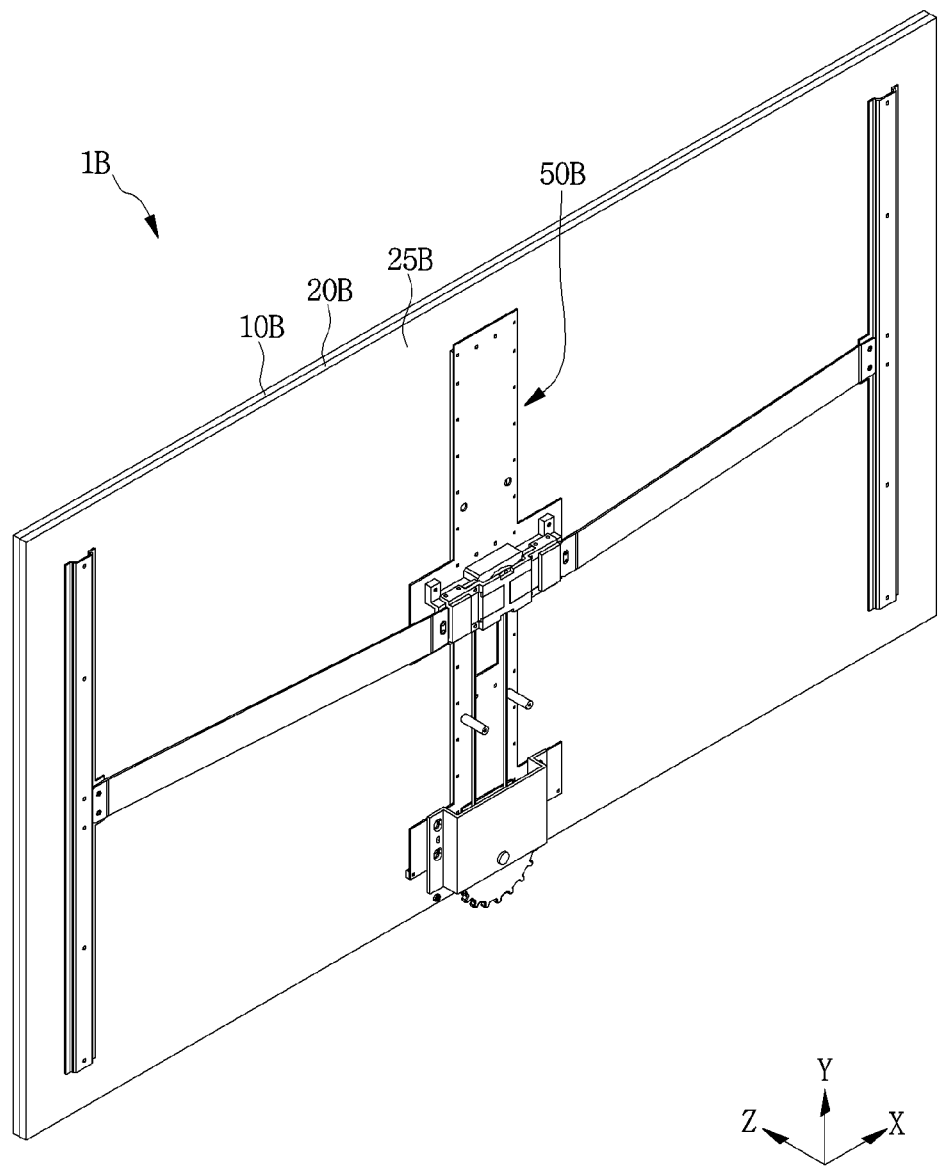
FIG. 30 is a rear perspective view of a display apparatus according to further another embodiment.
Figure 31:
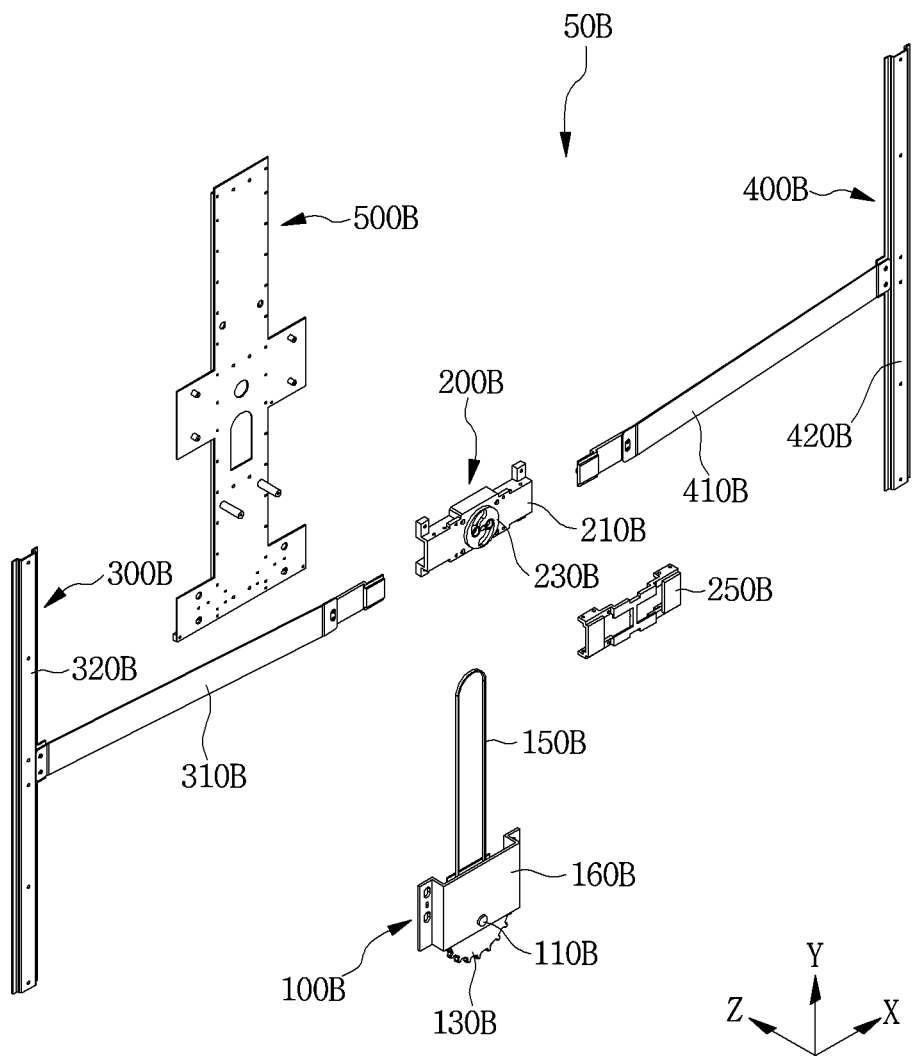
FIG. 31 is an exploded perspective view illustrating a curvature adjustment unit of the display apparatus of FIG. 30.

FIG. 30 is a rear perspective view of a display apparatus according to further another embodiment, and FIG. 31 is an exploded perspective view illustrating a curvature adjustment unit of the display apparatus of FIG. 30.

Since a display apparatus 1B according to the current embodiment is substantially similar to the display apparatus according to the forgoing embodiment, different points therebetween will be mainly described.

Referring to FIGS. 30 and 31, the display apparatus 1B includes a display panel 10B, a back cover 20B, and a curvature adjustment unit 50B.

Since the display panel 10B and the back cover 20B are the same as those according to the foregoing embodiment, their duplicated descriptions will be omitted below.

The curvature adjustment unit 50B is mounted on a rear surface 25B of the back cover 20B and includes a dial part 100B, a cam part 200B, a pair of wings 300B and 400B, and a mounting bracket 500B.

The dial part 100B may be a component for user's manual manipulation and include a manipulation dial 110B, a pulley 130B, a belt 150B, and a dial casing 160B.

The manipulation dial 110B may be provided as a dial that is rotatable by user's manipulation for adjusting a curvature of the display panel 10B. The manipulation dial 110B is coupled and mounted on the pulley 130B that will be described later and exposed to the outside of the dial casing 160B to allow a user to manipulate the manipulation dial 110B.

The pulley 130B is connected to the manipulation dial 110B and the belt 150B that will be described later. The pulley 130B rotates by the rotation of the manipulation dial 110B. As the pulley 130B rotates, the belt 150B connected to the pulley 150B may also rotate.

The belt 150B is connected to the pulley 130B and the cam 230B of the cam part 200B that will be described later. When the belt 150B rotates, the belt 150B is connected to the cam 230B so that the cam 230B also rotates.

The dial casing 160B covers a portion of the pulley 130B and is mounted on the mounting bracket 500B that will be described later. The dial casing 160B may function as a general cover.

The cam part 200B connects the dial part 100B to the pair of wings 300B and 400B. The cam part 200B includes a cam casing 210B and a cam 230B.

The cam 230B is mounted on the cam casing 210B, and a sliding guide part for sliding of the pair of wings 300B and 400B is disposed on the cam casing 210B. The cam casing 210B is fixed to the mounting bracket 500B.

The cam 230B is rotatably mounted on the cam casing 210B and connected to the belt 150B. A first wing sliding hole 230B into which a first wing 300B is inserted and a second sliding hole 236B into which a second wing 400 is inserted are defined in the cam 230B.

Each of the pair of wings 300B and 400B may be formed of a flexible material. When the cam 230B rotates, the pair of wings 300 and 400 may be slid closer to or away from each other. The pair of wings 300B and 400B include the first wing 300B and the second wing 400B.

The first wing 300B is disposed in a left direction of the cam part 200B. The first wing 300B includes a connection part 310B and a fixing part 320B.

The connection part 310B has a long bar shape. The connection part 310B is slidably mounted on the cam part 200B in a state where the connection part 310B is spaced a predetermined distance from a rear surface 25B of the back cover 20B. The connection part 310B has one end connected to the cam 230B of the cam part 200B and the other end fixed to the fixing part 320B. Here, a wing boss 312B inserted into the first wing sliding hole 233B of the cam 230B is disposed on the one end of the connection part 310B.

The fixing part 320B is fixed to the rear surface 25B of the back cover 20B. Also, the fixing part 320B may be designed in consideration of a sliding distance of the connection part 310B or a height of the cam part 200B. The fixing part 320B may be integrated with the connection part 310B according to its design.

Thus, the first wing 300B may be push the rear surface 25 of the back cover 20 in a front direction (a +Z-axis direction) or pull the rear source 25 in a rear direction (a −Z-axis direction) as the connection part 310B is slid.

The second wing 400B is disposed in a right direction of the cam part 200B. The second wing 300B includes a connection part 410B and a fixing part 420B, like the first wing 300B.

The connection part 410B has a long bar shape. The connection part 410*b* is slidably mounted on the cam part 200B in a state where the connection part 410B is spaced a predetermined distance from a rear surface 25B of the back cover 20B. The connection part 410B has one end connected to the cam 230B of the cam part 200B and the other end fixed to the fixing part 420B. Here, a wing boss 412B inserted into the first wing sliding hole 236B of the cam 230B is disposed on the one end of the connection part 410B.

The fixing part 420B is fixed to the rear surface 25B of the back cover 20B. Also, the fixing part 420B may be designed in consideration of a sliding distance of the connection part 410B or a height of the cam part 200B. The fixing part 420B may be integrated with the connection part 410B according to its design.

Thus, the second wing 400B may be push the rear surface 25 of the back cover 20 in a front direction (a +Z-axis direction) or pull the rear source 25 in a rear direction (a −Z-axis direction) as the connection part 410B is slid.

The dial part 100B and the cam part 200B are mounted on the mounting bracket 500B. The mounting bracket 500B is fixedly mounted on the rear surface 25B of the back cover 20B. Also, the mounting bracket 500B may have various configurations or shapes according to its design.

Hereinafter, a process for adjusting a curvature of the display apparatus 1 B according to the current embodiment will be described in detail with reference to an operation of the curvature adjustment unit 50B.

FIGS. 32 to 37 are views for explaining an operation of the curvature adjustment unit of FIG. 31.

Figure 32:
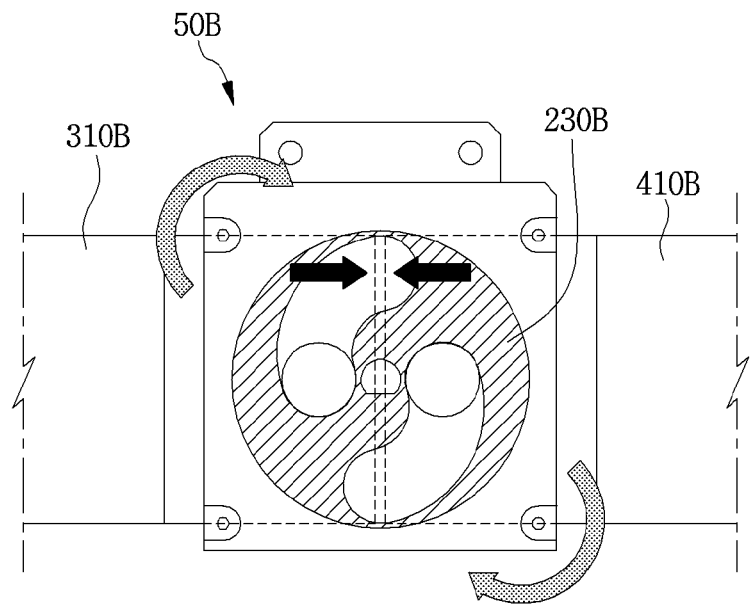
FIGS. 32 to 37 are views for explaining an operation of the curvature adjustment unit of FIG. 31.
Figure 37:
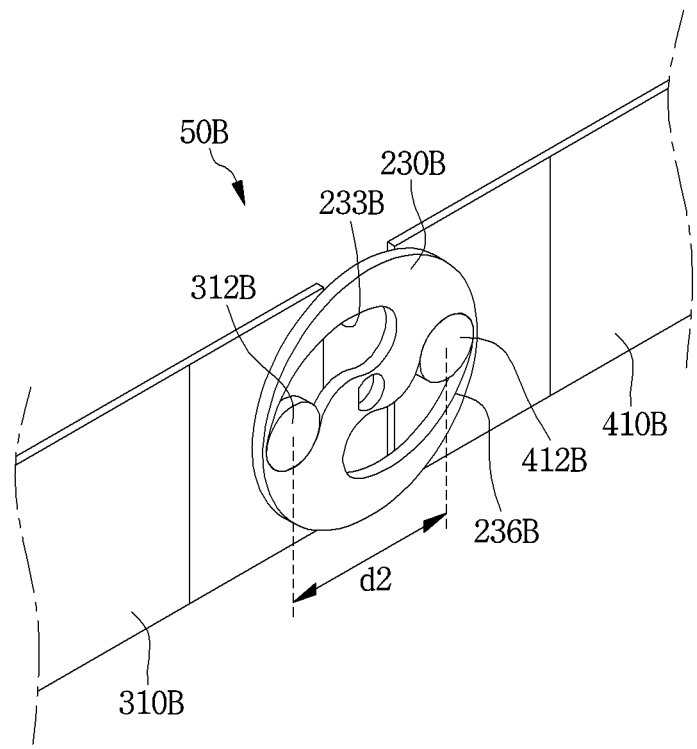

In FIGS. 32 and 37, for convenience of description, portions of the components will be simplified or omitted.

Figure 33:
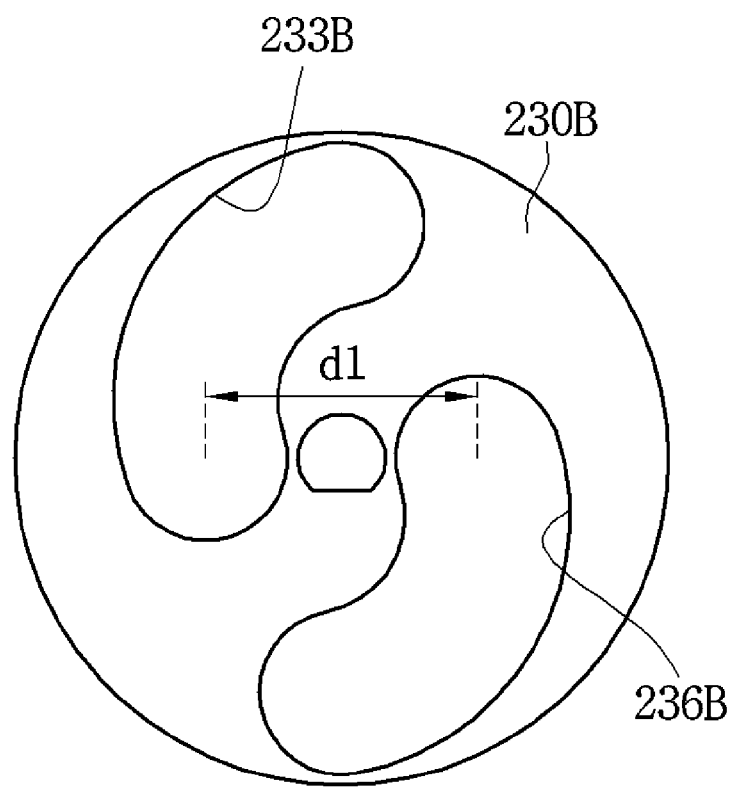
Figure 34:
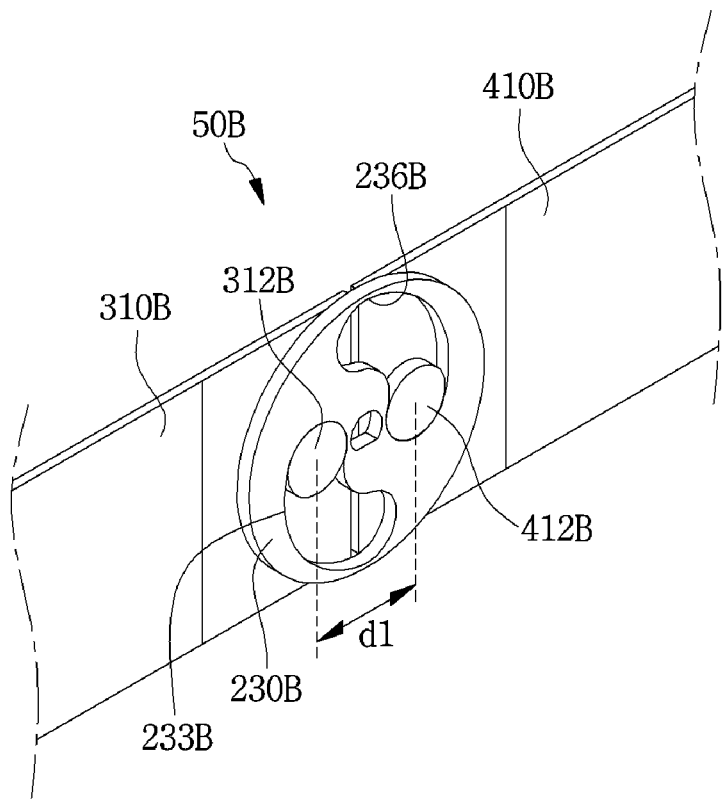

Referring to FIGS. 32 to 34, when a flat panel display is realized, the curvature adjustment unit 50B may rotate in one direction, i.e., in the clockwise direction in the current embodiment to pull the connection part 310*b* of the first wing (see reference numeral 300B of FIG. 31) and the connection part 410B of the second wing (see reference numeral 400B of FIG. 31), thereby realizing the flat panel display.

Here, the wing boss 312B of the connection part 310B of the first wing 300 is inserted into the first wing sliding hole 233B, and the wing boss 412B of the connection part 410B of the second wing 400 is inserted into the second wing sliding hole 236B.

Explaining a specific driving mechanism, when the flat panel display is realized, the user rotates the manipulation dial (see reference numeral 110B of FIG. 31) of the curvature adjustment unit 50B in one direction, i.e., in the clockwise direction.

As the manipulation dial 110B rotates, the pulley 130B and the belt 150B may also rotate in the clockwise direction. Thus, the cam 230B may also rotate in the clockwise direction. Here, a decelerator may be disposed on the cam part 200B to control a rotation rate of the cam part 200B.

As the cam 230B rotates in the clockwise direction, the connection part 310B of the first wing 300B and the connection part 410B of the second wing 400B may be pulled with respect to each other to convert the back cover 20B into the flat state, thereby realizing the flat panel display of the display apparatus.

When the flat panel display is realized, a distance d1 spaced between the wing boss 312B of the connection part 310*b* of the first wing 300B and the wing boss 412B of the connection part 410B of the second wing 400B may be the lowest value.

The curvature due to the rotation of the manipulation dial 110B may vary according to its design. In the current embodiment, the manipulation dial 110B may be designed to realize a curvature of about 5000R at about 7.5 revolutions (about strokes of 10 times). However, this is merely an example. For example, the manipulation dial may be variously designed in consideration of a relationship between the rotation and curvature thereof. Also, the rotation number may also vary by changing torque of the manipulation dial.

Figure 35:
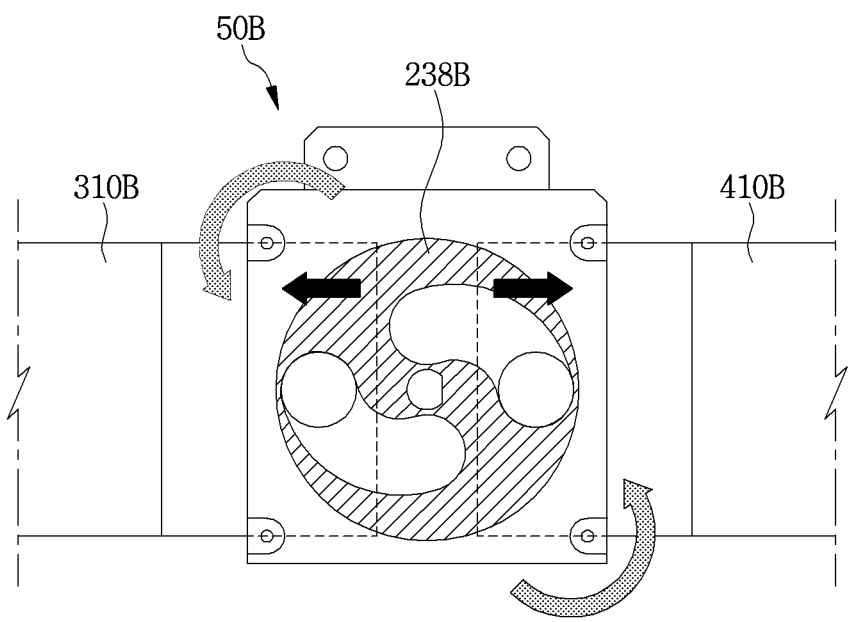
Figure 36:
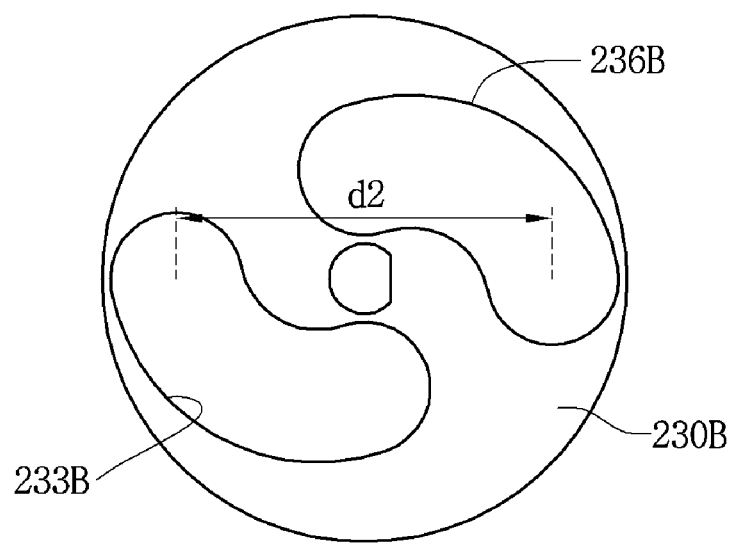

Referring to FIGS. 35 to 37, when the curved display is realized, the user rotates the manipulation dial (see reference numeral 110B of FIG. 31) of the curvature adjustment unit 50B in one direction, i.e., in the counterclockwise direction.

As the manipulation dial 110B rotates, the pulley 130B and the belt 150B may also rotate in the counterclockwise direction. Thus, the cam 230B may also rotate in the counterclockwise direction.

As the cam 230B rotates in the counterclockwise direction, the connection part 310B of the first wing 300B and the connection part 410B of the second wing 400B may be pushed in opposite directions with respect to each other to convert the back cover 20B into the flat state, thereby realizing the flat panel display of the display apparatus.

When the curved display is realized, a distance d1 spaced between the wing boss 312B of the connection part 310*b* of the first wing 300B and the wing boss 412B of the connection part 410B of the second wing 400B may be the highest value.

As described above, in the display apparatus 1B according to the current embodiment, the display apparatus 1B may be converted into the flat panel display or the curved display through the user's manual manipulation such as the dial manipulation manner.

Figure 38:
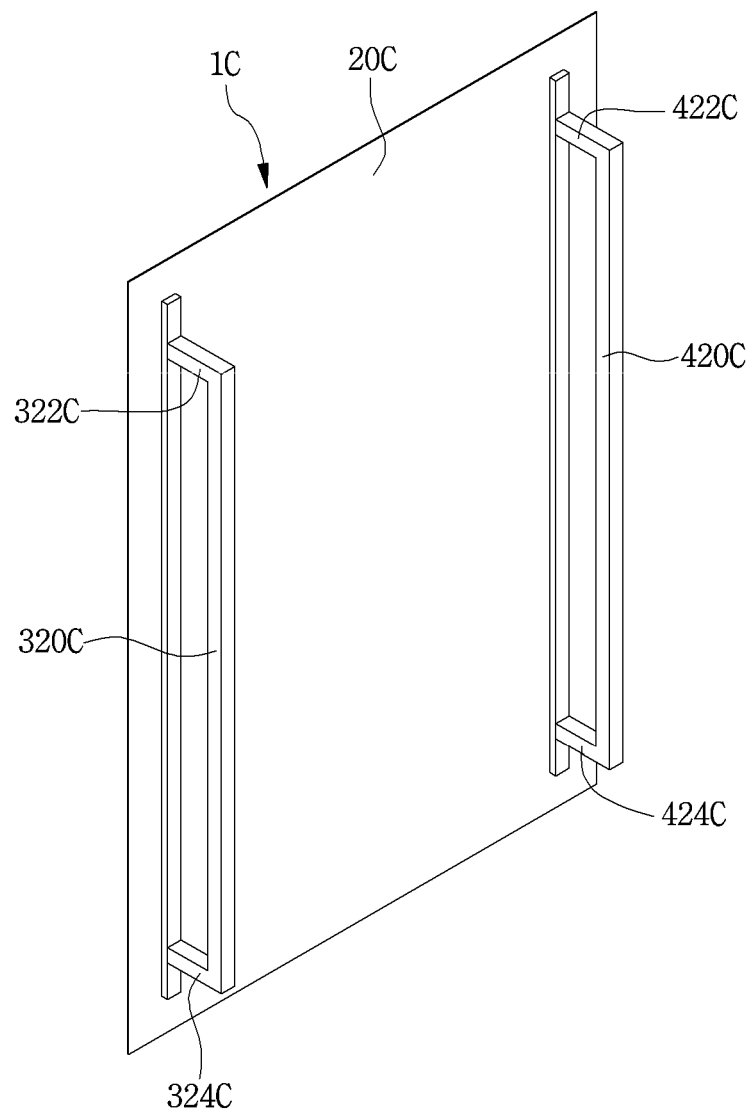
FIGS. 38 and 39 are views for explaining a display apparatus according to further another embodiment.
Figure 39:
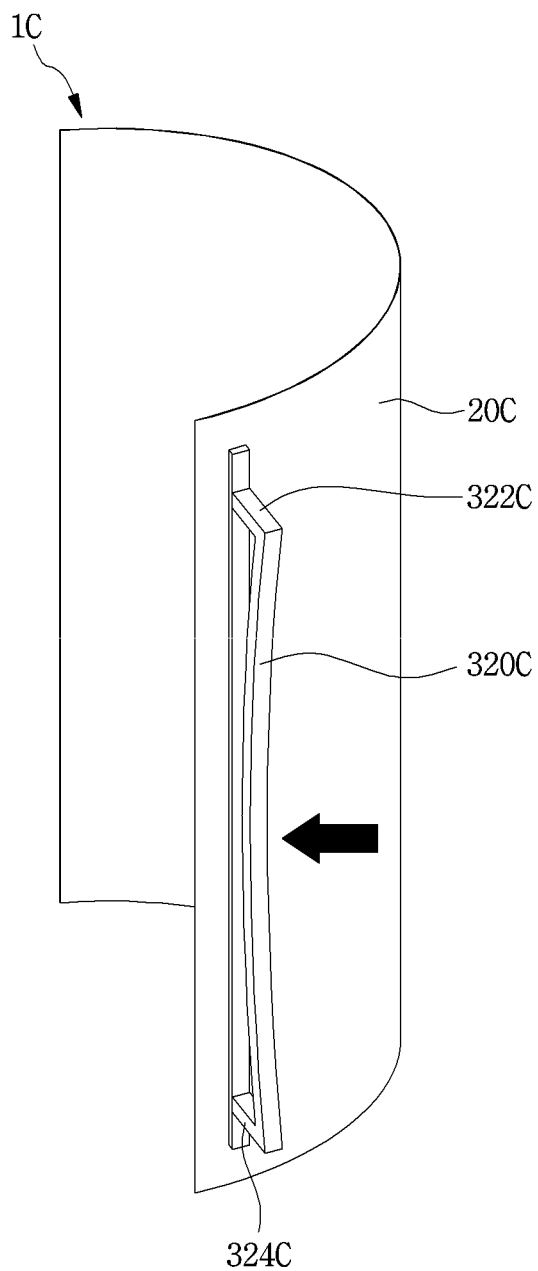

FIGS. 38 and 39 are views for explaining a display apparatus according to further another embodiment.

Since a display apparatus 1C according to the current embodiment is substantially similar to the display apparatus according to the forgoing embodiment, different points therebetween will be mainly described. In the current embodiment, for convenience of description, portions of the components will be simplified or omitted.

Referring to FIG. 38, the display apparatus 1C includes a first wing bar 320C and a second wing bar 420C.

The first wing bar 230C includes an upper end support 322C and a lower end support 324C to support two points of a rear surface of the back cover 20C.

The upper end support 322C is disposed on one end of the first wing bar 320C and fixed to the rear surface of the back cover 20C. The lower end support 324C is disposed on the other end of the first wing bar 320C and fixed to the rear surface of the back cover 20C.

Like the first wing bar 320C, the second wing bar 420C includes an upper end support 422C and a lower end support 424C to support two points of the rear surface of the back cover 20C.

The upper end support 422C is disposed on one end of the second wing bar 420C and fixed to the rear surface of the back cover 20C. The lower end support 424C is disposed on the other end of the second wing bar 420C and fixed to the rear surface of the back cover 20C.

Referring to FIG. 39, when the curved display is realized, each of the first wing bar 320C and the second wing bar 420C support the two upper and lower points of the rear surface of the back cover 20C to prevent a warpage phenomenon that occurs at both edges of the back cover 20C from occurring.

Figure 40:
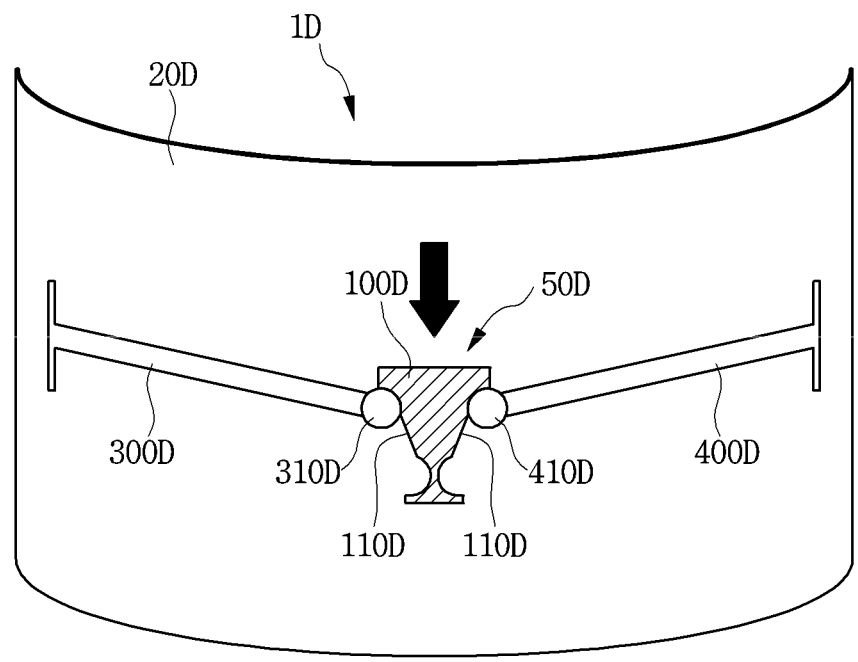
FIGS. 40 and 41 are views for explaining a display apparatus according to further another embodiment.
Figure 41:
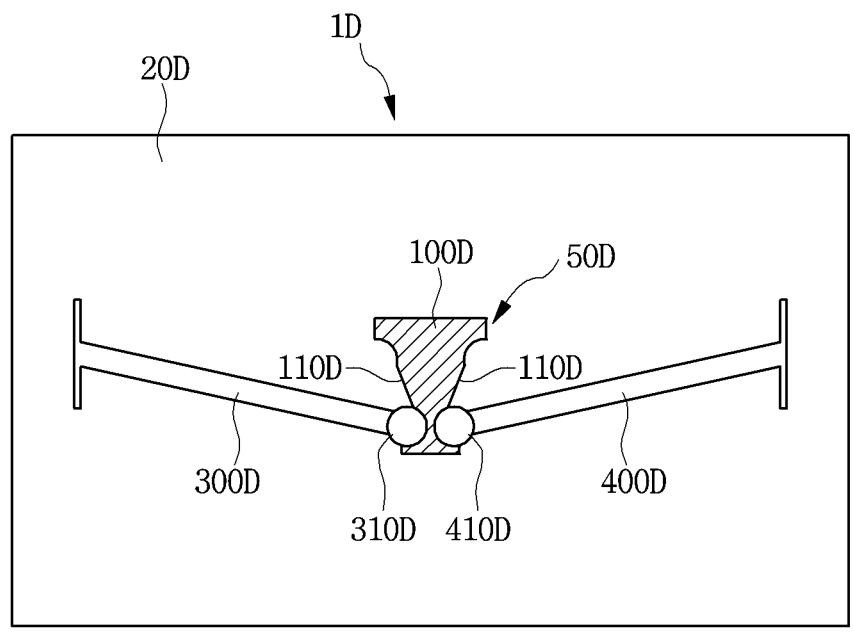

FIGS. 40 and 41 are views for explaining a display apparatus according to further another embodiment.

Since a display apparatus 1D according to the current embodiment is substantially similar to the display apparatus according to the forgoing embodiment, different points therebetween will be mainly described. In the current embodiment, for convenience of description, portions of the components will be simplified or omitted.

Referring to FIG. 40, the display apparatus 1D includes a curvature adjustment unit 50D mounted on a rear surface of a back cover 20D.

The curvature adjustment unit 50D includes a user manipulation wedge 100D and a pair of wings 300D and 400D.

The user manipulation wedge 100D has an approximately inverted triangular shape. The user manipulation wedge 100D may be directly coupled to the rear surface of the back cover 20C or a stand of the display apparatus 1D or fixed to the rear surface of the back cover 20C or the stand of the display apparatus 1D through a separate coupling unit.

Here, the user manipulation wedge 100D may be mounted to be slid downward by user's downward pressing or mounted to be slid upward by user's upward pressing.

An inclination surface 110D may be disposed on each of both side surfaces of the user manipulation wedge 100D. A first wing 300D and a second wing 400D, which will be described later, are connected to contact the inclination surface 110D.

A pair of wings 300D and 400D include the first wing 300D and the second wing 400D.

The first wing 300D is disposed at a left side of the user manipulation wedge 100D. A sliding bearing 310D slidably connected to contact one end of the first wing 300D along the inclination surface 110D of the user manipulation wedge 100D. Also, the other end of the first wing 300D is fixed to the rear surface of the back cover 20D.

The second wing 400D is disposed at a right side of the user manipulation wedge 100D. A sliding bearing 410D slidably connected to contact one end of the second wing 400D along the inclination surface 110D of the user manipulation wedge 100D. Also, the other end of the second wing 400D is fixed to the rear surface of the back cover 20D.

When the user manipulation wedge 100D is slid upward or downward, the first wing 300D and the second wing 400D may be slid closer to or away from each other, thereby pulling the rear surface of the back cover 20D toward a rear side of the display apparatus 1D or pushing the rear surface of the back cover 20D toward a front side of the display apparatus 1D.

Hereinafter, an operation for adjusting a curvature of the display apparatus 1D according to the current embodiment will be described.

Referring to FIG. 41, when the curved display is realized, the user presses the user manipulation wedge 100D downward. As the user presses the user manipulation wedge 100D downward, the user manipulation wedge 100D is slid downward, and the first and second wings 300D and 400D are slid in a direction in which the first and second wings 300D and 400D are away from each other.

Thus, the first and second wings 300D and 400D may push the rear surface of the back cover 20D toward the rear side of the display apparatus 1D to realize the curved display of the display apparatus 1D.

On the other hand, when the flat panel display is realized, the user presses the user manipulation wedge 100D upward. As the user presses the user manipulation wedge 100D upward, the user manipulation wedge 100D is slid upward, and the first and second wings 300D and 400D are slid in a direction in which the first and second wings 300D and 400D are closer to each other.

Thus, the first and second wings 300D and 400D may pull the rear surface of the back cover 20D toward the front side of the display apparatus 1D to realize the flat panel display of the display apparatus 1D.

As described above, in the display apparatus 1D according to the current embodiment, the variable display apparatus may be realized through the simple structure in which the display apparatus 1D operates by the user manual manipulation without using a component such as a separate motor or gear for the variable structure.

FIGS. 42 to 45 are views for explaining a display apparatus according to further another embodiment.

Since a display apparatus 1E according to the current embodiment is substantially similar to the display apparatus according to the forgoing embodiment, different points therebetween will be mainly described. In the current embodiment, for convenience of description, portions of the components will be simplified or omitted.

Figure 42:
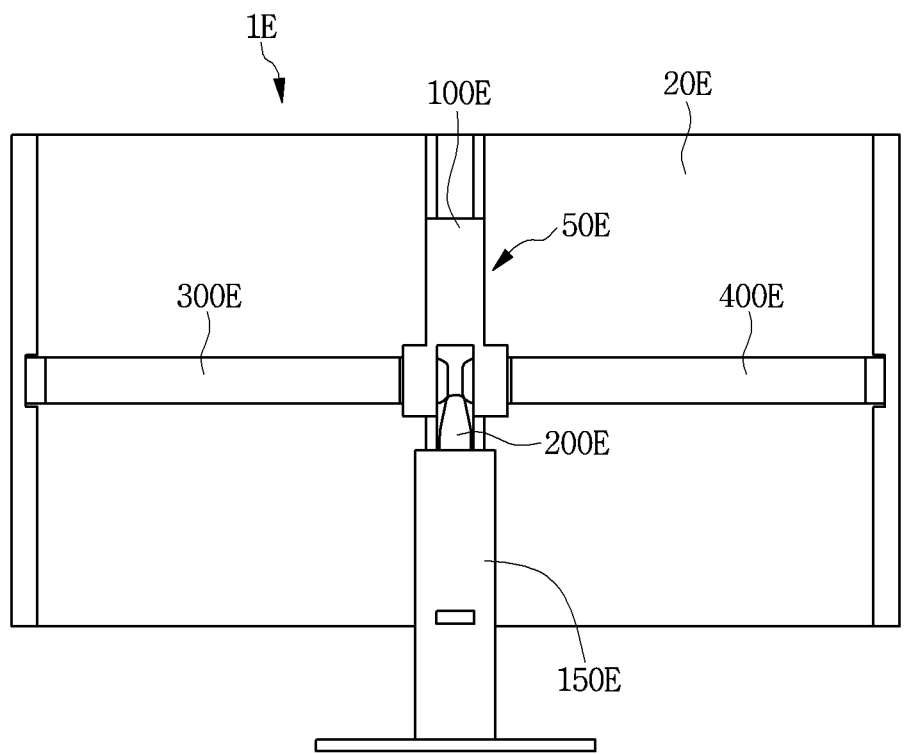
FIGS. 42 to 45 are views for explaining a display apparatus according to further another embodiment.
Figure 43:
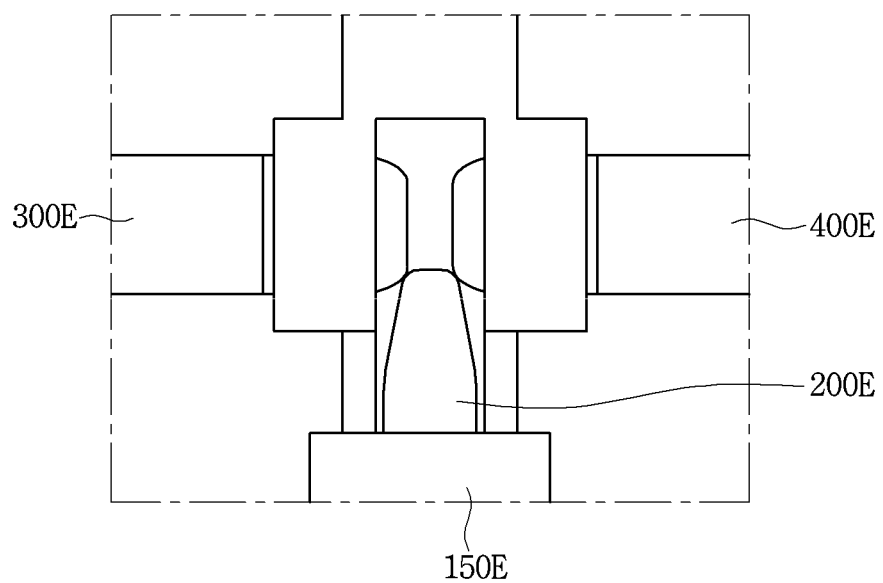

Referring to FIGS. 42 and 43, the display apparatus 1D includes a curvature adjustment unit 50E mounted on a rear surface of a back cover 20E.

The curvature adjustment unit 50E includes a user manipulation push part 100E, a push bar 200E, and a pair of wings 300E and 400E.

The user manipulation push part 100E is mounted on a rear surface of the back cover 20E and slid vertically by user's pressing. The user manipulation push part 100E may be slidably mounted so that the first and second wings 300E and 400E are closer to or away from each other.

A support 150E supports the user manipulation push part 100E. The support 150E may function as a stand of the display apparatus 1E. A push bar 200E that will be described later is mounted on the support 150E.

The push bar 200E is built in the support part 150E. The push bar 200E is disposed between the first and second wings 300E and 400E when the user manipulation push part 100E is slid downward. When the user manipulation push part 100E is slid upward, the push bar 200E is disposed under the first and second wings 300E and 400E.

A pair of wings 300D and 400D include a first wing 300D and a second wing 400D.

The first wing 300E is disposed at a left side of the user manipulation push part 100E. The first wing 300E has one end slidably mounted on the user manipulation push part 100E and the other end fixed to a back cover 20E.

The second wing 400E is disposed at a right side of the user manipulation push part 100E. The second wing 400E has one end slidably mounted on the user manipulation push part 100E and the other end fixed to the back cover 20E.

When the user manipulation push part 100E is slid upward or downward, the first wing 300E and the second wing 400E may be slid closer to or away from each other, thereby pulling a rear surface of the back cover 20E toward a rear side of the display apparatus 1E or pushing the rear surface of the back cover 20E toward a rear side of the display apparatus 1E.

Hereinafter, an operation for adjusting a curvature of the display apparatus 1F according to the current embodiment will be described.

Figure 44:
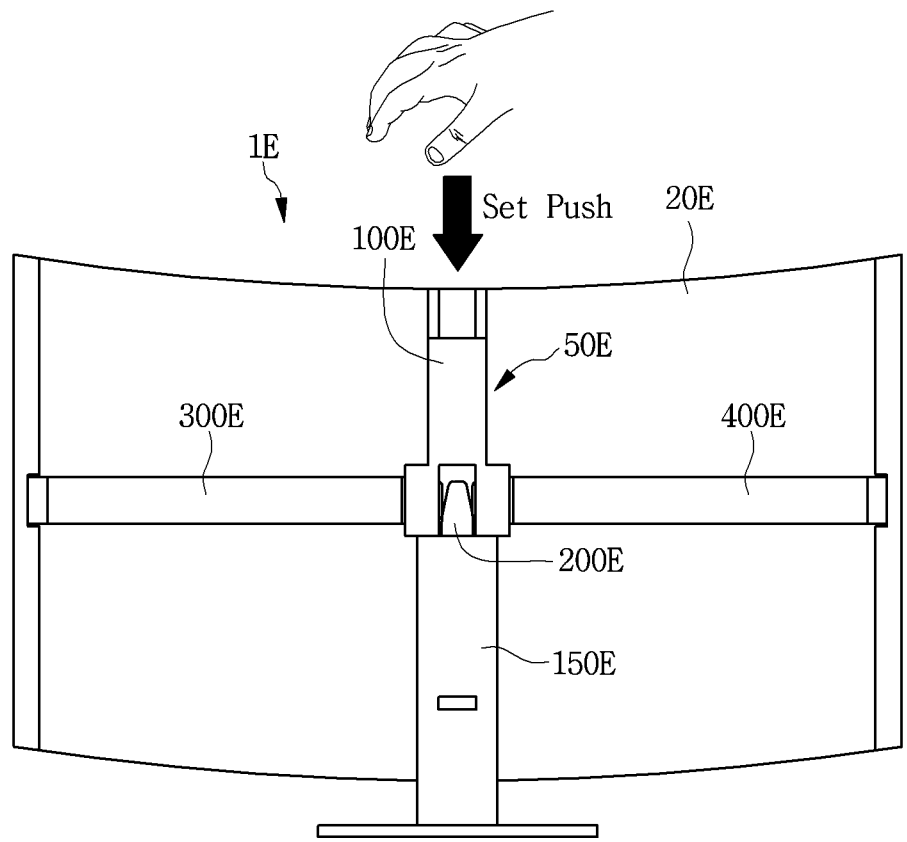
Figure 45:
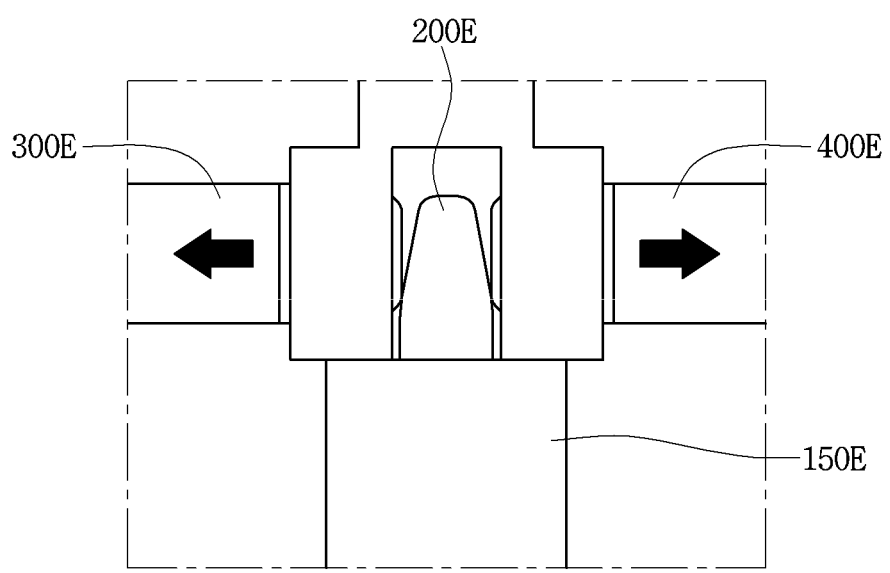

Referring to FIGS. 44 and 45, when the curved display is realized, the user presses the user manipulation push part 100E downward. As the user presses the user manipulation push part 100E downward, the user manipulation push part 100E is slid downward. The push bar 200E disposed on the support 150E may push the first and second wings 300E and 400E and then be disposed between the first and second wings 300E and the 400E.

Thus, the first and second wings 300D and 400D may be pushed by the push bar 200E and slid in a direction that is away from each other and push the rear surface of the back cover 20D toward a front side of the display apparatus 1E to realize the curved display of the display apparatus 1E.

On the other hand, when the flat panel display is realized, the user manipulates the user manipulation push part 100E so that the user manipulation push part 100E is slid upward. Here, the user manipulation push part 100E may include an elastic part for guiding the upward sliding of the user manipulation push part 100E by the user downward repressing.

When the user manipulation push part 100E is slid upward, the first and second wings 300E and 400E are slid closer to each other out of the push bar 200E. Thus, the first and second wings 300E and 400E may pull the rear surface of the back cover 20E toward the rear side of the display apparatus 1E to realize the flat panel display of the display apparatus 1E.

Figure 46:
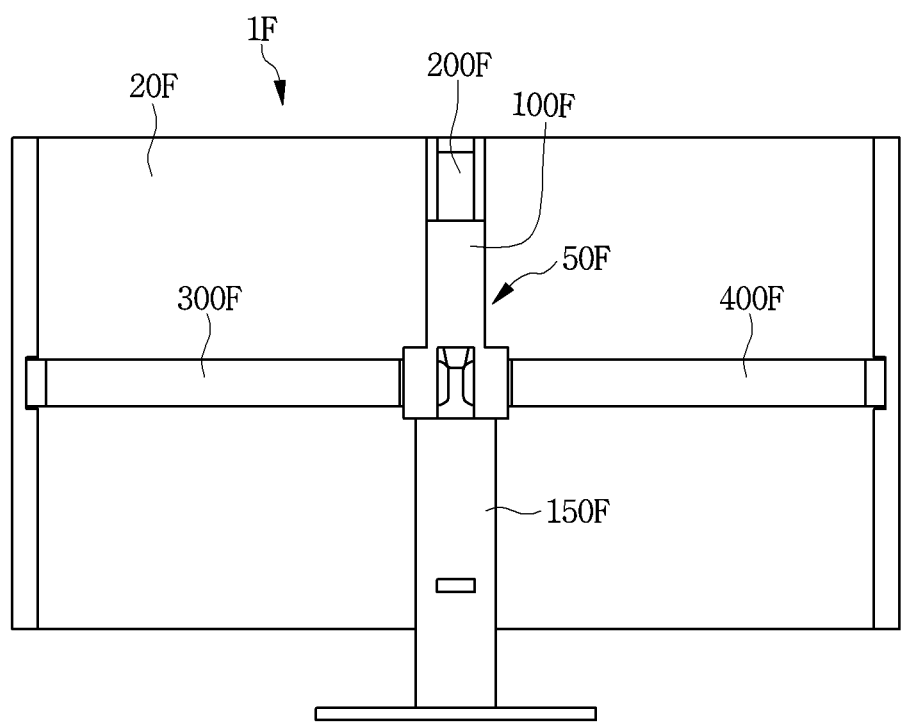
FIGS. 46 and 47 are views for explaining a display apparatus according to further another embodiment.
Figure 47:
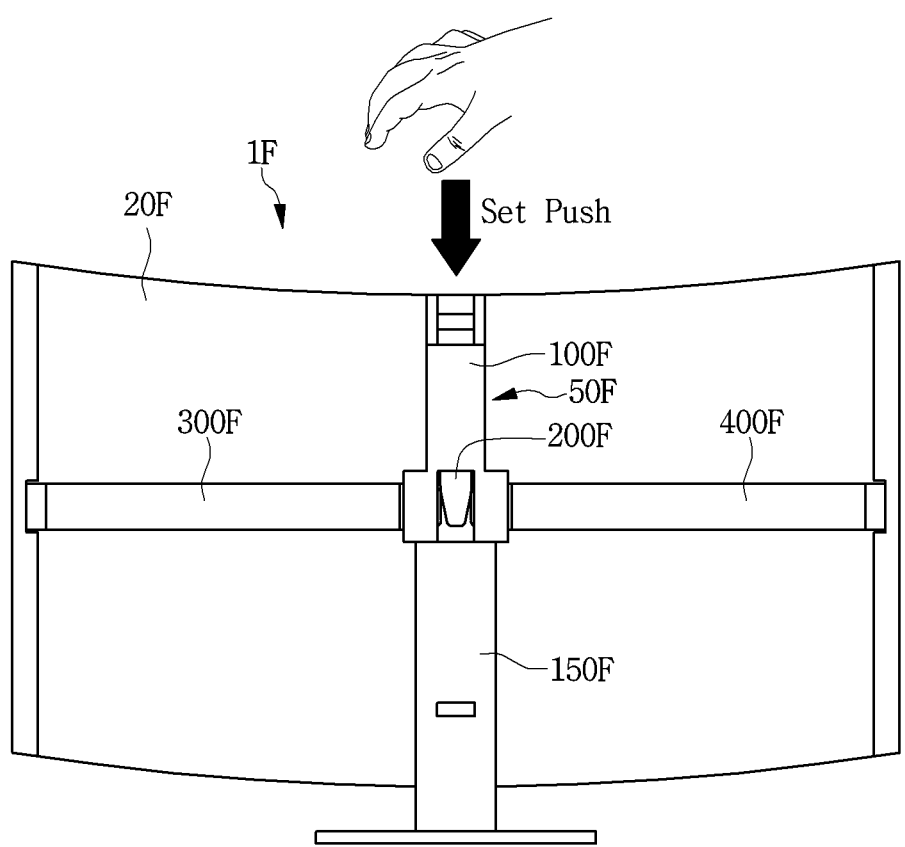
Figure 48:
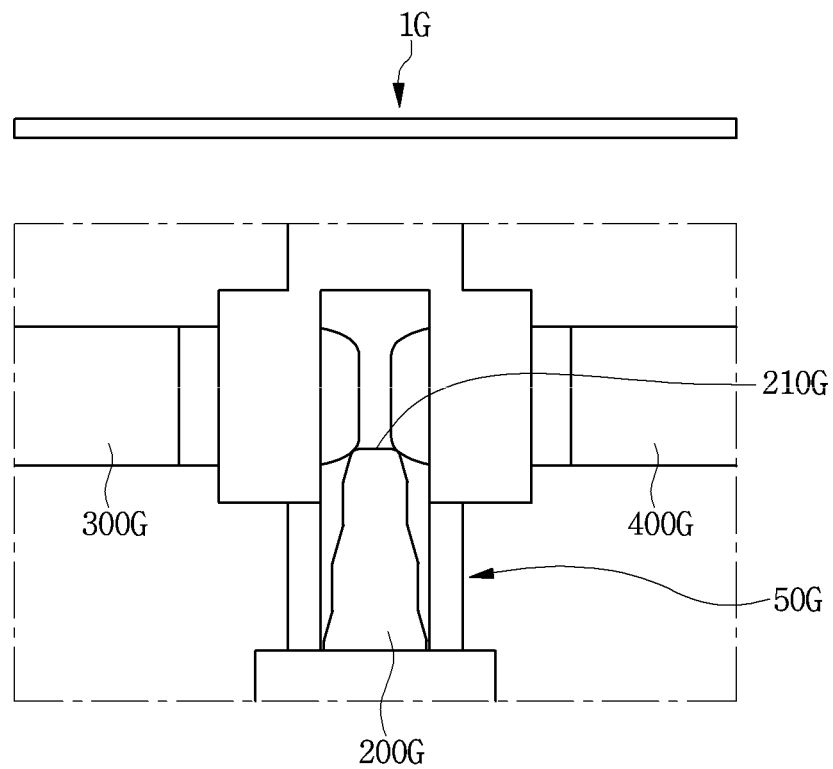
Figure 49:
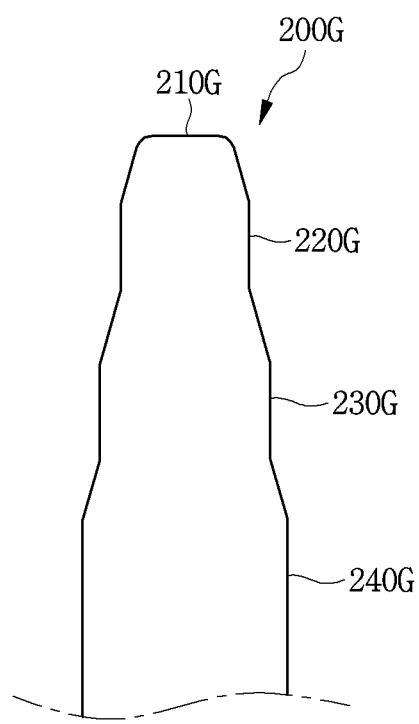
Figure 50:
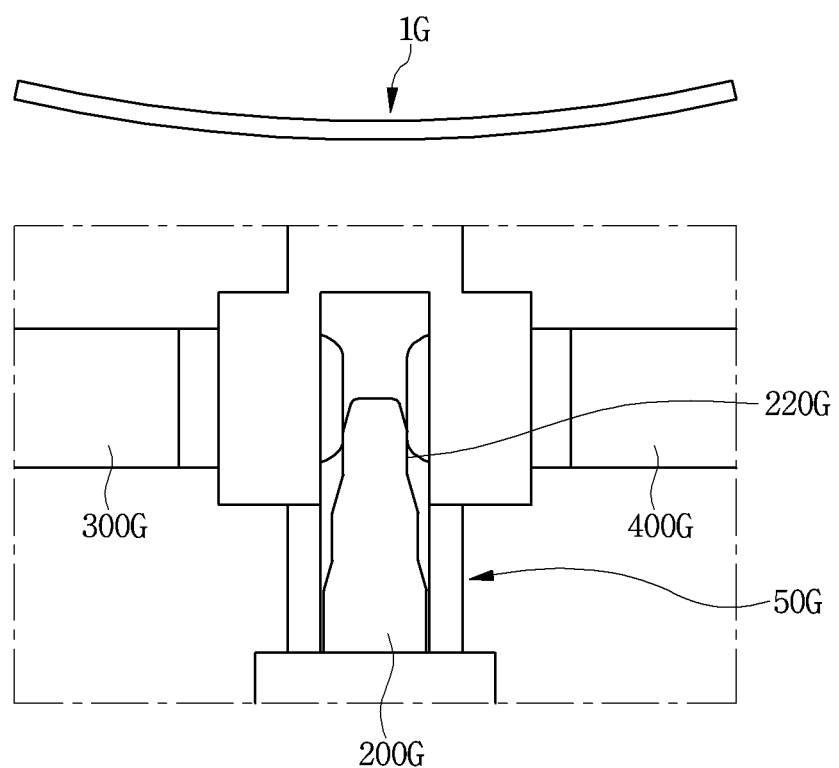
Figure 51:
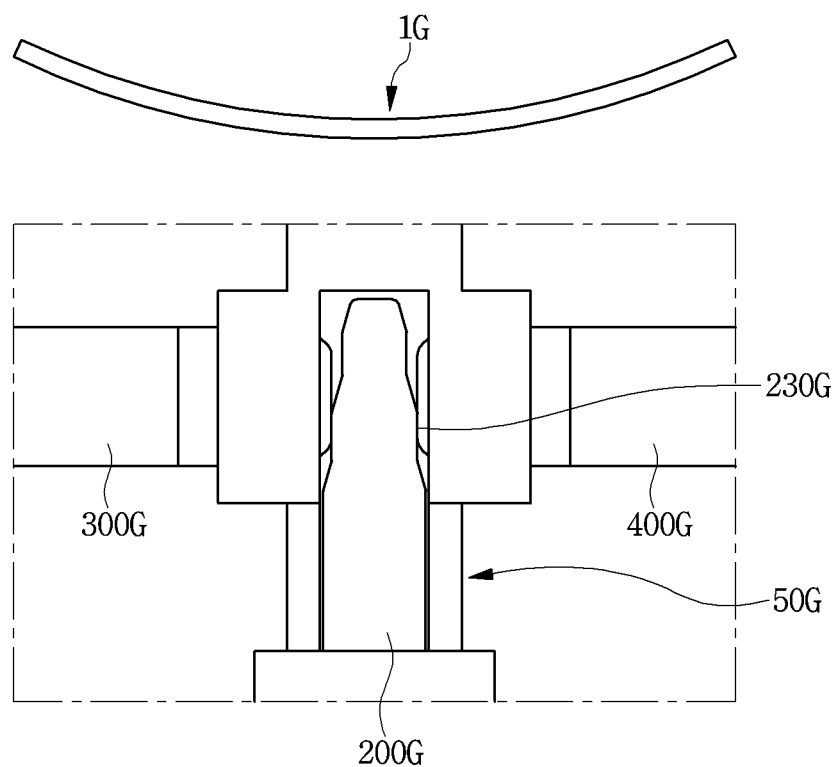

FIGS. 46 and 47 are views for explaining a display apparatus according to further another embodiment.

Since a display apparatus 1F according to the current embodiment is substantially similar to the display apparatus according to the forgoing embodiment, different points therebetween will be mainly described. In the current embodiment, for convenience of description, portions of the components will be simplified or omitted.

Referring to FIGS. 46 and 47, the display apparatus 1F includes a user manipulation push part 100F, a support 150F, a push bar 200F, and a pair of wings 300F and 400F.

The user manipulation push part 100F is mounted on a rear upper portion of a back cover 20F. The push bar 200F is vertically slidably mounted on the user manipulation push part 100F. The user manipulation push part 100F may be slidably mounted so that the first and second wings 300F and 400F are closer to or away from each other.

The support 150F is mounted on a rear lower portion of the back cover 20F to support the user manipulation push part 100F. The support 150F may function as a stand of the display apparatus 1F.

The push bar 200F is mounted on the user manipulation push part 100F so that the push bar 200F is vertically slid according to the user's manipulation. The push bar 200F is disposed between the first and second wings 300F and 400F when the push bar 200F is slid downward. When the push bar 200F is slid upward, the push bar 200F is disposed above the first and second wings 300F and 400F.

A pair of wings 300F and 400F include a first wing 300F and a second wing 400F.

The first wing 300F is disposed at a left side of the user manipulation push part 100F. The first wing 300F has one end slidably mounted on the user manipulation push part 100F and the other end fixed to the back cover 20F.

The second wing 400F is disposed at a right side of the user manipulation push part 100F. The second wing 400F has one end slidably mounted on the user manipulation push part 100F and the other end fixed to the back cover 20F.

When the push bar 200F is slid upward or downward, the first wing 300F and the second wing 400F may be slid closer to or away from each other, thereby pulling the rear surface of the back cover 20F toward a rear side of the display apparatus 1F or pushing the rear surface of the back cover 20F toward a front side of the display apparatus 1F.

Hereinafter, an operation for adjusting a curvature of the display apparatus 1F according to the current embodiment will be described.

When the curved display is realized, the user presses the push bar 200F downward. As the user presses the push bar 200F downward, the push part 200F is slid downward. Thus, the push part 200F pushes the first and second wings 300F and 400F and is disposed between the first and second wings 300F and 400F.

As a result, the first and second wings 300F and 400F may be pushed by the push bar 200F and slid in a direction that is away from each other and push the rear surface of the back cover 20F toward the front side of the display apparatus 1F to realize the curved display of the display apparatus 1F.

On the other hand, when the flat panel display is realized, the user manipulates the push bar 200F so that the push bar 200F is slid upward. Here, the user manipulation push part 100F may include an elastic part for guiding the upward sliding of the push bar 200F by the user downward repressing of the push bar 200F.

When the push bar 200F is slid upward, the first and second wings 300F and 400F are slid closer to each other out of the push bar 200F. Thus, the first and second wings 300F and 400F may pull the rear surface of the back cover 20F toward the rear side of the display apparatus 1F to realize the flat panel display of the display apparatus 1F.

FIGS. 48 to 52 are views for explaining a display apparatus according to further another embodiment.

Since a display apparatus 1G according to the current embodiment is substantially similar to the display apparatuses according to the forgoing embodiments, i.e., the display apparatus 1E according to the foregoing embodiment, different points therebetween will be mainly described. In the current embodiment, for convenience of description, portions of the components will be simplified or omitted.

Referring to FIGS. 48 to 52, a push bar 200G of the display apparatus 1G includes first to fourth curvature adjustment parts 210G, 220G, 230G, and 240G.

The first curvature adjustment part 210G may provide a first curvature for realizing a flat panel display and define an upper end of the push bar 200G. Here, the first curvature may be a curvature for realizing the flat panel display, i.e., a curvature of zero.

The second curvature adjustment part 220G may provide a second curvature when the curved display is realized and is disposed under the first curvature adjustment part 210G. Here, the second curvature adjustment part 220G may a diameter greater than that of the first curvature adjustment part 210G.

The third curvature adjustment part 230G may provide a third curvature when the curved display is realized and is disposed under the second curvature adjustment part 220G. Here, the third curvature adjustment part 230G may a diameter greater than that of the second curvature adjustment part 220G.

The fourth curvature adjustment part 240G may provide a fourth curvature when the curved display is realized and is disposed under the third curvature adjustment part 230G. Here, the fourth curvature adjustment part 240G may a diameter greater than that of the third curvature adjustment part 230G.

Hereinafter, an operation of the push bar 200G according to its position when the display apparatus 1G is adjusted in curvature according to the current embodiment will be described.

When the flat panel display is realized, the push bar 200G is disposed under the first and second wings 300G and 400G. Here, the first curvature adjustment part 210G is disposed adjacent to lower portions of the first and second wings 300G and 400G.

When the curved display is realized, the display apparatus 1G according to the current embodiment may realize the curved display having various curvatures. Particularly, when the second curvature adjustment part 220G is disposed between the first and second wings 300G and 400G (see FIG. 50), when the third curvature adjustment part 230g is disposed between the first and second wings 300G and 400G (see FIG. 51), and when the fourth curvature adjustment part 240G is disposed between the first and second wings 300G and 400G (see FIG. 52), the curved display having curvatures different from each other may be realized. However, this is merely an example. For example, the curved display having various curvatures may be realized by changing the number and design of curvature adjustment part.

The display apparatus 1G according to the current embodiment may realize the display having various curvatures through the push bar 200G including the first to fourth curvature adjustment parts 210G, 220G, 230G, and 240G.

Figure 54:
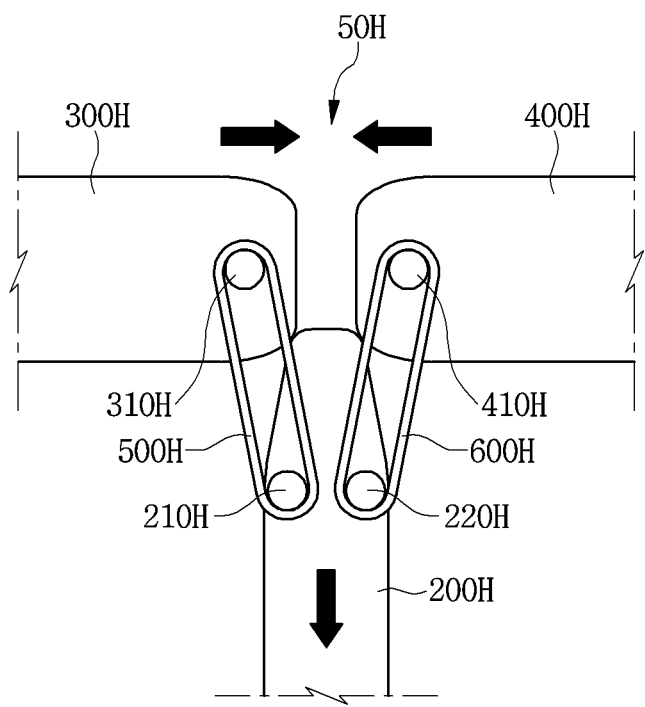

FIGS. 53 and 54 are views for explaining a curvature adjustment unit according to further another embodiment.

Since a curvature adjustment unit 50H according to the current embodiment is substantially similar to the curvature adjustment unit according to the forgoing embodiment, different points therebetween will be mainly described. In the current embodiment, for convenience of description, portions of the components will be simplified or omitted.

Referring to FIGS. 53 to 54, the curvature adjustment unit 50H includes a push bar 200H, a first wing 300H, a second wing 400H, a first link 500H, and a second link 600H.

The push bar 200H includes a first link protrusion 210H and a second link protrusion 220H.

The first link protrusion 210H is disposed on an upper left side of the push bar 200H. The first link protrusion 210H is inserted into the first link 500H.

The second link protrusion 220H is disposed on an upper right side of the push bar 200H. The second link protrusion 220H is inserted into the second link 600H.

The first wing 300H includes a link protrusion 310H. The link protrusion 310H is disposed adjacent to one end of the first wing 300H and inserted into the first link 500H.

Also, the second wing 400H includes a link protrusion 410H, like the first wing 300H. The link protrusion 410H is disposed adjacent to one end of the second wing 400H and inserted into the second link 600H.

The first link 500H connects the push bar 200H to the first wing 300H. Particularly, the first link protrusion 210H of the push bar 200H and the link protrusion 310H of the first wing 300H are inserted into the first link 500H.

The second link 600H connects the push bar 200H to the second wing 300H. Particularly, the second link protrusion 220H of the push bar 200H and the link protrusion 410H of the second wing 400H are inserted into the second link 600H.

In the current embodiment, when the push bar 200H moves downward, i.e., the curved display is converted into the flat panel display, the push bar 200H moves downward to allow the first and second lines 500H and 600H to respectively pull the first and second wings 300H and 400H. That is, since the push bar 200H moves downward, the first and second wings 300H and 400H may be slid closer to each other due to the link connection.

As described above, in the curvature adjustment unit 50H according to the current embodiment, when the push bar 200H is slid, the sliding of the first and second wings 300H and 400H may be performed through the simple link connection.

Figure 55:
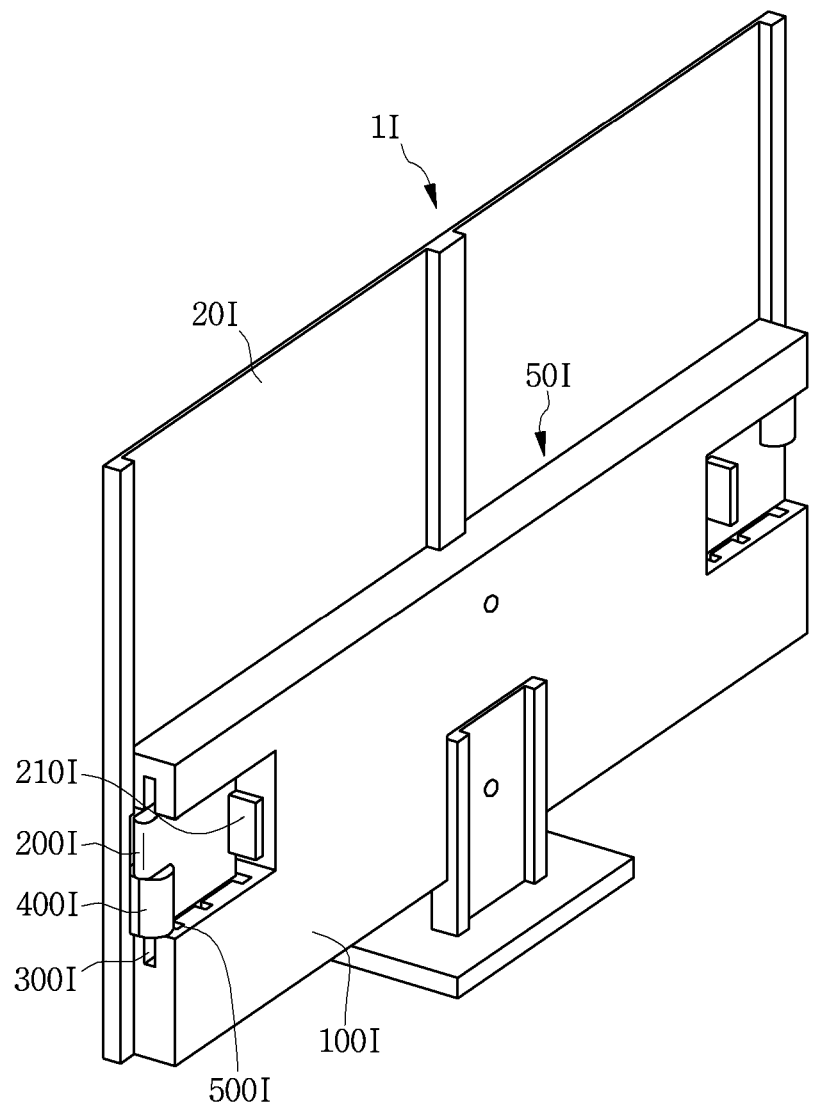
FIG. 55 is a rear perspective view of a display apparatus according to further another embodiment.

FIG. 55 is a rear perspective view of a display apparatus according to further another embodiment.

Since a display apparatus 1I according to the current embodiment is substantially similar to the display apparatus according to the forgoing embodiment, different points therebetween will be mainly described. In the current embodiment, for convenience of description, portions of the components will be simplified or omitted.

Referring to FIG. 55, the display apparatus 1I includes a curvature adjustment unit 50I mounted on a rear surface of a back cover 20I.

The curvature adjustment unit 50I includes a slider 200I, a guide rail 300I, a hinge 400I and a stopper 500I.

A unit body 100I is mounted on a rear surface of a back cover 20I. The unit body 100I supports the back cover 20I at a rear side of the back cover 20I. A stand for supporting the display apparatus 1I may be mounted on the unit body 100I.

The slider 200I is disposed on each of both side surfaces of the unit body 100I. That is, the slider 200I is slidably mounted on the unit body 100I to adjust a curvature of the back cover 20I. Furthermore, the slider 200I is connected to the hinge 400I to rotate about the hinge 400I.

A user manipulation part 210I for user's manipulation when the curvature is adjusted is disposed on the slider 200I. The user manipulation part 210I may be provided as a protrusion rib that protrudes from one side of the slider 200I.

The guide rail 300I is disposed on each of both side surfaces of the unit body 100I. The slider 200I is slidably inserted into the guide rail 300I. The slider 200I may be slid along the guide rail 300I.

The hinge 400I is disposed on each of both ends of the rear surface of the back cover 20I. The slider 200I is rotatably mounted on the hinge 400I. The hinge 400I may have a cylindrical shape. However, the present disclosure is not limited thereto. For example, the hinge 400I may have various shapes in which the slider 200I is rotatable.

The stopper 500I may restrict the sliding of the slider 200I and be disposed on the guide rail 300I. The stopper 400I may be provided in one or plurality. When the stopper 400I is provided in plurality, the display apparatus 1I may realize a curved display having various curvatures.

Figure 56:
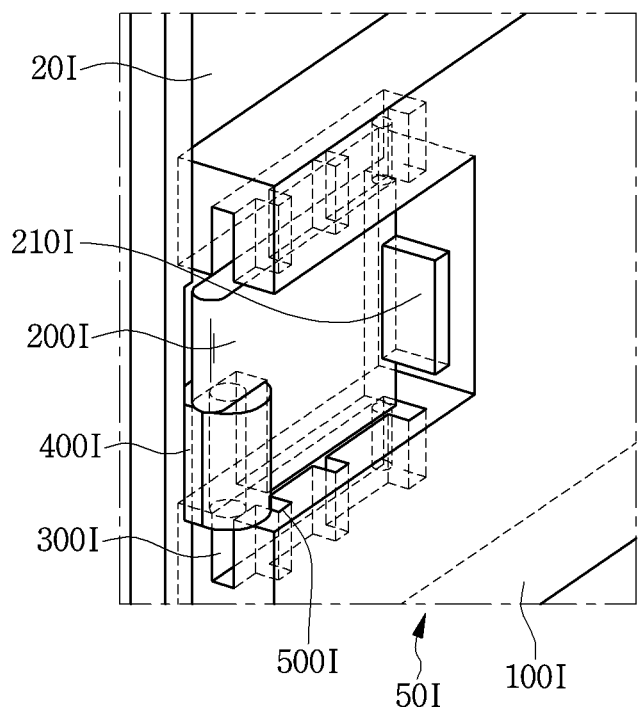
FIGS. 56 to 58 are views for explaining an operation of the display apparatus of FIG. 55.
Figure 57:
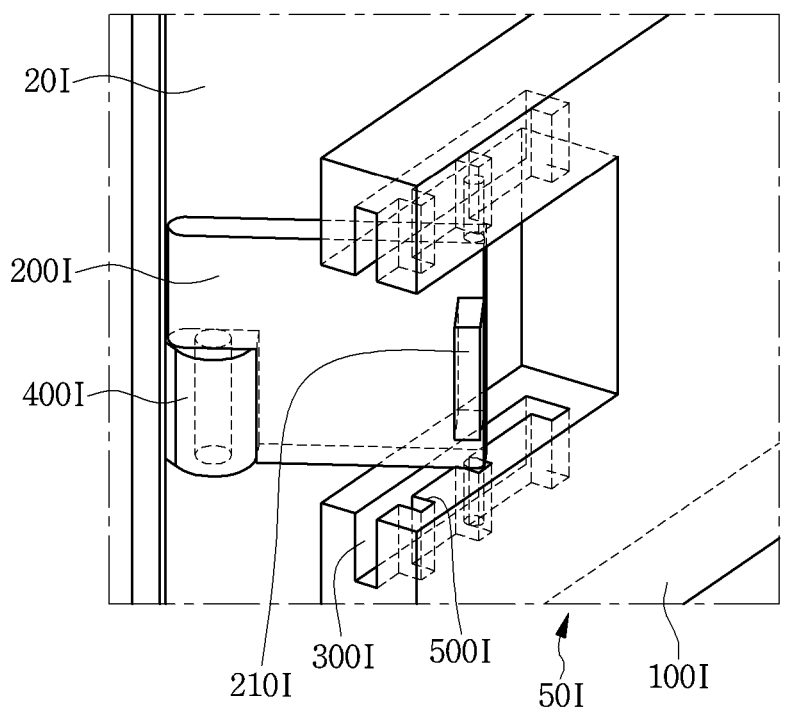
Figure 58:
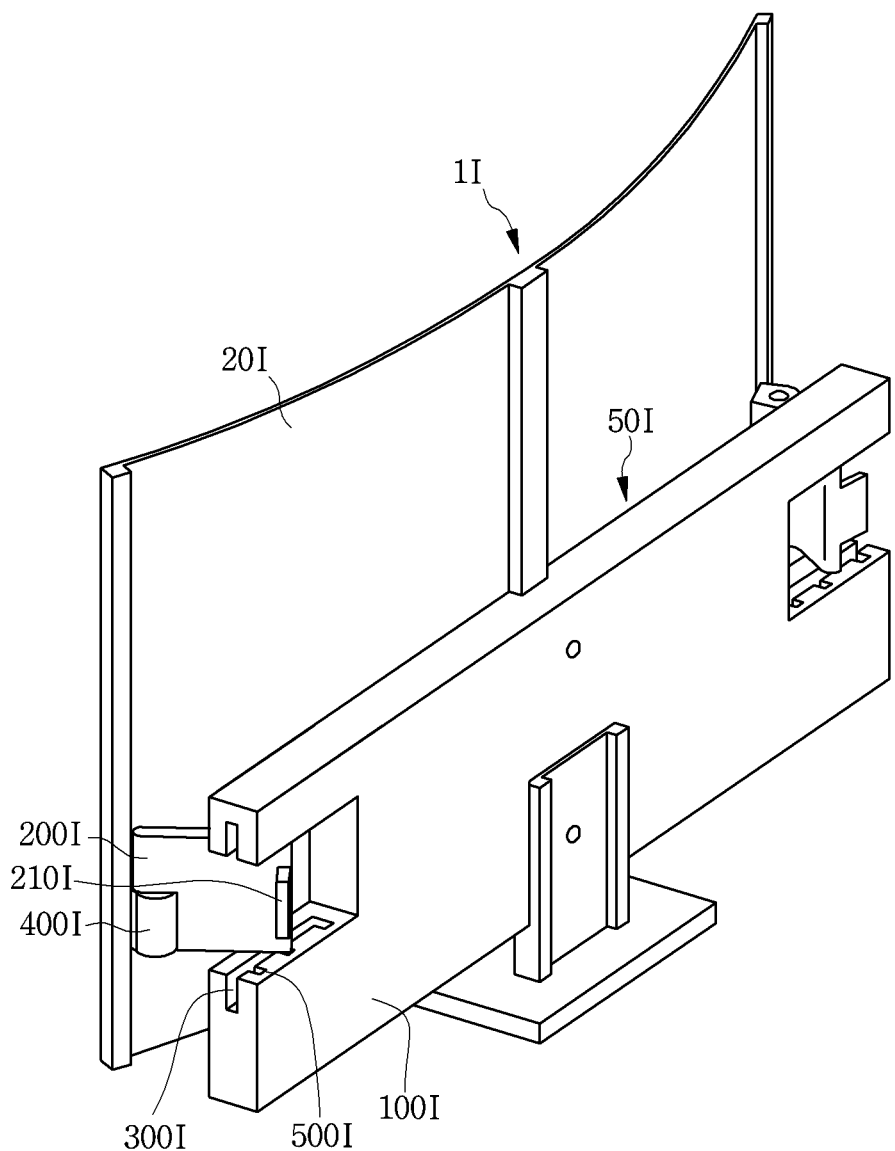

FIGS. 56 to 58 are views for explaining an operation of the display apparatus of FIG. 55.

Referring to FIGS. 56 to 58, when the curved display is realized, a user may manipulate the user manipulation part 210I of the slider 200I to allow the slider 200I to be slid. Thus, while the slider 200I is slid along the guide rail 300I, the slider 200I rotates about the hinge 300I.

As the slider 200I moves, both ends of the back cover 20I may be pulled to a front side of the display apparatus 1I to realize the curved display. Furthermore, the user may locate the slider 200I on one of the plurality of stoppers 500I to realize the curved display having a desired curvature.

On the other hand, when a flat panel display is realized, the user manipulates the user manipulation part 210I to allow the slider 200I to be slid in an opposite direction. Thus, while the slider 200I is slid along the guide rail 300I, the slider 200I rotates about the hinge 300I in a direction opposite to the one direction. As the slider 200I moves, both ends of the back cover 20I may be pulled to a rear side of the display apparatus 1I to realize the flat panel display.

As described above, in the display apparatus 1I according to the current embodiment, the curvature of the display apparatus 1I may vary by the slider 200I that is slid and rotated through the guide rail 300I and the hinge 400I by the user's manipulation.

FIGS. 59 to 62 are views for explaining a display apparatus according to further another embodiment.

Since a display apparatus 1J according to the current embodiment is substantially similar to the display apparatus according to the forgoing embodiment, different points therebetween will be mainly described. In the current embodiment, for convenience of description, portions of the components will be simplified or omitted.

Figure 59:
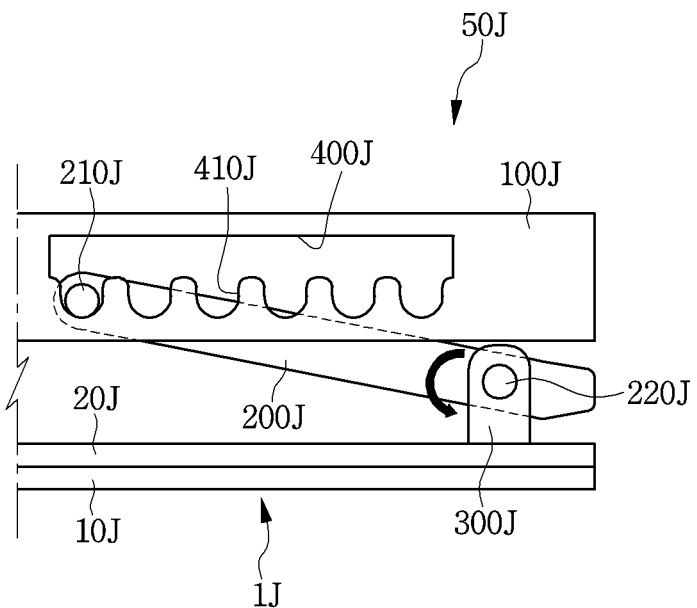
FIGS. 59 to 62 are views for explaining a display apparatus according to further another embodiment.

Referring to FIG. 59, the display apparatus 1J includes a display panel 10J, a back cover 20J, and a curvature adjustment unit 50J.

Since the display panel 10J and the back cover 20J are the same as those according to the foregoing embodiment, their detailed descriptions will be omitted below.

The curvature adjustment lever 50J includes a unit body 100J, a link member 200J, a hinge member 300J, and a sliding guide rail 400J.

The unit body 100J is mounted on a rear side of the back cover 20J so that the unit body 100J is spaced a predetermined distance from the back cover 20J. The unit body 100J is mounted on a rear side in a longitudinal direction of the back cover 20J.

The link member 200J may have an approximately long bar shape. The link member 200J is link-connected to the back cover 20J and the unit body 100J. The link member 200J includes a first link pin 210J and a second link pin 220J.

The first link pin 210J is disposed on one end of the link member 200J and link-connected to the unit body 100J. The second link pin 220J is disposed on the other end of the link member 200J and link-connected to the back cover 20J. Particularly, the second link pin 220J is link-connected to a hinge member 300J fixed to the back cover 20J.

The hinge member 300J is fixedly mounted on an end of the rear surface of the back cover 20J. The hinge member 300J may be disposed on each of both sides of the end of the rear surface of the back cover 20J. Also, the hinge member 300J is link-connected to the second link pin 220J.

The sliding guide rail 400J is disposed within the unit body 100J to guide the sliding of the link member 200J. The sliding guide rail 400J may have a groove shape defined along the longitudinal direction of the unit body 100J.

A stopper 410J is disposed on the sliding guide rail 400J.

At least one stopper 410J may be provided. Hereinafter, in the current embodiment, the stopper 410j provided in plurality may be described as an example. Each of the plurality of stoppers 410J may have a semicircular shape. The plurality of stoppers 410J may be disposed to be spaced a predetermined distance from each other in the longitudinal direction of the sliding guide rail 400J. Furthermore, the plurality of stoppers 410J may perform a function for realizing various curvatures of the display apparatus 1J.

Hereinafter, an operation for adjusting a curvature of the display apparatus 1J according to the current embodiment will be described.

Figure 60:
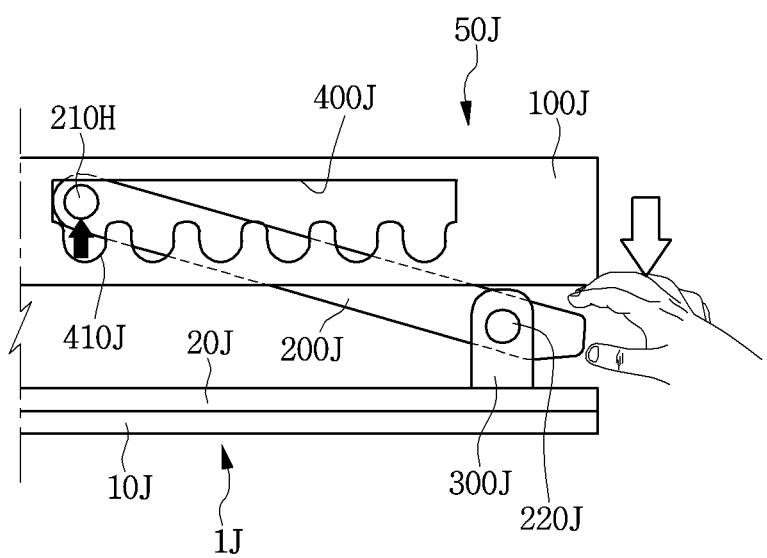
Figure 61:
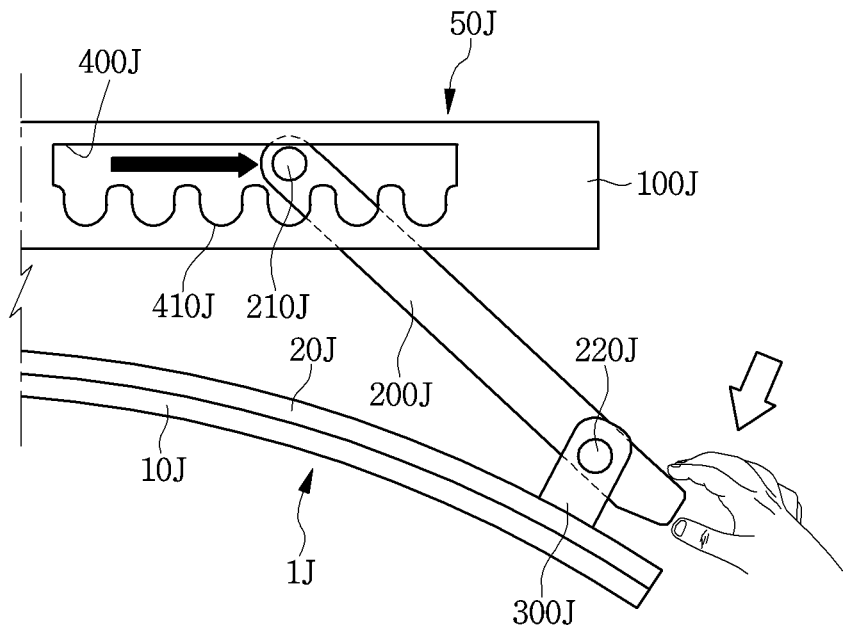
Figure 62:
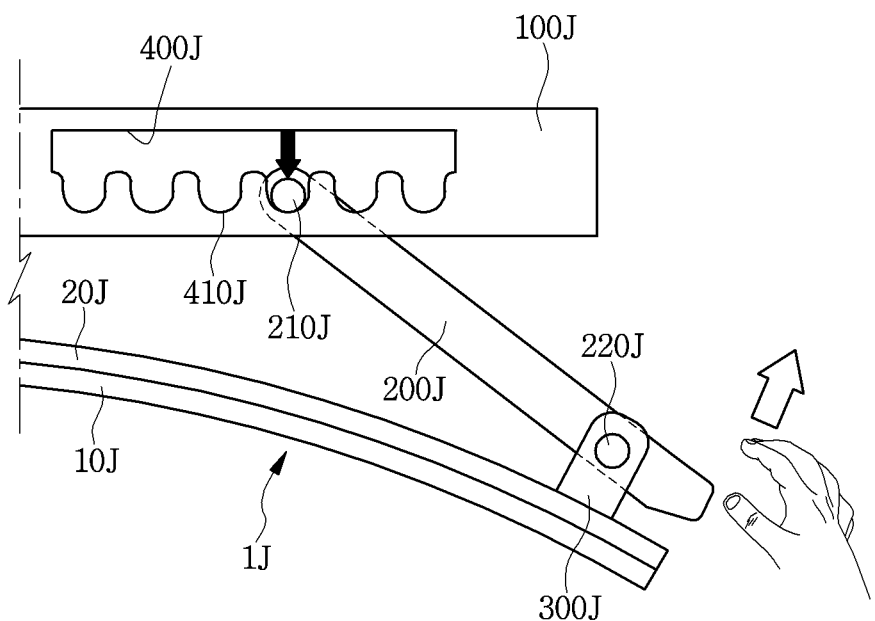

Referring to FIGS. 60 to 62, when the curved display is realized, a user presses the other end of the link member 200J toward a front side of the display apparatus 1J. Thus, the first link pin 210J disposed on one end of the link member 200J gets out of the stopper 410J of the sliding guide rail 400J.

Thereafter, when the user further presses the other end of the link member 200J toward the front side of the display apparatus 1J, the link member 200J is slid along the sliding guide rail 400.

When the user places the link member 200J at the desired curvature, the first link pin 210J of the link member 200J may be seated on the corresponding stopper 410J and be stopped in sliding. Thereafter, the display apparatus 1J may realize the curved display. When the curved display is realized, the curvature of the curved display may be realized by seating the first link pin 210J of the link member 200J at a position of the corresponding stopper for realizing the desired curvature.

On the other hand, when the flat panel display is realized, the user presses the other end of the link member 200J to separate the first link pin 210J of the link member 200J from the stopper 410J. Thereafter, the user may manipulate the link member 200J so that the link member 200J is slid in the opposite direction. Finally, when the flat panel display is realized, the user seats and fix the first link pin 210J of the link member 200J to the corresponding stopper 410J.

Figure 63:
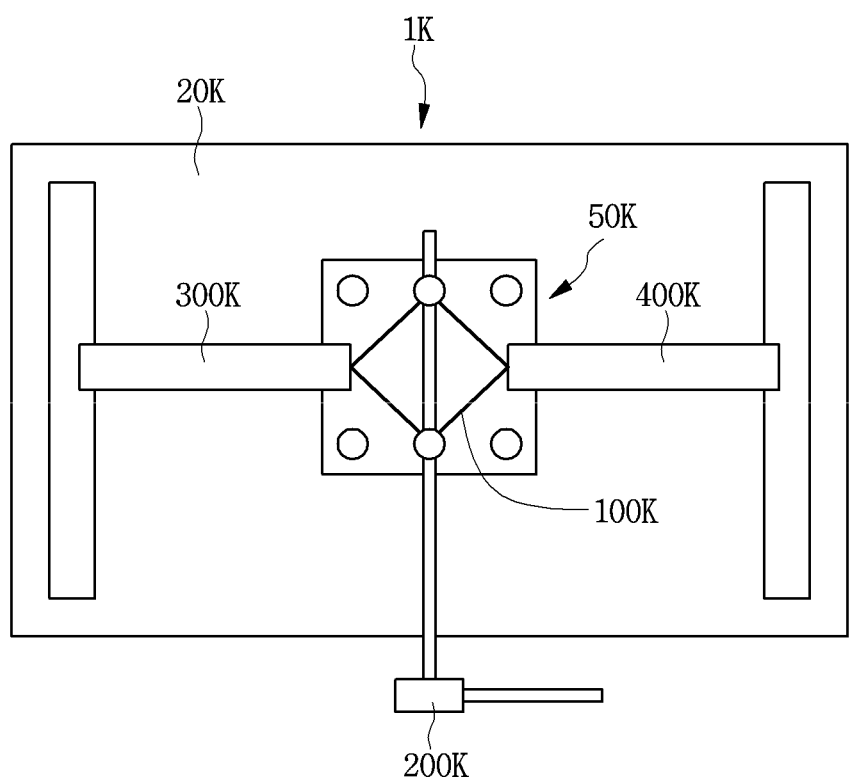
FIGS. 63 and 64 are views for explaining a display apparatus according to further another embodiment.
Figure 64:
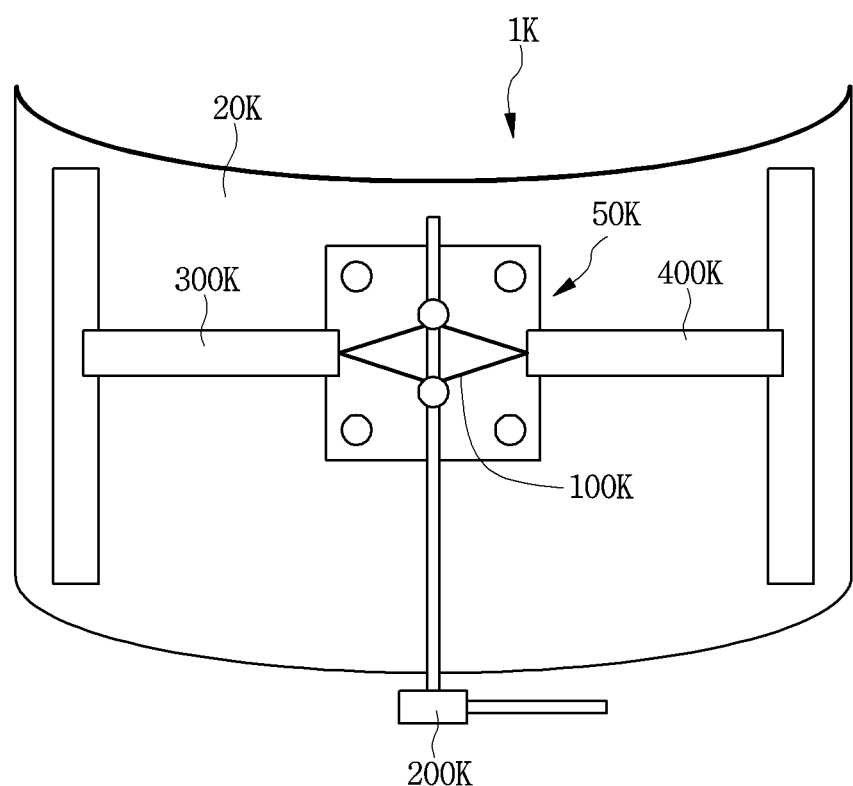

FIGS. 63 and 64 are views for explaining a display apparatus according to further another embodiment.

Since a display apparatus 1K according to the current embodiment is substantially similar to the display apparatus according to the forgoing embodiment, different points therebetween will be mainly described. In the current embodiment, for convenience of description, portions of the components will be simplified or omitted.

Referring to FIGS. 63 and 64, the display apparatus 1K includes a curvature adjustment unit 50K mounted on a rear surface of a back cover 20K.

The curvature adjustment unit 50K includes a curvature adjustment part 100K, a user manipulation part 200K, a first wing 300K, and a second wing 400K.

The curvature adjustment part 100K is mounted on the rear surface of the back cover 20k is connected to first and second wings 400K and 400K. The curvature adjustment part 100k may be folded or unfolded so that a distance between the first and second wings 300K and 400K increases or decreases. For this, the curvature adjustment part 100k according to the current embodiment may be provided as a jack kit.

A user adjustment part 200K is provided for user's manipulation when the curvature is adjusted, and the user adjustment part 200K is connected to the curvature adjustment part 100K. The user may fold or unfold the curvature adjustment part 100K through the user manipulation part 200K. For this, the user manipulation part 200K according to the current embodiment may be provided as a ratchet wrench.

The first wing 300K is disposed on a left side of the curvature adjustment part 100K. The first wing 300K has one end connected to the curvature adjustment part 100K and the other end fixed to a left end of the rear surface of the back cover 20K.

The second wing 400K is disposed on a right side of the curvature adjustment part 100K. The second wing 400K has one end connected to the curvature adjustment part 100K and the other end fixed to a right end of the rear surface of the back cover 20K.

Hereinafter, an operation for adjusting a curvature of the display apparatus 1K according to the current embodiment will be described.

When the curved display is realized, the user may manipulate the user manipulation part 200K to allow the curvature adjustment part 100K to be unfolded. When the curvature adjustment part 100K is unfolded, the first and second wings 300K and 400K are slid in a direction that is away from each other.

Thus, the first and second wings 300K and 400K may push the rear surface of the back cover 20K toward a front side of the display apparatus 1K to realize the curved display of the display apparatus 1K.

When the flat panel display is realized, the user may manipulate the user manipulation part 200K to allow the curvature adjustment part 100K to be folded. When the curvature adjustment part 100K is folded, the first and second wings 300K and 400K are slid in a direction that is closer to each other.

Thus, the first and second wings 300K and 400K may pull the rear surface of the back cover 20K toward a rear side of the display apparatus 1K to realize the flat panel display of the display apparatus 1K.

As described above, in the current embodiment, the display apparatus may be converted into the flat panel display or curved display through the user manual manipulation such as the various manual manipulation manners.

As described above, the variable display apparatus of which the curvature is adjustable may provide the display apparatus having more simple structure while securing the price competitiveness through the structure for the user manual manipulation manner.

As described above, according to various embodiments, the display apparatus that can adjust the curvature of the display panel while securing the price competitiveness and having more simple structure may be provided.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display apparatus comprising: a display panel for displaying an image; a back cover mounted on a rear surface of the display panel; and a curvature adjustment unit mounted on the rear surface of the back cover to adjustment a curvature of the back cover according to user's manual manipulation;
and the curvature adjustment unit comprises: a button member slid within a casing in a vertical direction of the back cover according to user's downward pressing; at least one cam part rotating in a horizontal direction of the back cover according to the sliding of the button member; and a pair of wings slid, on the at least one cam part, closer to or away from each other in the horizontal direction of the back cover according to the rotation of the at least one cam part.

2. The display apparatus according to claim 1, wherein, when the pair of wings are closer to each other, the curvature of the back cover decreases, and
when the pair of wings are away from each other, the curvature of the back cover increases.

3. The display apparatus according to claim 2, wherein each of the wings has one end slidably mounted on the at least one cam part and the other end fixed to the rear surface of the back cover.

4. The display apparatus according to claim 3, wherein the curvature adjustment unit comprises an adjustment unit casing mounted on the rear surface of the back cover to accommodate the button member and the cam part,
wherein the adjustment unit casing comprises:
at least one button member insertion part having an insertion hole into which the button member is inserted; and
at least one cam part accommodation chamber connected to the insertion hole to accommodate the at least one cam part, the at least one cam part providing a space in which the at least one cam part horizontally rotates.

5. The display apparatus according to claim 4, wherein the button member comprises:
a push button for user's manipulation, which is exposed to an upper side of the adjustment unit casing; and
a button body connected to the push button, the button body being slidably inserted into the button member insertion hole in the vertical direction,
wherein, when the button body is slid, at least a pair of guide protrusions for guiding the horizontal rotation of the at least one cam part protrudes from the button body.

6. The display apparatus according to claim 5, wherein a pair of rotation prevention ribs for preventing the button body from rotating when the button body is slid are disposed on the button body, and a pair of rotation prevention guide grooves into which the pair of rotation prevention ribs are slidably inserted in the vertical direction are defined in an inner wall of the insertion hole.

7. The display apparatus according to claim 5, wherein the at least one cam part comprises:

a cam body having an inner hollow into which the button body is inserted, the cam body rotating in the vertical direction when the button body is slid; and a pair of cam pulleys having one sides connected to each of the wings and the other sides disposed to face each other with the inner hollow therebetween, wherein a guide groove part into which each of the at least pair of guide protrusions is slidably inserted is defined in an inner wall of the inner hollow of the cam body.

8. The display apparatus according to claim 7, wherein the pair of cam pulleys pull each of the wings into the cam part accommodation chamber or push each of the wings out of the cam part accommodation chamber when the cam body rotates.

9. The display apparatus according to claim 7, wherein the curvature adjustment unit comprises an elastic part accommodated in the inner hollow of the cam body and comprising an elastic member, wherein the elastic member pushes the button body upward when the button body is slid along the guide groove part.

10. The display apparatus according to claim 7, wherein the guide groove part comprises:

a plurality of downward slide guide grooves spaced a predetermined distance from each other, the plurality of downward slide guide being inclinedly defined in a lower portion of the inner wall of the inner hollow; and a plurality of upward slide guide grooves connecting the downward slide guide grooves to each other, the plurality of upward slide grooves being spaced a predetermined distance from each other and defined in the inner wall of the inner hollow.

11. The display apparatus according to claim 10, wherein the cam body comprises:

a cylindrical part having the inner hollow; and upper and lower plates exposing the inner hollow, the upper and lower plates are disposed above and below the cylindrical part, wherein guide paths corresponding to each other in a circumferential direction of the upper and lower plates to guide the horizontal rotation of the cam body are defined in bottom and top surfaces of the upper and lower plates, respectively.

12. The display apparatus according to claim 11, wherein a plurality of stopper grooves are defined in the pair of guide paths at positions that radially correspond to upper ends of the plurality of downward slide guide grooves.

13. The display apparatus according to claim 7, wherein each of the wings comprises:

a horizontal part connected to each of the cam pulleys, the horizontal part being spaced a predetermined distance from the rear surface of the back cover; and a vertical part vertically extending from the horizontal part, the vertical part being fixed to the rear surface of the back cover.

14. The display apparatus according to claim 13, wherein the cam part comprises a first cam part and a second cam part, the cam part accommodation chamber comprises a first cam part accommodation chamber accommodating the first cam part and a second cam part accommodation chamber accommodating the second cam part, and the button member insertion part comprises an upper button member insertion part disposed above the first cam part accommodation chamber and a lower button member insertion part disposed between the first cam part accommodation chamber and the second cam part accommodation chamber.

15. The display apparatus according to claim 14, wherein the horizontal part comprises:

an upper horizontal bar connected to the first cam part; and a lower horizontal bar connected to the second cam part, the lower horizontal bar being vertically spaced a predetermined distance from the first horizontal bar.

* * * * *